United States Patent
Endo

(10) Patent No.: US 7,462,897 B2
(45) Date of Patent: Dec. 9, 2008

(54) LIGHT EMITTING DEVICE AND ELECTRONIC DEVICE

(75) Inventor: Masami Endo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 260 days.

(21) Appl. No.: 11/340,353

(22) Filed: Jan. 26, 2006

(65) Prior Publication Data

US 2006/0169979 A1    Aug. 3, 2006

(30) Foreign Application Priority Data

Jan. 31, 2005    (JP)    .............................. 2005-024345

(51) Int. Cl.
*H01L 31/062* (2006.01)
*H01L 31/113* (2006.01)

(52) U.S. Cl. .......................... 257/291; 257/83; 438/57; 250/553

(58) Field of Classification Search ................. 257/291, 257/292, 79, 83; 438/57, 60, 7, 16; 250/552, 250/553

See application file for complete search history.

(56) References Cited

U.S. PATENT DOCUMENTS

| | | | |
|---|---|---|---|
| 4,755,807 A | 7/1988 | Guennou | 340/702 |
| 5,416,494 A | 5/1995 | Yokota et al. | 345/79 |
| 5,982,345 A | 11/1999 | Takayama et al. | 345/76 |
| 6,618,029 B1 | 9/2003 | Ozawa | 345/82 |
| 6,809,481 B2 | 10/2004 | Seo et al. | 315/169.1 |
| 6,870,192 B2 | 3/2005 | Yamazaki et al. | 257/79 |
| 6,876,007 B2 | 4/2005 | Yamazaki et al. | 257/88 |
| 2001/0022565 A1 | 9/2001 | Kimura | 345/82 |
| 2002/0180671 A1 | 12/2002 | Inukai | 345/76 |
| 2003/0052843 A1 | 3/2003 | Yamazaki et al. | 345/82 |
| 2003/0062545 A1 | 4/2003 | Yamazaki et al. | 257/200 |
| 2003/0094612 A1 | 5/2003 | Yamazaki et al. | 257/59 |
| 2003/0151568 A1 | 8/2003 | Ozawa | 345/82 |
| 2003/0193493 A1 | 10/2003 | Ozawa | 345/204 |
| 2003/0214245 A1 | 11/2003 | Yamazaki et al. | 315/169.3 |
| 2003/0218173 A1 | 11/2003 | Nishi et al. | 257/79 |
| 2004/0012026 A1 | 1/2004 | Seo et al. | 257/79 |
| 2004/0160167 A1 | 8/2004 | Arai et al. | 313/500 |
| 2005/0052371 A1 | 3/2005 | Ozawa | 345/76 |
| 2005/0093804 A1 | 5/2005 | Yamazaki et al. | 345/92 |
| 2005/0104528 A1 | 5/2005 | Seo et al. | 315/169.1 |

(Continued)

FOREIGN PATENT DOCUMENTS

EP    1 094 438    4/2001

(Continued)

*Primary Examiner*—Fernando L Toledo
(74) *Attorney, Agent, or Firm*—Cook Alex Ltd.

(57) ABSTRACT

The invention is made in view of solving problems in reduction in yield and an aperture ratio in accordance with an increase in the number of transistors which form a pixel, increase in power consumption for holding predetermined luminance to provide a light emitting device having a noble pixel configuration. A light emitting device of the invention includes a unit for applying a forward bias voltage to a first light emitting element so that a first pixel emits light and applying a reverse bias voltage to a second light emitting element, and a unit for applying a reverse bias voltage to the first light emitting element so that the first pixel emits no light and applying a forward bias voltage to the second light emitting element.

58 Claims, 42 Drawing Sheets

U.S. PATENT DOCUMENTS

2005/0133783 A1  6/2005  Yamazaki et al. ............. 257/40

FOREIGN PATENT DOCUMENTS

| | | |
|---|---|---|
| EP | 1 103 946 A2 | 5/2001 |
| JP | 61-223898 | 10/1986 |
| JP | 05-234676 | 9/1993 |
| JP | 06-075538 | 3/1994 |
| JP | 09-218664 | 8/1997 |
| JP | 11-024606 | 1/1999 |
| JP | 2001-117534 | 4/2001 |
| JP | 2001-324958 | 11/2001 |
| JP | 2001-343933 | 12/2001 |
| JP | 2002-358048 | 12/2002 |
| JP | 2003-157983 | 5/2003 |
| JP | 2003-177711 | 6/2003 |
| JP | 2003-195814 | 7/2003 |
| JP | 2003-202832 | 7/2003 |
| JP | 2003-216104 | 7/2003 |
| JP | 2003-303683 | 10/2003 |
| JP | 2003-323977 | 11/2003 |
| JP | 2003-323988 | 11/2003 |
| JP | 2004-031335 | 1/2004 |
| JP | 2004-062198 | 2/2004 |
| JP | 2004-126501 | 4/2004 | odd frame even frame

FIG. 7A

FIG. 7B odd frame even frame

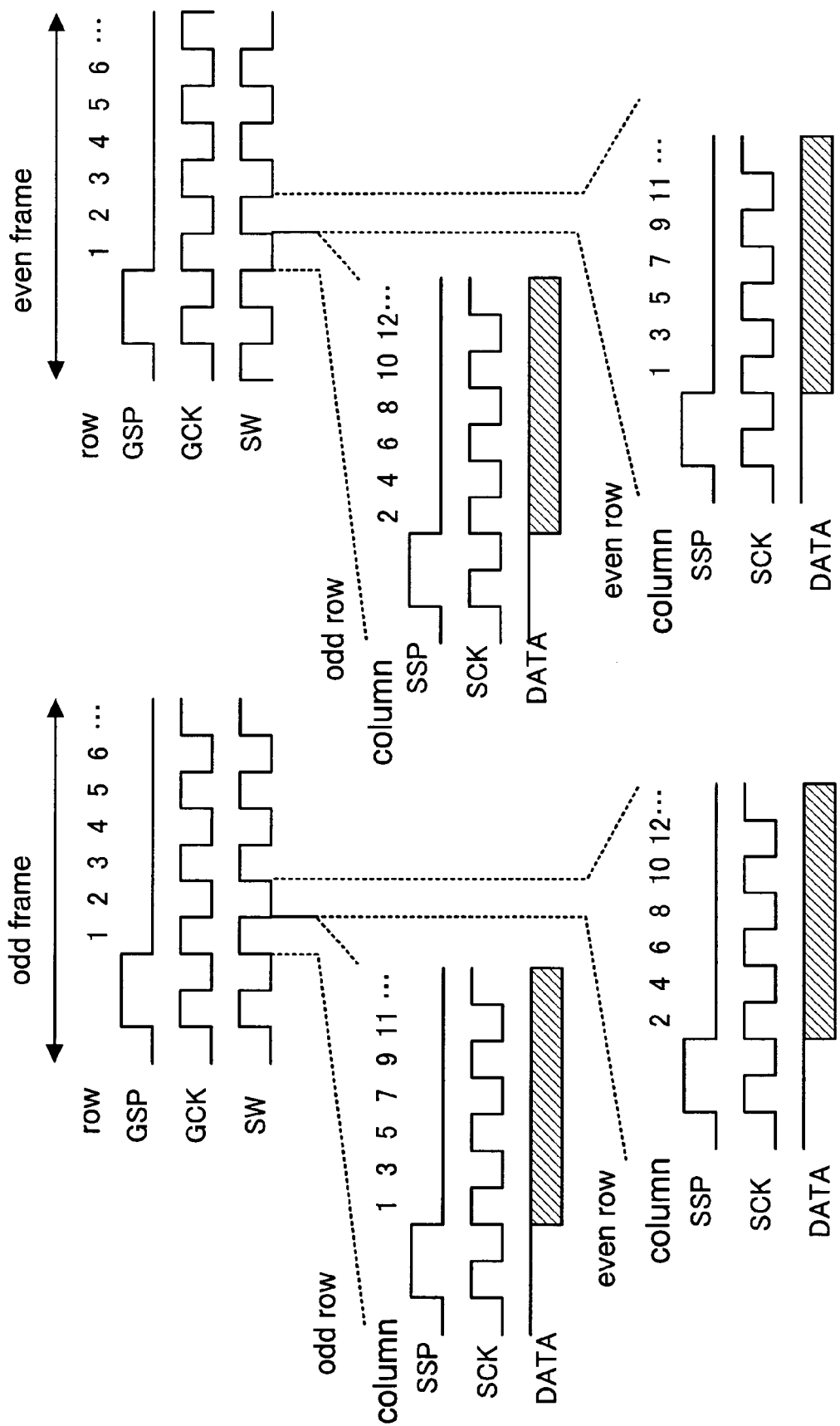

terminal portion | pixel portion terminal portion | pixel portion

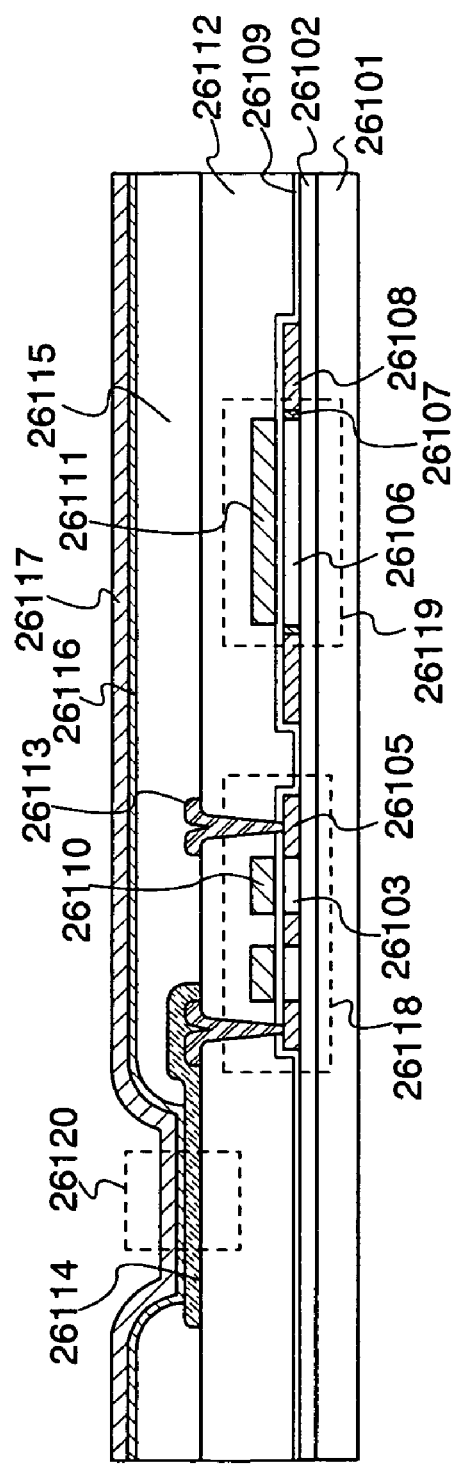
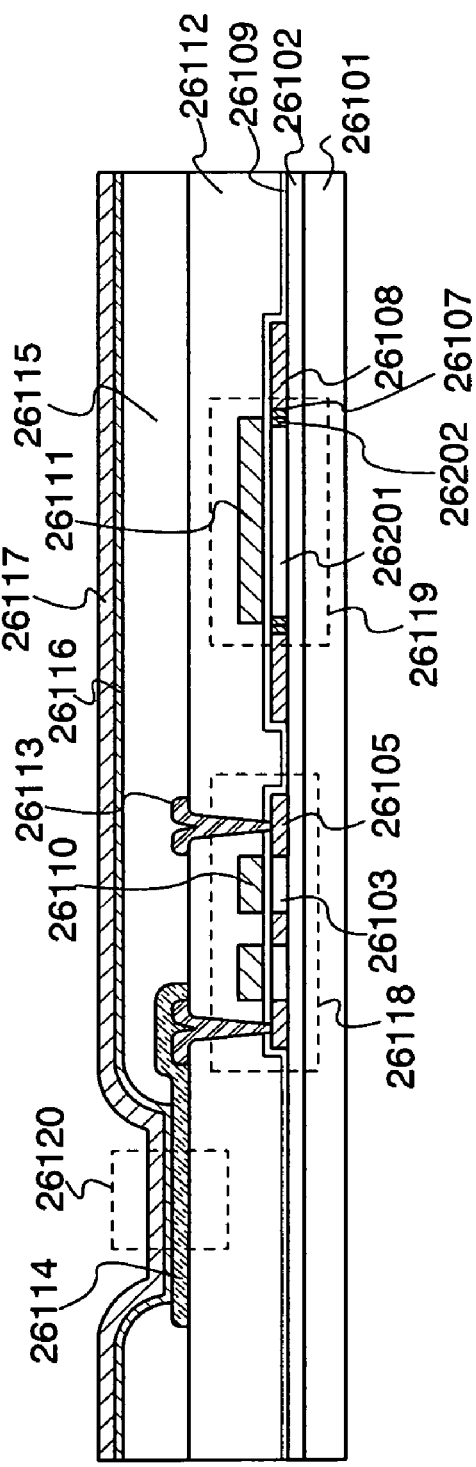
FIG. 37A
FIG. 37B

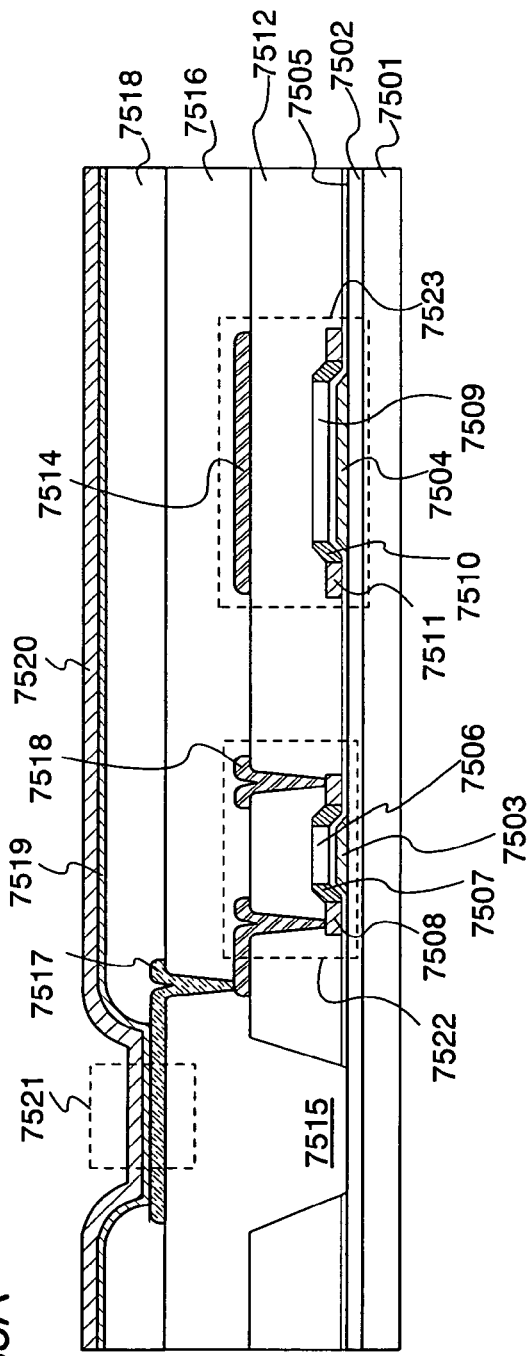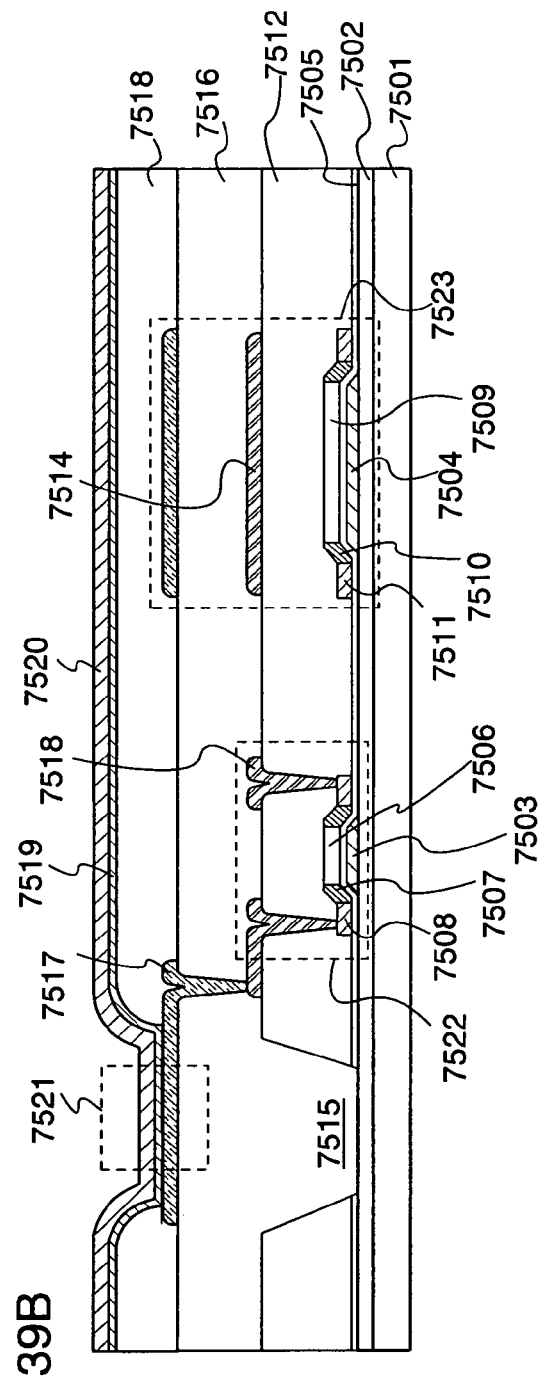
FIG. 39A
FIG. 39B

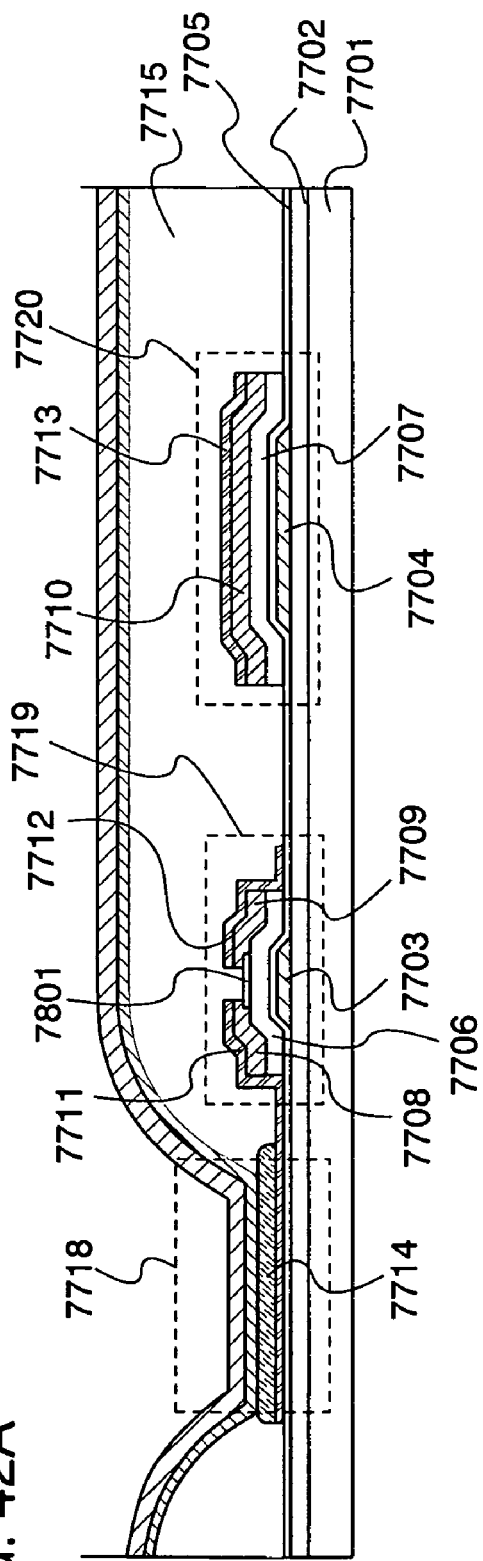
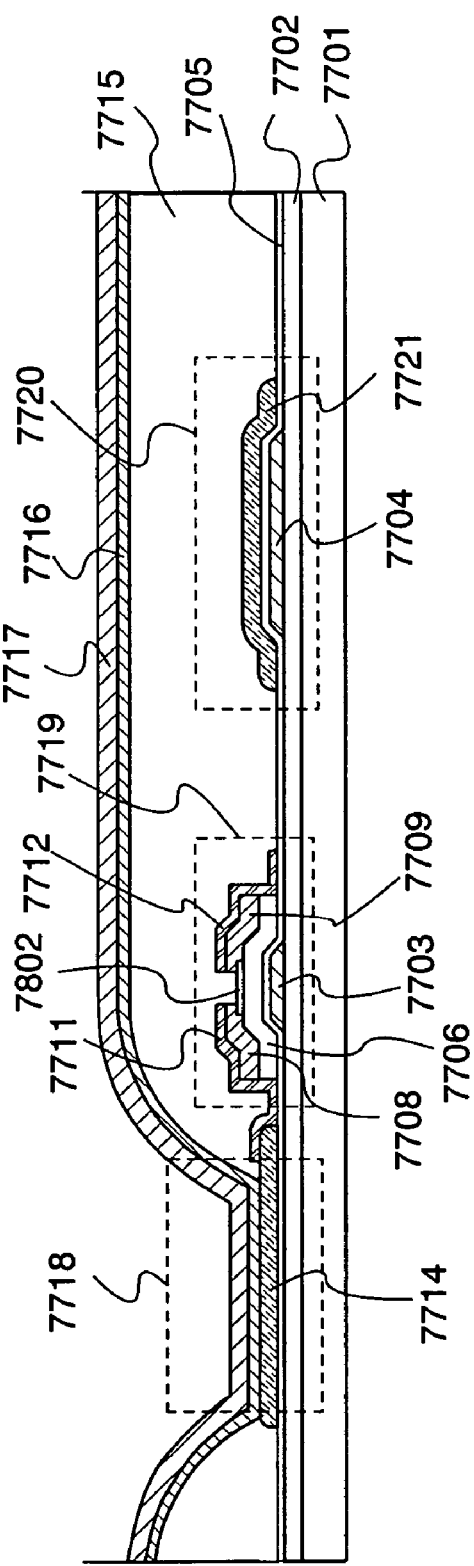
FIG. 42A
FIG. 42B

LIGHT EMITTING DEVICE AND ELECTRONIC DEVICE

BACKGROUND OF THE INVENTION

1. Field of the Invention

The present invention relates to an active matrix light emitting device using a light emitting element having a film containing an organic compound (hereinafter referred to as an organic compound layer) between a pair of electrodes which provides fluorescence or phosphorescence when applied an electric field by a TFT (Thin Film Transistor). It is to be noted that a light emitting device in this specification refers to an image display device, a light emitting device, or a light source. Further, a module in which a light emitting element is provided with a connector, for example an FPC (Flexible Printed Circuit), a TAB (Tape Automated Bonding) tape, a TCP (Tape Carrier Package), a module in which the tip of a TAB tape or a TCP is provided with a printed wiring board, and a module in which an IC (Integrated Circuit) is directly mounted to a light emitting element by a COG (Chip On Glass) method are all included in a light emitting device.

2. Description of the Related Art

In recent years, as a substitute for a liquid crystal display device (LCD), a light emitting device is suggested which is formed of a display panel in which light emitting elements are arranged per pixel and a peripheral circuit for inputting signals to the panel and which displays an image by controlling light emission of the light emitting element.

A light emitting device using a module which is formed by arranging light emitting elements in matrix has been widely developed, and an organic EL (Electro Luminescence) element having a light emitting layer formed of an organic material is attracting attentions. By using an organic compound which can provide favorable light emission characteristics as a light emitting layer of an EL element, efficiency and life have been advanced to be sufficient for practical use.

Such a light emitting device is typically provided with two or three TFTs (thin film transistors) per one pixel.

FIG. 28 shows a conventional pixel configuration in which two transistors are provided for one pixel. A controlling transistor 2801, a driving transistor 2802, a capacitor 2803, a light emitting element 2804, a data line sig, a scan line gate, and a power source line corn are provided (see Patent Document 1).

Further, FIG. 29 shows a circuit configuration of a conventional pixel in which three transistors are provided for one pixel. A controlling transistor 2901, a driving transistor 2902, an erasing transistor 2903, a capacitor 2904, a light emitting element 2905, a data line sig, a controlling scan line gate1, an erasing scan line gate2, and a power source line corn are provided (see Patent Document 2).

In the circuit configurations of pixels shown in FIGS. 28 and 29, a current supplied to a light emitting element in each pixel, that is, luminance and light emission or non-light emission of a light emitting element in each pixel are controlled by controlling on/off of the transistors.

Even when predetermined luminance is obtained with a current $I_0$ by applying a certain voltage $V_0$, the predetermined luminance cannot be obtained by applying the voltage $V_0$ since luminance characteristics of a light emitting element change with time and only a current $I_0'$ is supplied to the light emitting element.

A light emitting element changes with time because the light emitting element generates heat when voltage or current is supplied thereto, thereby characteristics of an interface between film qualities and an interface between electrodes change. Further, a degradation condition differs between each light emitting element, which causes an image sticking.

Accordingly, a voltage of the opposite direction (a reverse bias voltage) to a voltage applied to a light emitting element when it emits light is applied to alleviate uneven charges of the light emitting elements are regularly, thereby the degradation of the light emitting element is suppressed and reliability thereof is improved (see Patent Document 3).

[Patent Document 1]
Japanese Patent Laid-open No. 2001-343933
[Patent Document 2]
Japanese Patent Laid-open No. 2001-324958
[Patent Document 3]
Japanese Patent Laid-open No. 2001-117534

SUMMARY OF THE INVENTION

As described in the aforementioned Patent Documents, a pixel circuit having a light emitting element may have various configurations. Moreover, as the number of pixels increases in accordance with a display portion becoming higher in resolution, the number of transistors used in a pixel increases. Therefore, such problems as a decrease in the aperture ratio and an increase in power consumption for holding predetermined luminance become more notable in accordance with the increase in the number of transistors which form each pixel.

Further, as a light emitting device is formed of a plurality of pixels, the number of wires such as scan lines, power source lines which are connected to each pixel increases in accordance with high resolution and enlargement of a display portion. Accordingly, there are such problems as an increase in a layout area and a decrease in yield of a display panel in accordance with an increase in the number of wiring connections, a decrease in an aperture ratio in accordance with an increase in the number of wires, and an increase in power consumption for holding predetermined luminance.

Further, a light emitting device is required in which a voltage of the opposite direction (hereinafter referred to as a reverse bias voltage) is regularly applied to a light emitting element to control degradation of a light emitting element and improve reliability.

Further, in the case of performing display by a time division gray scale method in a light emitting device, a pseudo contour occurs and image quality degrades. It is to be noted that a pseudo contour refers to a degradation of a display such that an unnaturally bright line or dark line is mixed, which occurs due to a nature of human eyes which follows a changing luminance when adjacent gray scale levels (an intermediate gray scale level) are expressed.

The invention is made in view of the aforementioned problems and solves the aforementioned problems at the same time.

The invention provides a light emitting device having a novel pixel configuration in order to solve the aforementioned problems. More specifically, the present invention is a light emitting device having two light emitting elements which emit light in response to a signal inputted from a data line through a transistor electrically connected to the data line. The feature of the present invention is that a forward bias voltage is applied to one of these two light emitting elements while a reverse bias voltage is applied to the other of these two light emitting elements.

One aspect of the present invention is a light emitting device including a scan line, a data line, a first power source line, a second power source line, a third power source line, a first light emitting element, a second light emitting element, a first transistor, and a second transistor. Here, the first and second light emitting elements are electrically connected with the first and the second power source lines respectively. Further, a gate of the first transistor is electrically connected to the scan line. Further, a gate of the second transistor is electrically connected to the data line through a source and a drain of the first transistor so as to be inputted a signal of the data line to the gate of the second transistor when the first transistor turns on. Further, one of a source and a drain of the second transistor is electrically connected to the first and the second light emitting elements, the other of the source and the drain of the second transistor is electrically connected to the third power source line. In this light emitting device, a forward bias voltage is applied to one of the first and the second light emitting elements while a reverse bias voltage is applied to the other of the first and the second light emitting elements. It is to be noted that the first and the second transistors may be named a selecting transistor and a driving transistor respectively.

Another aspect of the invention is a light emitting device including a scan line, a data line, a first power source line, a second power source line, a first light emitting element, a second light emitting element, a first transistor, a second transistor, and a third transistor. Here, the first and second light emitting elements are electrically connected with the first and the second power source lines respectively. Further, a gate of the first transistor is electrically connected to the scan line. Further, each of gates of the second and the third transistors is electrically connected to the data line through a source and a drain of the first transistor so as to be inputted a signal of the data line to the gate of the second transistor when the first transistor turns on. Further, one of a source and a drain of the second transistor is electrically connected to the first light emitting element, the other of the source and the drain of the second transistor is electrically connected to the first power source line. Further, one of a source and a drain of the third transistor is electrically connected to the second light emitting element, the other of the source and the drain of the third transistor is electrically connected to the second power source line. In this light emitting device, a forward bias voltage is applied to one of the first and the second light emitting elements while a reverse bias voltage is applied to the other of the first and the second light emitting elements. It is to be noted that the first may be named a selecting transistor, and that each of a second and the third transistors may be named a driving transistor.

Another aspect of the invention is a light emitting device including a first scan line, a second scan line, a data line, a first power source line, a second power source line, a first light emitting element, a second light emitting element, a first transistor, a second transistor, a third transistor, a first capacitor, a second capacitor, and an erasing element. Here, the first and second light emitting elements are electrically connected with the first and the second power source lines respectively. Further, a gate of the first transistor is electrically connected to the scan line. Further, each of gates of the second and the third transistors is electrically connected to the data line through a source and a drain of the first transistor so as to be inputted a signal of the data line to the gate of the second transistor when the first transistor turns on. Further, one of a source and a drain of the second transistor is electrically connected to the first light emitting element, the other of the source and the drain of the second transistor is electrically connected to the first power source line. Further, one of a source and a drain of the third transistor is electrically connected to the second light emitting element, the other of the source and the drain of the third transistor is electrically connected to the second power source line. Further, the first capacitor is provided so as to hold a voltage applied to the gate of the second transistor. Further, the second capacitor is provided so as to hold a voltage applied to the gate of the third transistor. Further, the erasing element is provided so as to erase the voltage held by the first capacitor or by the second capacitor when the erasing element is turned on. In this light emitting device, a forward bias voltage is applied to one of the first and the second light emitting elements while a reverse bias voltage is applied to the other of the first and the second light emitting elements. It is to be noted that the first may be named a selecting transistor, and that each of a second and the third transistors may be named a driving transistor.

Further, the invention provides an electronic device mounting the aforementioned light emitting device.

According to the invention, the number of transistors which form pixels and the number of wires such as the scan lines and the power source lines connected to each pixel can be reduced, thereby the aperture ratio can be increased.

Further, in a light emitting device of the invention, the number of transistors which form pixels and the number of wires such as the scan lines and the power source lines connected to each pixel can be reduced and thus the aperture ratio can be increased. Therefore, a voltage applied to a light emitting element for holding desired luminance can be suppressed, thereby low power consumption can be realized.

Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Further, in a light emitting device of the invention, a visible pseudo contour which is a problem in displaying an image by the time gray scale method can be reduced by employing a method (an interlace method) for sequentially performing light emission of pixels of every other row in an extending direction of the data lines or the scan lines. Further, a visible pseudo contour can be reduced by employing a method (a checker method) for performing light emission of pixels in what is called a check pattern so that pixels emit light which are one pixel aside of the pixels which emit light in the preceding row in the extending direction of the data lines.

Further, in an electronic device using a light emitting device of the invention, the number of transistors connected to each pixel, the number of wires such as the scan lines and the power source lines can be reduced as described above, therefore, a layout area of driver circuits in the periphery of a pixel portion can be reduced and a layout area of a display panel can be reduced as well. Accordingly, an electronic device can be downsized and lighter in weight. Further, a product can be manufactured with high yield, and thus more inexpensive product can be provided for customers.

BRIEF DESCRIPTION OF THE DRAWINGS

FIGS. 7A and 7B are display views of a display panel showing configurations of Embodiment Mode 1.

FIGS. 17A and 17B are display views of a display panel showing a configuration of Embodiment Mode 4.

FIGS. 18A and 18B are timing charts of display examples of a display panel showing a configuration of Embodiment Mode 4.

FIGS. 37A and 37B are cross sectional views showing Embodiment Mode 9.

FIGS. 39A and 39B are cross sectional views showing Embodiment Mode 9.

FIGS. 42A and 42B are cross sectional views showing Embodiment Mode 9.

DETAILED DESCRIPTION OF THE INVENTION

Figure 1:
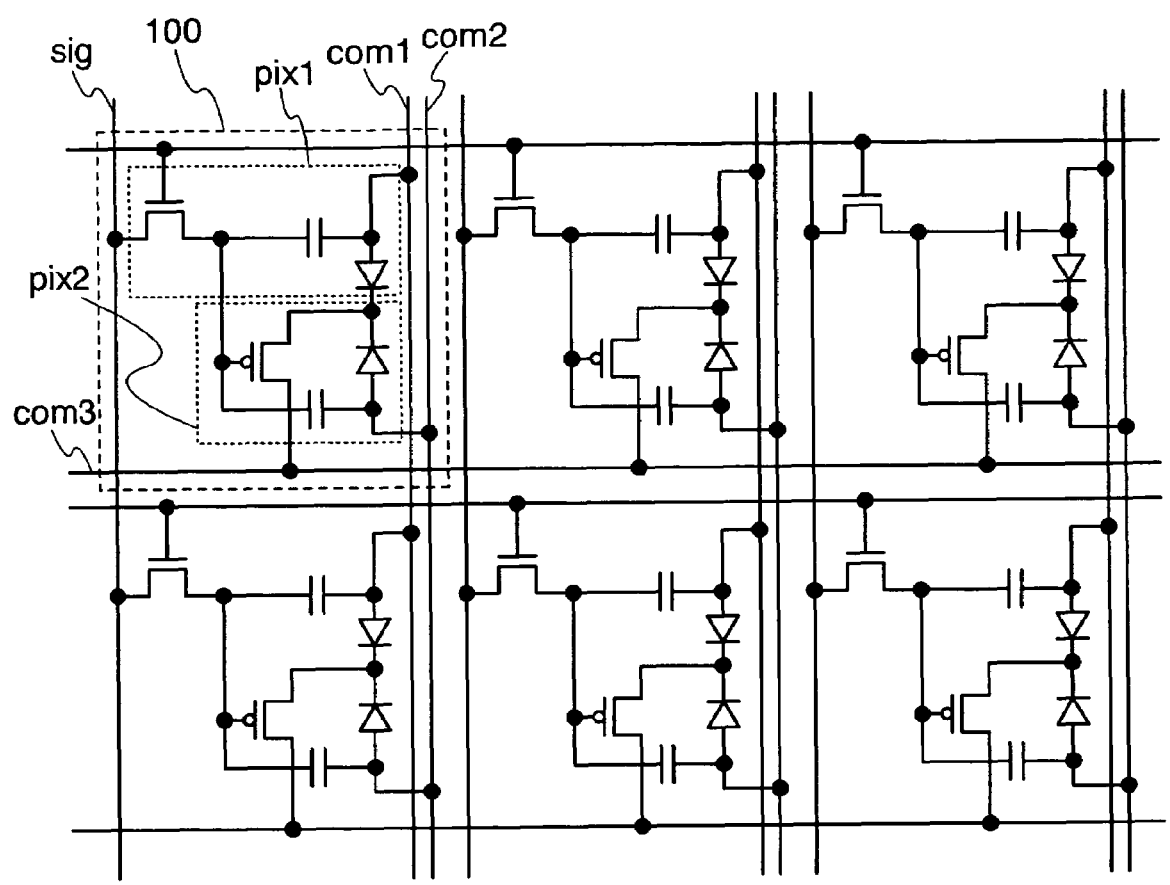
FIG. 1 is a circuit diagram showing a configuration of Embodiment Mode 1.

Although the invention will be fully described by way of embodiment modes with reference to the accompanying drawings, it is to be understood that various changes and modifications will be apparent to those skilled in the art. Therefore, unless otherwise such changes and modifications depart from the scope of the invention, they should be construed as being included therein. Note that identical portions in embodiment modes are denoted by the same reference numerals and detailed descriptions thereof are omitted.

Embodiment Mode 1

Figure 2:
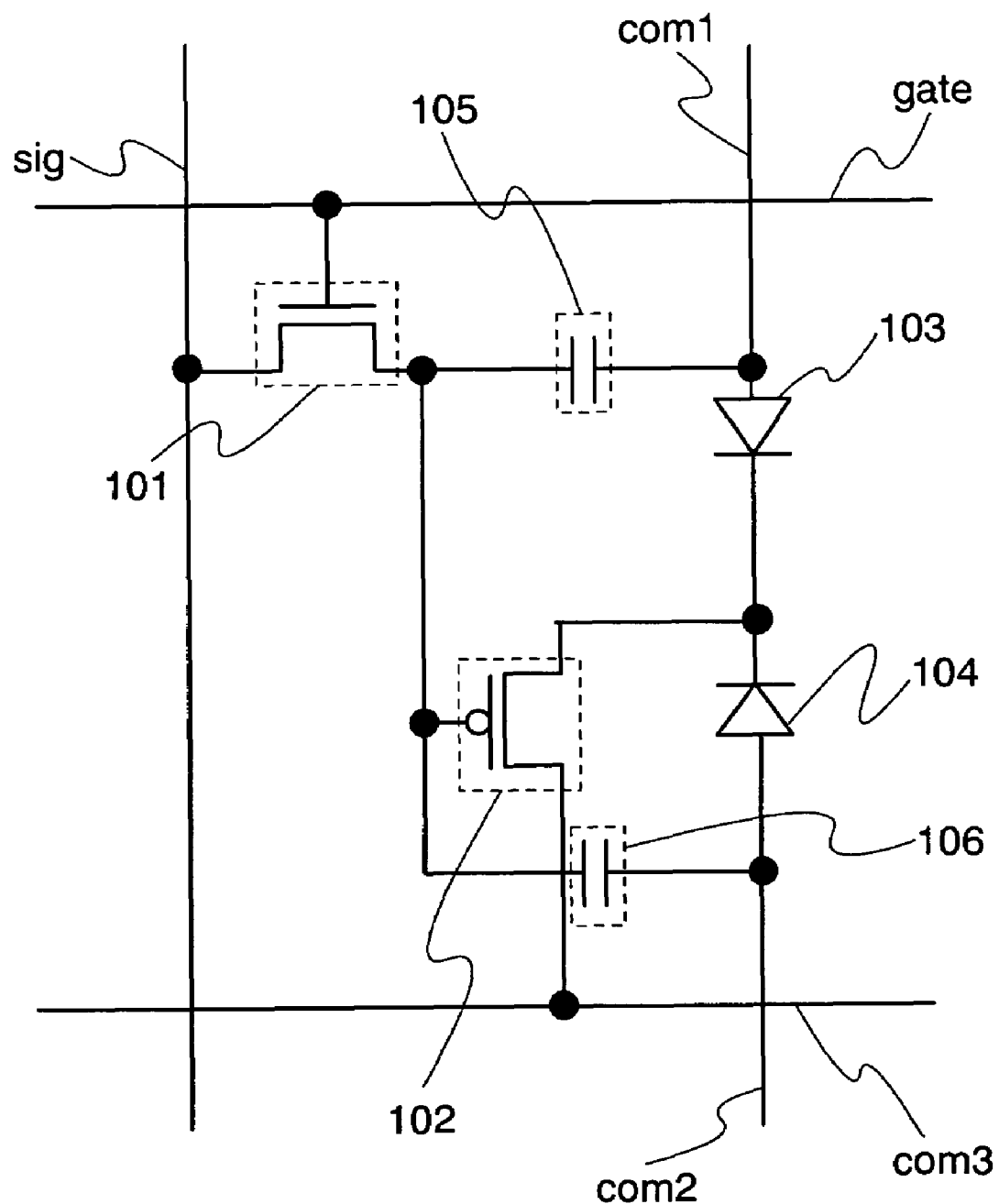
FIG. 2 is a circuit diagram showing a configuration of Embodiment Mode 1.

FIG. 1 shows a circuit diagram in which pixel portions of this embodiment mode are arranged in matrix. FIG. 2 shows an enlarged circuit configuration of a circuit in the pixel portion of this embodiment mode. A region 100 shown in FIG. 1 includes a first pixel pix1 and a second pixel pix2. Further, each of the region 100 shown in FIG. 1 and the enlarged region 100 shown in FIG. 2 includes a scan line gate, a data line sig, a first power source line com1, a second power source line com2, and a third power source line com3.

It is to be noted in the invention that a pixel portion refers to a region provided at each intersection of a plurality of scan lines and a plurality of data lines. In this embodiment mode, the region 100 corresponds to a pixel portion.

In FIG. 2, the pixel portion includes a selecting transistor 101, a driving transistor 102, a first light emitting element 103, a second light emitting element 104, a first capacitor 105, and a second capacitor 106.

It is to be noted in the invention that a light emitting element may be any element having a rectifying property. Any light emitting element such as an EL element (an organic EL element, an inorganic EL element, or an EL element containing organic and inorganic substances) and an element used for a field emission display (FED) may be used.

Further, one of a source and a drain of the selecting transistor 101 is connected to the data line sig and the other thereof is connected to a gate of the driving transistor 102. Further, one electrode of the first capacitor 105 is connected to the gate of the driving transistor 102 and the other electrode thereof is connected to the first power source line com1. Further, one electrode of the second capacitor 106 is connected to the gate of the driving transistor 102 and the other electrode thereof is connected to the second power source line com2.

Further, a first electrode of the first light emitting element 103 is connected to the first power source line com1 and a second electrode thereof is connected to one of a source and a drain of the driving transistor 102. A first electrode of the second light emitting element 104 is connected to the second power source line com2 and a second electrode thereof is connected to one of the source and the drain of the driving transistor 102. Further, the second electrode of the first light emitting element 103 and the second electrode of the second light emitting element 104 are connected to each other. Further, one of the source and the drain of the driving transistor 102, which is not connected to the first light emitting element 103 and the second light emitting element 104, is connected to the third power source line com3.

It is to be noted in this specification that a connection means an electrical connection unless specifically mentioned.

It is to be noted in this embodiment mode that the first light emitting element 103 emits light when a current flows from the first electrode to the second electrode thereof. The second light emitting element 104 emits light when a current flows from the first electrode to the second electrode thereof. Further, it is to be noted that polarity of the first electrode is opposite to that of the second electrode.

It is to be noted that the first capacitor 105 and the second capacitor 106 for holding video signals inputted to the gate of the driving transistor 102 may be provided between the gate of the driving transistor 102 and another wire (a dedicated wire, a gate signal line of a pixel of a preceding stage, and the like). It is to be noted in this embodiment mode that the selecting transistor 101 is an N-channel type and the driving transistor 102 is a P-channel type. However, the invention is not limited to this.

Next, description is made in details on an operating method of the pixel configuration of this embodiment mode shown in FIG. 2.

Figures 3A, 3B:
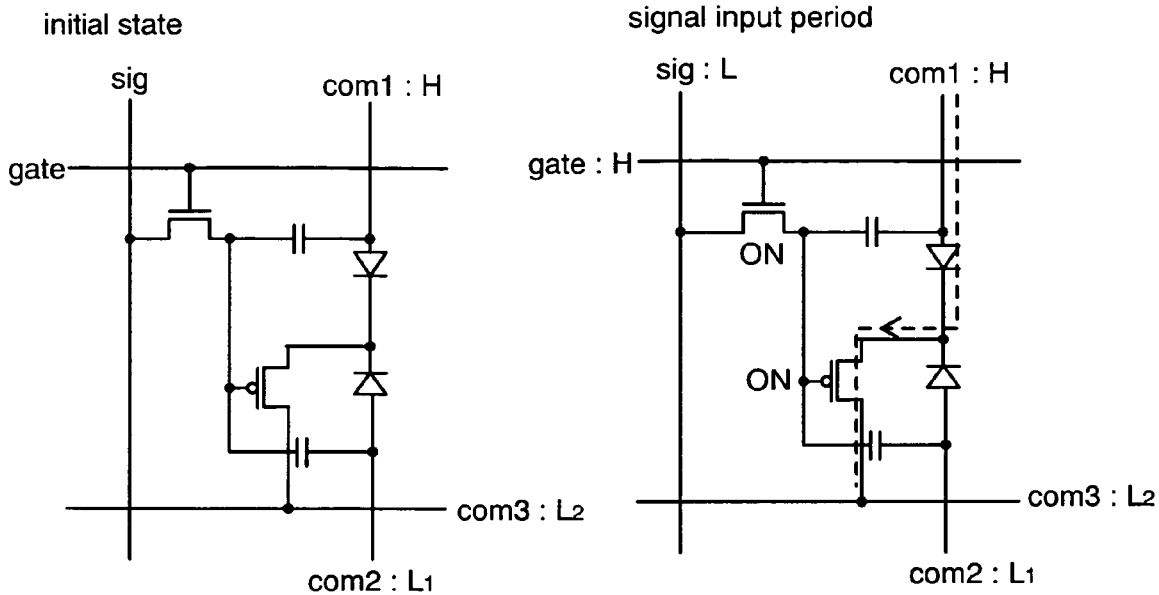
FIGS. 3A to 3C are circuit diagrams showing configurations of Embodiment Mode 1 and FIG. 3D is a timing chart thereof.
Figures 3C, 3D:
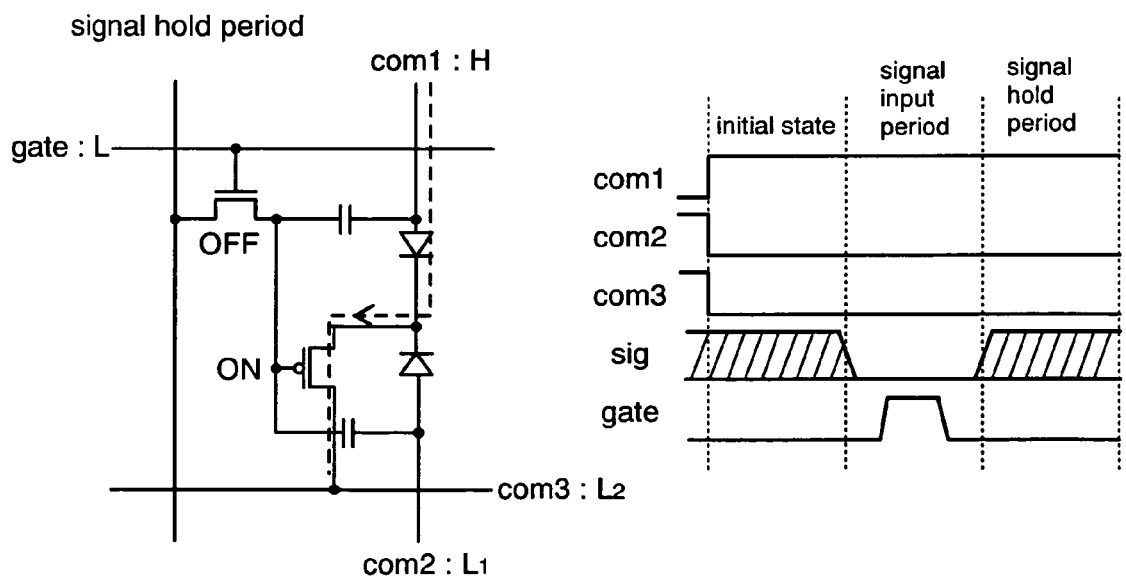

FIGS. 3A to 3C is a diagram showing a voltage of each wire and a timing chart when the first light emitting element 103 is selected for light emission in the pixel of this embodiment mode.

Description is made on a state (initial state) of FIG. 3A. A High electrical potential (hereinafter abbreviated as H) or a Low electrical potential (hereinafter abbreviated as L) is inputted to the data line sig and the first power source line com1 is inputted with an H electrical potential, the second power source line com2 is inputted with a first Low electrical potential (hereinafter abbreviated as $L_1$), and the third power source line com3 is inputted with a second Low electrical potential (hereinafter abbreviated as $L_2$). In this embodiment mode, $H \gg L_2 > L_1$ is satisfied and electrical potentials of $L_1$ and $L_2$ are approximately equal to the electrical potential of L.

Next, a state of FIG. 3B (a signal input period) starts. Here, the data line sig has an L electrical potential. An H electrical potential is inputted to the scan line gate in order to turn on the selecting transistor 101. By turning on the selecting transistor 101, one electrode of each of the first capacitor 105 in pix1 and the second capacitor 106 in pix2 is inputted with an L electrical potential from the data line sig. The other electrode of the first capacitor 105 is inputted with an H electrical potential which is the electrical potential of the first power source line com1, and then a charge is accumulated in the first capacitor 105. Further, the other electrode of the second capacitor 106 is inputted with an $L_1$ electrical potential from the second power source line com2. Potentials applied to the two electrodes of the capacitor 106 become approximately the same, thereby a charge is not accumulated almost at all.

By the charge accumulated in the first capacitor 105, an L electrical potential is applied to the gate of the driving transistor 102, thereby the driving transistor 102 is turned on. At this time, the third power source line is inputted with an $L_2$ electrical potential. Accordingly, an H electrical potential is applied to the first electrode of the first light emitting element 103 and an $L_2$ electrical potential is applied to the second electrode of the first light emitting element 103. A electrical potential difference at this time changes a direction of current flow into the direction of a dotted arrow shown in FIG. 3B, thereby the first light emitting element 103 emits light. That is, a forward bias voltage is applied to the first light emitting element 103.

Further, a first electrode of the second light emitting element 104 is inputted with an $L_1$ electrical potential and the second electrode thereof is inputted with an $L_2$ electrical potential. As described above, electrical potentials are set so as to satisfy $L_2 > L_1$ and a reverse bias voltage is applied from the second electrode side to the first electrode side of the second light emitting element 104. Then, a forward bias voltage is applied to the first light emitting element 103 and a reverse bias voltage is applied to the second light emitting element alternately. Accordingly, uneven charge of the light emitting element can be regularly alleviated. While the light emitting element emits light, high reliability and long life of the second light emitting element 104 can be achieved.

Next, a state of FIG. 3C (a signal hold period) starts. By setting the scan line gate at an L electrical potential, the selecting transistor 101 is turned off. The first capacitor 105 holds a voltage to turn on the driving transistor 102, thereby the first light emitting element 103 can hold a light emission state.

FIG. 3D shows a timing chart of each voltage of the scan line gate, the data line sig, the first power source line com1, the second power source line com2, and the third power source line com3 in each stage (the initial state, the signal input period, and the signal hold period) shown in FIGS. 3A to 3C. By controlling the electrical potential of each wire as shown in FIG. 3D, light emission of the light emitting element and an operation to apply a reverse bias voltage can be controlled at the same time. It is to be noted in FIG. 3D that shaded regions of the data line sig are undefined value regions where the electrical potential may be at H or L.

It is to be noted that electrical potentials of $L_1$ and $L_2$ may be the same electrical potentials. In this case, a reverse bias voltage is not applied to the second light emitting element 104.

Figure 4A:
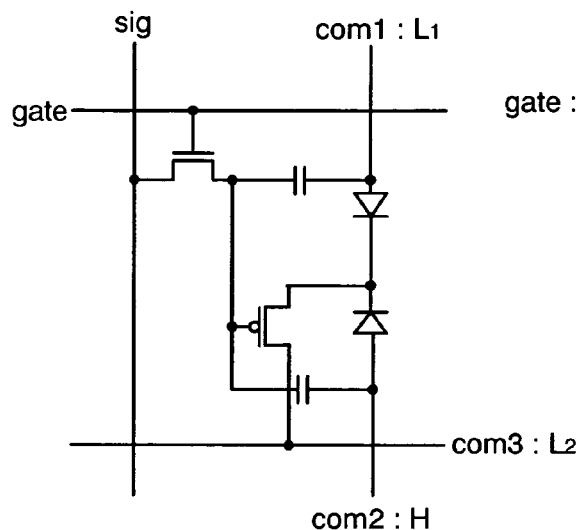
FIGS. 4A to 4C are circuit diagrams showing configurations of Embodiment Mode 1 and FIG. 4D is a timing chart thereof.
Figure 4B:
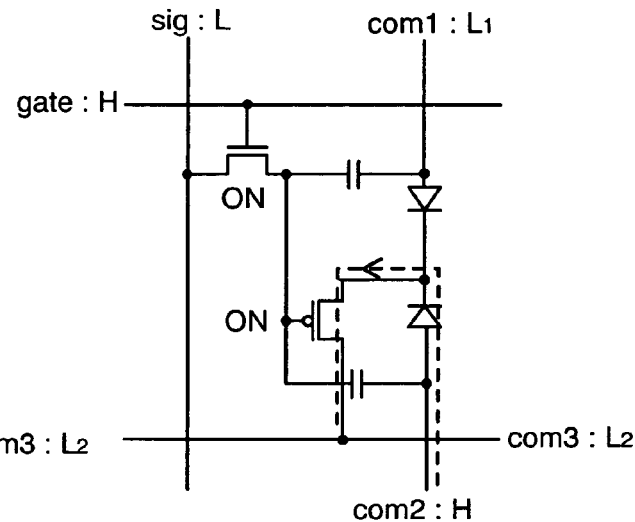
Figure 4C:
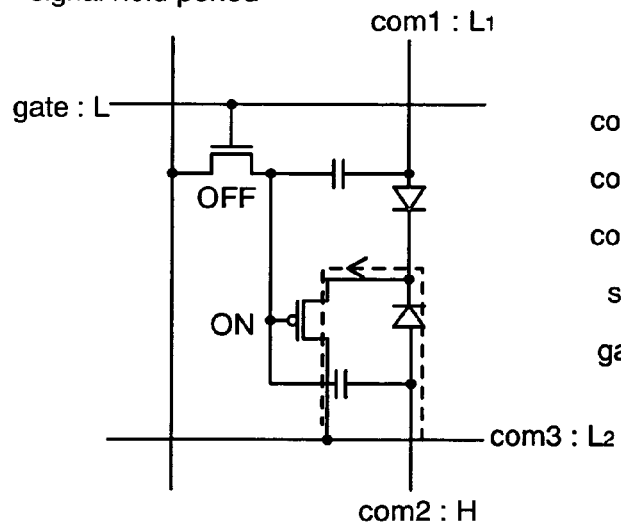

Next, FIGS. 4A to 4C shows a voltage of each wire and a timing chart when the second light emitting element 104 is selected for light emission in the pixel of this embodiment mode.

Description is made on a state (initial state) of FIG. 4A. An H or L electrical potential is inputted to the data line sig, an $L_1$ electrical potential is inputted to the first power source line com1, an H electrical potential is inputted to the second power source line com2, and an $L_2$ electrical potential is inputted to the third power source line com3.

Next, a state of FIG. 4B (a signal input period) starts. Here, the data line sig has an L electrical potential. An H electrical potential is inputted to the scan line gate in order to turn on the selecting transistor 101. By turning on the selecting transistor 101, one electrode of each of the first capacitor 105 in pix1 and the second capacitor 106 and pix2 is inputted with an L electrical potential from the data line sig. The other electrode of the first capacitor 105 is inputted with an $L_1$ electrical potential from the first power source line com1, and then electrical potentials applied to the two electrodes of the capacitor 105 becomes approximately the same, thereby a charge is not accumulated almost at all. Further, the other electrode of the second capacitor 106 is inputted with an H electrical potential which is the electrical potential of the second power source line com2, thereby a charge is accumulated in the second capacitor 106.

By the charge accumulated in the second capacitor 106, an L electrical potential is applied to the gate of the driving transistor 102, thereby the driving transistor 102 is turned on. At this time, the third power source line is inputted with an $L_2$ electrical potential. Accordingly, an H electrical potential is applied to the first electrode of the second light emitting element 104 and an $L_2$ electrical potential is applied to the second electrode of the second light emitting element 104. A electrical potential difference at this time changes a direction of current flow into a direction of a dotted arrow shown in FIG. 4B, thereby the second light emitting element 104 emits light. That is, a forward bias voltage is applied to the second light emitting element 104.

Further, a first electrode of the first light emitting element 103 is inputted with an $L_1$ electrical potential and the second electrode thereof is inputted with an $L_2$ electrical potential. As described above, electrical potentials are set so as to satisfy $L_2 > L_1$ and a reverse bias voltage is applied from the second electrode side to the first electrode side of the first light emitting element 103. Then, a forward bias voltage is applied to the first light emitting element 103 and a reverse bias voltage is applied to the second light emitting element alternately. Accordingly, uneven charge of the light emitting element can be regularly alleviated. While the light emitting element emits light, high reliability and long life of the first light emitting element 103 can be achieved.

Next, a state of FIG. 4C (a signal hold period) starts. By setting the scan line gate at an L electrical potential, the selecting transistor 101 is turned off. The second capacitor 106 holds a voltage to turn on the driving transistor 102, thereby the second light emitting element 104 can hold a light emission state (That is, a forward valotage is applied to the second light emitting element 104.).

Figure 4D:
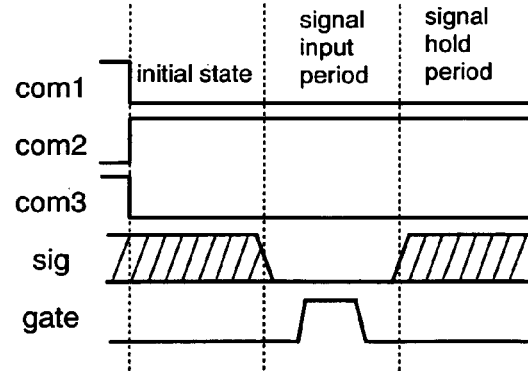

FIG. 4D shows a timing chart of each voltage of the scan line gate, the data line sig, the first power source line com1, the second power source line com2, and the third power source line com3 in each stage (the initial state, the signal input period, and the signal hold period) shown in FIGS. 4A to 4C. By controlling the electrical potential of each wire as shown in FIG. 4D, light emission of the light emitting element and an operation to apply a reverse bias voltage can be controlled at the same time. It is to be noted in FIG. 4D that shaded regions of the data line sig are undefined value regions where the electrical potential may be at H or L.

It is to be noted that electrical potentials of $L_1$ and $L_2$ may be the same electrical potentials. In this case, a reverse bias voltage is not applied to the first light emitting element 103.

Figure 5:
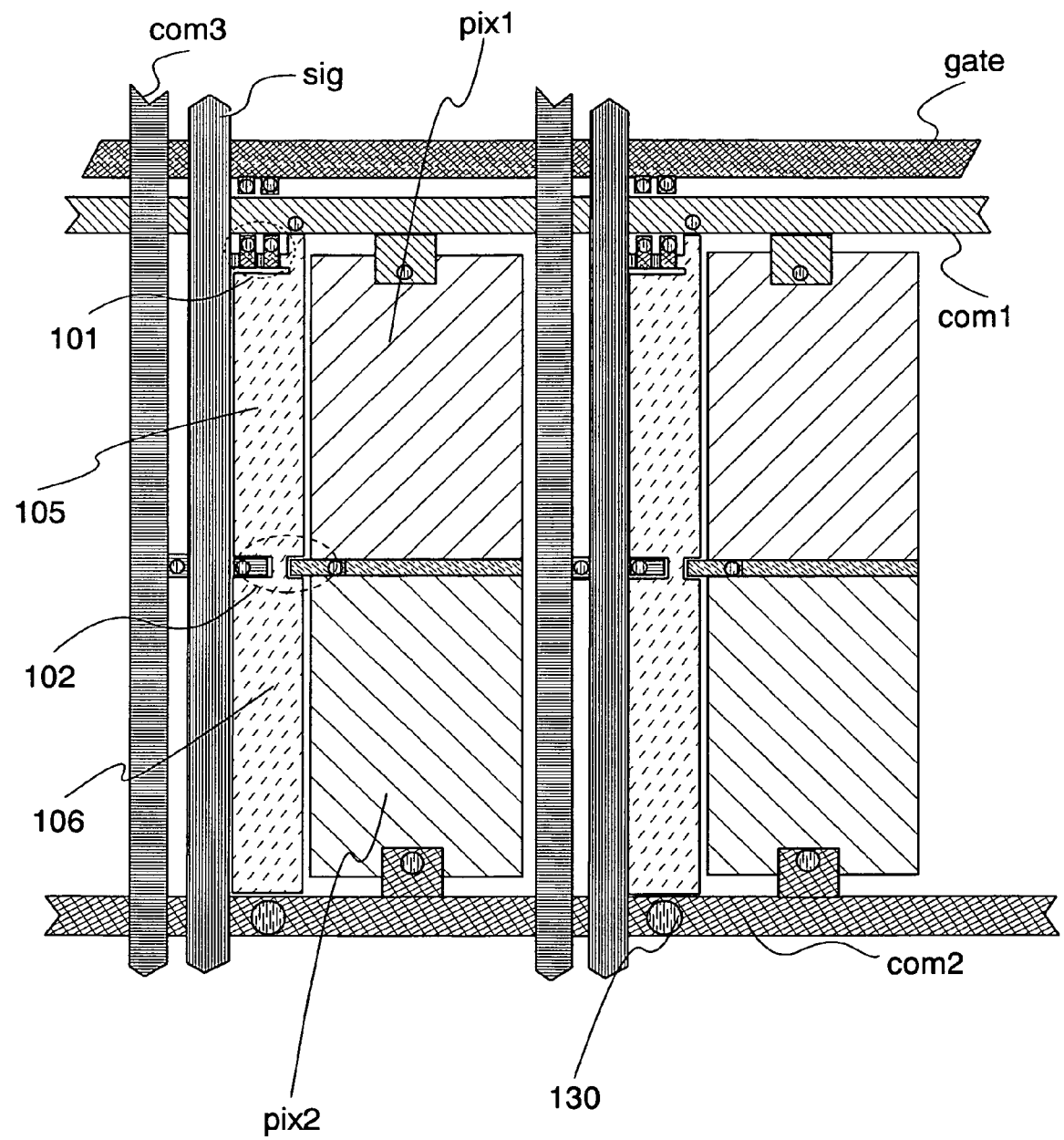
FIG. 5 is a top plan view showing a configuration of Embodiment Mode 1.

FIG. 5 shows an actual top plan view of a circuit configuration of this embodiment mode. A connecting portion of each wire includes a contact portion 130. The top plan view shown in FIG. 5 is only an example and the invention is not limited to this.

Next, description is made on configurations of a display panel having a circuit configuration of a light emitting device of this embodiment mode and of a driver circuit.

Figure 6:
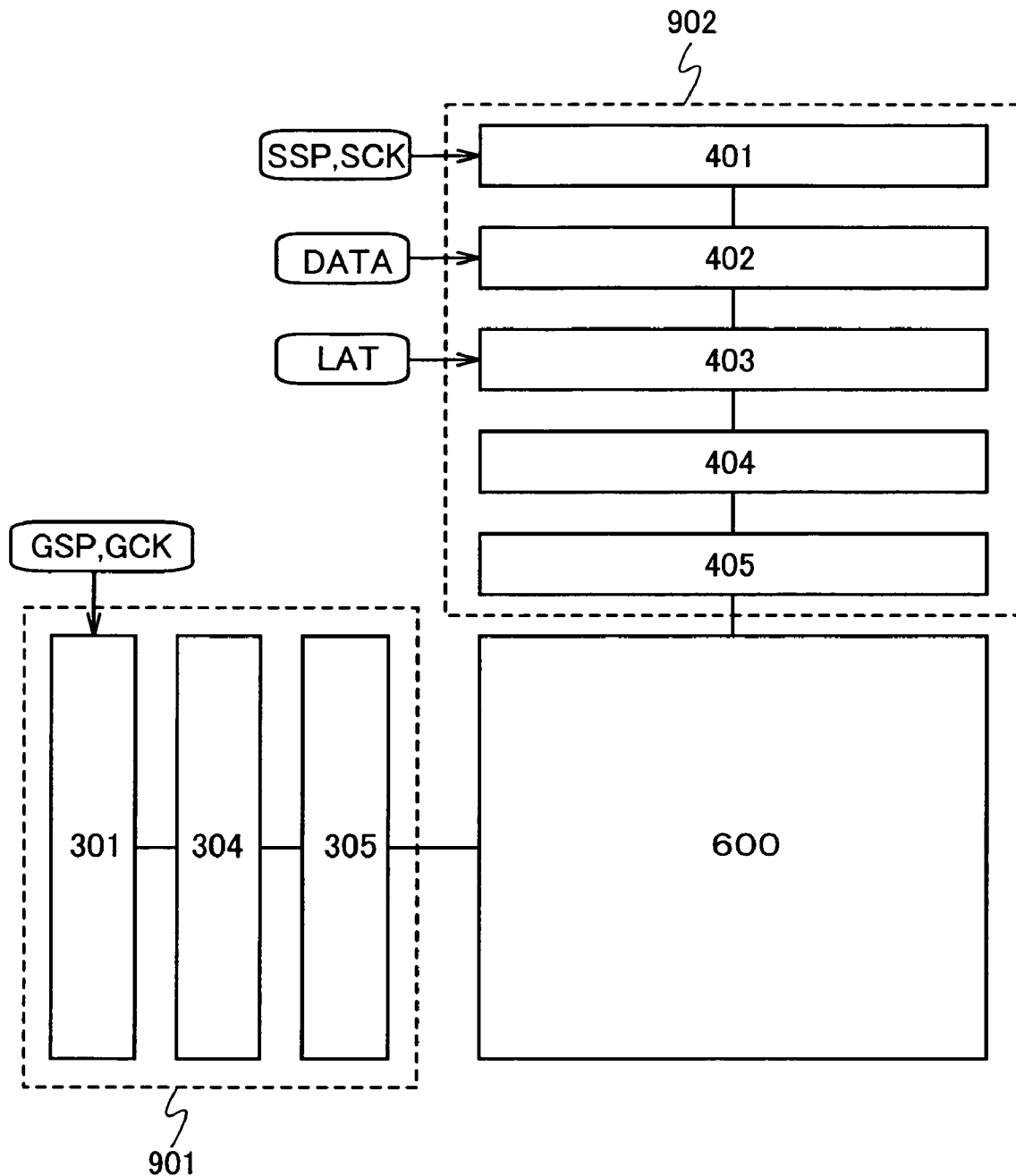
FIG. 6 is a block diagram showing a configuration of Embodiment Mode 1.

FIG. 6 shows a block diagram including a scan line driver circuit 901 and a signal line driver circuit 902 provided in the periphery of a display portion 600.

The scan line driver circuit 901 includes a shift register 301, a level shifter 304, and a buffer 305. Further, the signal line driver circuit 902 includes a shift register 401, a first latch circuit 402, a second latch circuit 403, a level shifter 404, and a buffer 405. The display portion 600 includes the region 100 where the first pixel pix1 and the second pixel pix2 are provided. A light emitting element is provided in each pixel. The circuit configuration of the region 100 is as shown in FIG. 2.

The signal line driver circuit 902, the scan line driver circuit 901, and the display portion 600 can be formed using semiconductor elements provided over the same substrate. For example, they can be formed using thin film transistors provided over a glass substrate. Further, the signal line driver circuit 902 and the scan line driver circuit 901 can be mounted over a glass substrate using an IC chip.

In the light emitting device of this embodiment mode, the first light emitting element and the second light emitting element are selected for light emission, thereby an image is displayed. Further, in a light emitting element of this embodiment mode, display is performed by a time division gray scale method. Accordingly, the light emitting device of the invention performs display by the interlace method to perform displays of pixels of odd rows and even rows separately. By employing the interlace method, such phenomena can be prevented that a pseudo contour occurs in a display portion and image quality degrades. It is to be noted that a pseudo contour is a phenomenon that an unnaturally bright line or dark line is mixed when an intermediate gray scale level is expressed.

Figures 7A, 7B:
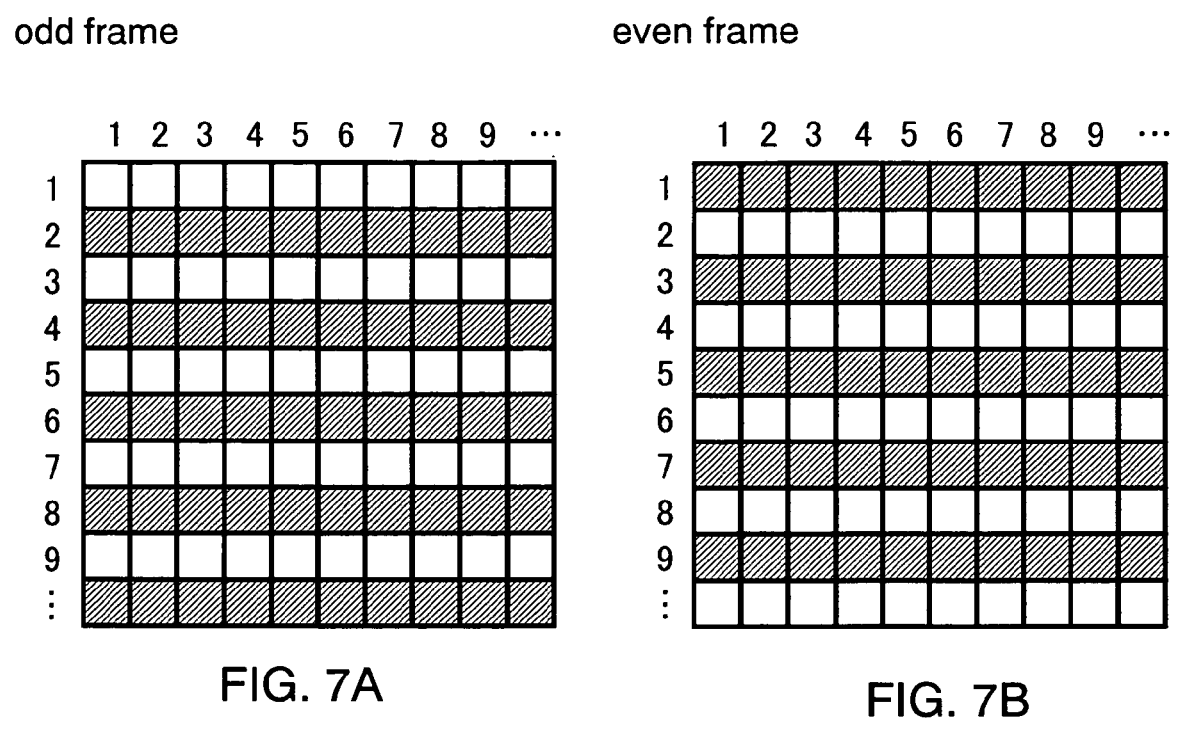

FIGS. 7A and 7B shows a schematic diagram of a pixel portion of an active matrix light emitting device in which the circuit configuration of this embodiment is arranged in matrix. Display pixels express white and non-display pixels express black.

In this embodiment mode, the first pixel pix1 and the second pixel pix2 may be arranged in the extending direction of the data line sig shown in FIG. 1.

In such a pixel portion, only the pixels in odd rows which are the first pixel pix1 perform display in a first frame (see FIG. 7A) and only the pixels in even rows which are the second pixel pix2 perform display in a second frame (see FIG. 7B). That is, display regions and non-display regions are provided in stripes in the pixel portion.

It is to be noted in this embodiment mode that the first frame is referred to as an odd frame while the second frame is referred to as an even frame.

In a pixel portion of the invention, only the pixels in even rows, which are the second pixels pix2 may perform display in odd frames and only the pixels in odd rows, which are the first pixels pix1 may perform display in even frames.

Figures 8A, 8B:
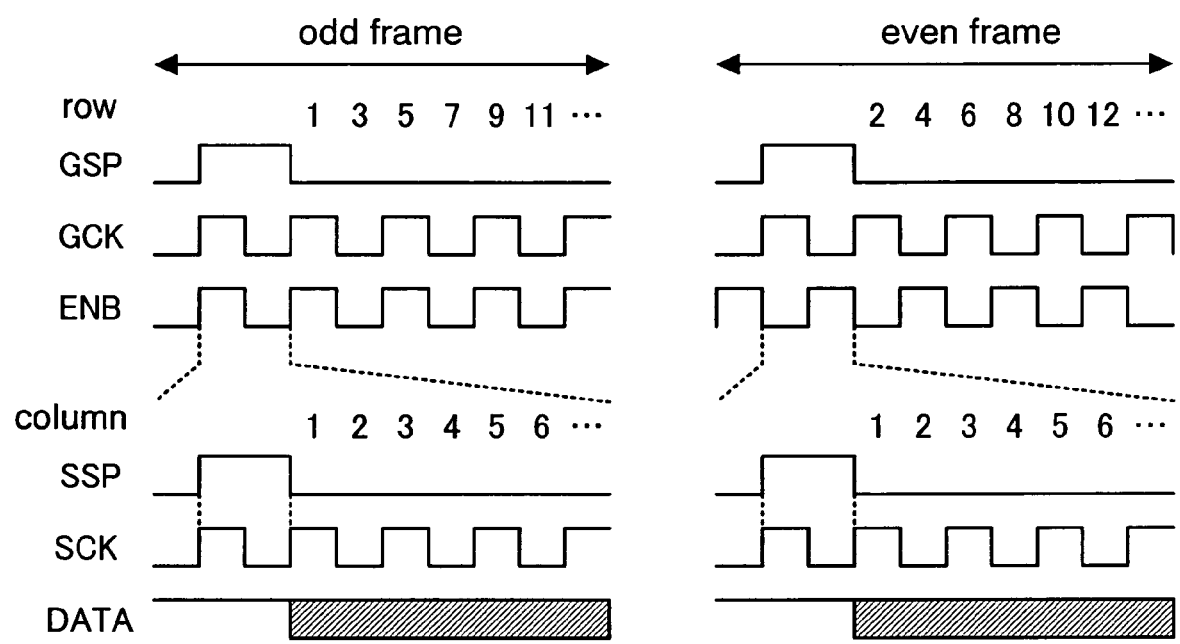
FIGS. 8A and 8B are timing charts of display examples of a display panel showing configurations of Embodiment Mode 1.

FIGS. 8A and 8B show timing charts for performing such display. FIG. 8A shows a scan line start pulse (GSP), a scan line clock signal (GCK), and a selecting (ENB) signal for selecting scan lines in a row direction in odd frames. Further, a start pulse (SSP) and a start clock signal (SCK) for selecting data lines in a column direction are shown. By these signals, timing of a video signal (DATA) is shown using these signals.

FIG. 8B shows a timing chart in even frames. The ENB signal is inverted to FIG. 8A although other timing is the same.

In odd frames, pixels in odd rows in the pixel portions are selected only when the ENB signal is High. In even frames, pixels in even rows in the pixel portions are selected only when the ENB signal is High. That is, the scan lines in the display portion are selected only when the ENB signal is High in the display portion of this embodiment mode.

The video signal (DATA) is inputted to a selected pixel after the SSP signal. Further, the video signal (DATA) may be captured within one gate clock period. It is to be noted that the selected pixel is a pixel including a semiconductor element connected to a selected scan line.

According to the aforementioned invention, a pseudo contour can be prevented from occurring in an active matrix light emitting device which employs the time division gray scale method.

For preventing a pseudo contour, a frame frequency is required to be increased. When a frequency is high, however, a driver circuit is overloaded and the amount of video data increases. Accordingly, the burden on the driver circuit, in particular the frequency of a latch circuit is increased. Therefore, the number of wires for inputting video signals increases. By using the circuit configuration of this embodiment mode, a pseudo contour can be prevented without increasing a frame frequency and the overload on the driver circuit.

By using the interlace method, the amount of video data can be reduced to half. As a result, the number of signal lines and scan lines can be reduced and the aperture ratio can be improved.

It is to be noted that luminance may decrease when the interlace method is employed. By using an organic material for a light emitting element of a light emitting device of this embodiment mode, however, the luminance of the light emitting element decreases exponentially. Therefore, an increase in voltage supply in accordance with the decrease in luminance is not a big problem.

By employing the interlace method, the pixels in the odd rows emit light in the first frame and the pixels in the even rows emit light in the second frame. Accordingly, the amount of video data is reduced to half, thereby the frame frequency can be set high without burdening the driver circuit. As a result, a pseudo contour can be prevented without decreasing luminance and burdening the driver circuit.

In the case where the first pixel pix1 and the second pixel pix2 shown in FIG. 1 are arranged in the extending direction of the scan line, the first pixel pix1 and the second pixel pix2 may be sequentially arranged in the extending direction of the scan line gate. In this configuration, display may be performed as the interlace method in the extending direction of the data line sig.

It is to be noted in this embodiment mode that a thin film transistor may be used as the semiconductor element connected to the signal lines and the scan lines.

It is to be noted that this embodiment mode can be freely implemented in combination with other embodiment modes in this specification. Therefore, the number of transistors which form pixels and the number of wires such as the scan lines and the power source lines can be reduced, thereby the aperture ratio can be increased. Thus, a voltage applied to a light emitting element for holding desired luminance can be suppressed and low power consumption can be achieved. Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Further, in a light emitting device of the invention, a visible pseudo contour which is a problem in displaying an image by the time gray scale method can be reduced by employing a method (an interlace method) for sequentially performing light emission of pixels of every other row in an extending direction of the data lines or the scan lines. Further, a visible pseudo contour can be reduced by employing a method (a checker method) for performing light emission of pixels in what is called a check pattern so that pixels emit light which are one pixel aside of the pixels which emit light in the preceding row in the extending direction of the data lines.

Embodiment Mode 2

In Embodiment Mode 1, the description is made on the circuit diagram of the light emitting device where a common driving transistor is driven for both the first light emitting element and the second light emitting element usually, thereby a reverse bias voltage is applied to the second light emitting element while the first light emitting element emits light. In this embodiment mode, a specific configuration where a driving transistor is provided for each of the first light emitting element and the second light emitting element is described below.

Figure 9:
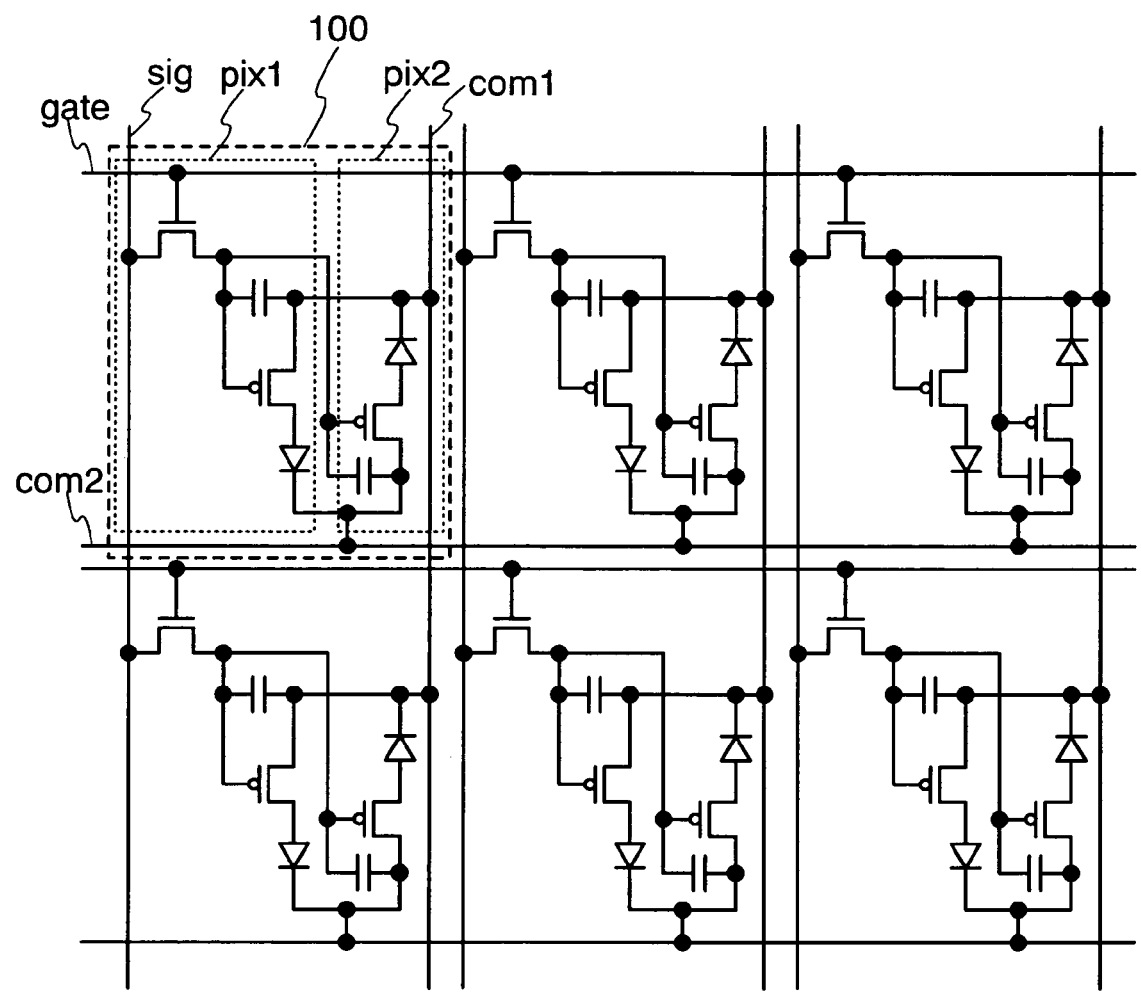
FIG. 9 is a circuit diagram showing a configuration of Embodiment Mode 2.
Figure 10:
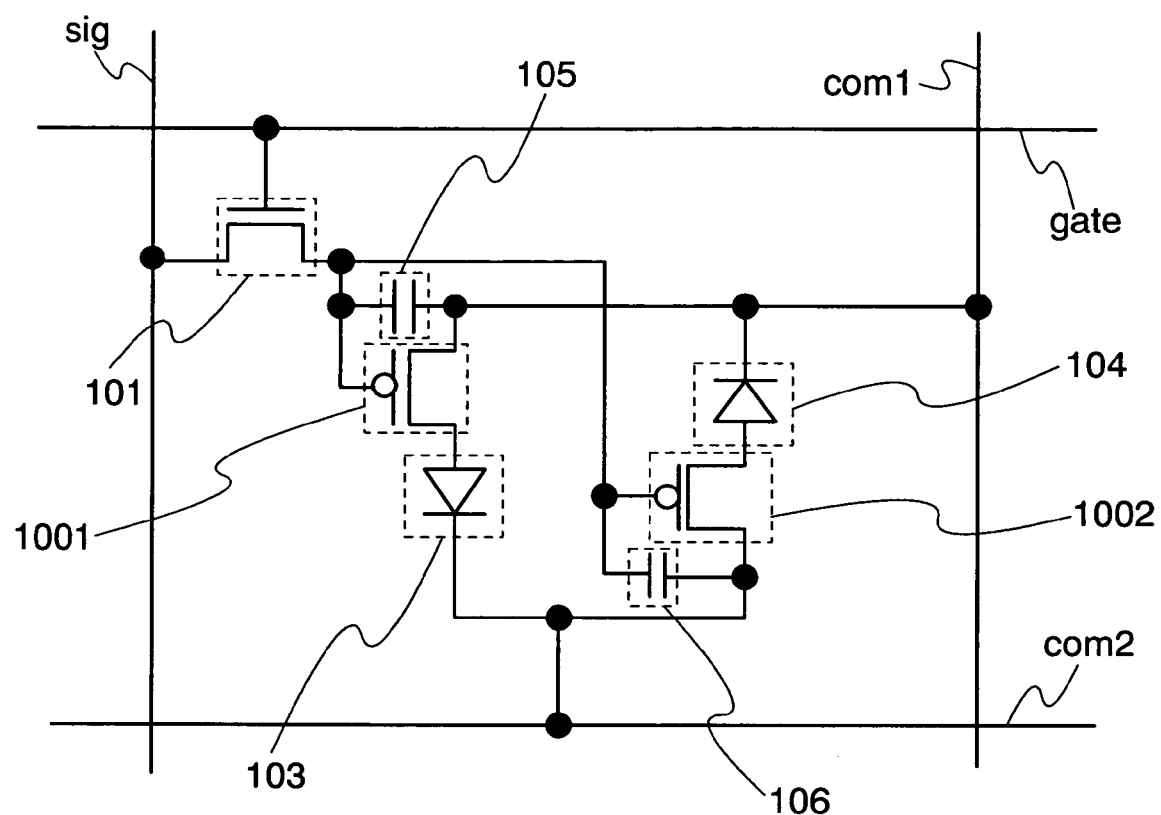
FIG. 10 is a circuit diagram showing a configuration of Embodiment Mode 2.

FIG. 9 shows a circuit diagram where pixels of this embodiment mode are arranged in matrix. FIG. 10 shows an enlarged circuit configuration of a pixel portion of this embodiment mode. The region 100 as a pixel portion shown in FIG. 9, which is the pixel portion, includes the first pixel pix1 and the second pixel pix2. Further, each of the regions 100 shown in FIG. 9 and the enlarged region 100 shown in FIG. 10 includes a scan line gate, a data line sig, a first power source line com1, and a second power source line com2.

In FIG. 10, the pixel portion includes the selecting transistor 101, a first driving transistor 1001, a second driving transistor 1002, the first light emitting element 103, the second light emitting element 104, the first capacitor 105, and the second capacitor 106.

One of the source and a drain of the selecting transistor 101 is connected to the data line sig and the other electrode thereof is connected to a gate of the first driving transistor 1001 and a gate of the second driving transistor 1002. Further, one electrode of the first capacitor 105 is connected to the gate of the first driving transistor 1001 and the other electrode thereof is connected to the first power source line com1. Further, one electrode of the second capacitor 106 is connected to the gate of the second driving transistor 1002 and the other electrode thereof is connected to the second power source line com2.

Further, the first electrode of the first light emitting element 103 is connected to one of the source and the drain of the first driving transistor 1001 and the second electrode of the first light emitting element 103 is connected to the second power source line com2. The first electrode of the second light emitting element 104 is connected to one of the source and the drain of the driving transistor and the second electrode thereof is connected to the first power source line com1. One of the source and the drain of the first driving transistor 1001, which is not connected to the first light emitting element 103 is connected to the first power source line com1. Further, one of the source and the drain of the second driving transistor 1002, which is not connected to the first light emitting element 104 is connected to the power source line com2.

It is to be noted in this embodiment mode that the first light emitting element 103 emits light when a current flows from the first electrode to the second electrode thereof. Further, the second light emitting element 104 emits light when a current flows from the first electrode to the second electrode thereof. Further, it is to be noted that polarity of the first electrode is opposite to that of the second electrode.

It is to be noted that the first capacitor 105 and the second capacitor 106 for holding video signals inputted to the gates of the first driving transistor 1001 and the second driving transistor 1002 may be provided between the gates of the first driving transistor 1001 and the second driving transistor 1002 and another wire (a dedicated wire, a gate signal line of a pixel of a preceding stage, and the like). It is to be noted in this embodiment mode that the selecting transistor 101 is an N-channel type and the first and second driving transistors are a P-channel type. However, the invention is not limited to this.

Next, description is made in details on an operating method of the pixel configuration of this embodiment mode shown in FIG. 10.

FIGS. 11A to 11D is a diagram showing a voltage of each wire and a timing chart when the first light emitting element 103 is selected for light emission in the pixel of this embodiment mode.

Figure 11A:
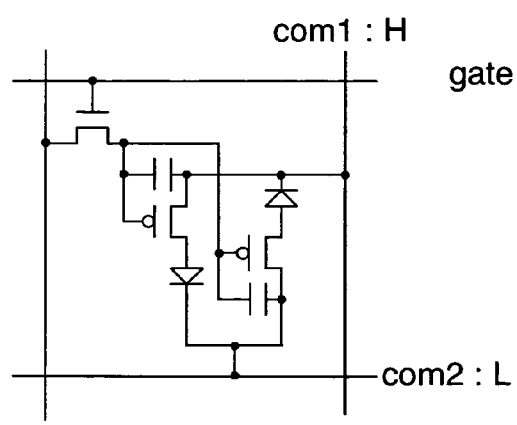
FIGS. 11A to 11C are circuit diagrams showing configurations of Embodiment Mode 2 and FIG. 11D is a timing chart thereof.

Description is made on a state (initial state) of FIG. 11A. A High electrical potential or a Low electrical potential is inputted to the data line sig, an H electrical potential is inputted to the first power source line com1, and an L electrical potential is inputted to the second power source line com2.

Figure 11B:
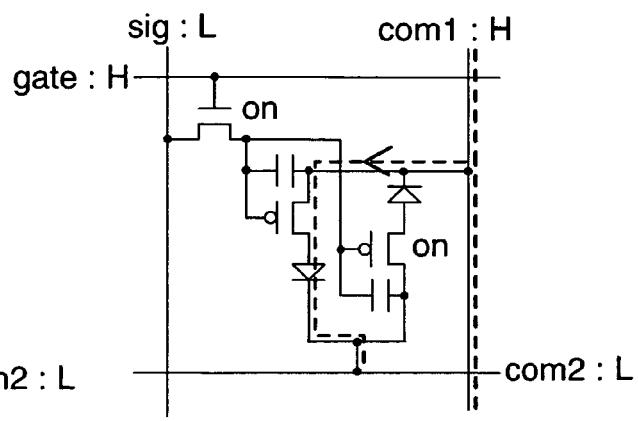

Next, a state of FIG. 11B (a signal input period) starts. Here, the data line sig has an L electrical potential. An H electrical potential is inputted to the scan line gate in order to turn on the selecting transistor 101. By turning on the selecting transistor 101, one electrode of each of the first capacitor 105 in pix1 and the second capacitor 106 in pix2 is inputted with an L electrical potential from the data line sig. The other electrode of the first capacitor 105 is inputted with an H electrical potential which is the electrical potential of the first power source line com1, and then a charge is accumulated in the first capacitor 105. Further, the other electrode of the second capacitor 106 is inputted with an L electrical potential from the second power source line com2, thereby electrical potentials applied to the two electrodes of the second capacitor 106 become the same. Thus, a charge is not accumulated in the second capacitor 106.

When an L electrical potential is applied to the gates of the first driving transistor 1001 and the second driving transistor 1002 by the charge accumulated in the first capacitor 105, the first driving transistor 1001 and the second driving transistor 1002 are turned on. At this time, the second power source line is inputted with an L electrical potential. Accordingly, an H electrical potential is applied to the first electrode of the first light emitting element 103 and an L electrical potential is applied to the second electrode of the first light emitting element 103. By a electrical potential difference generated at this time, a current flows in a direction of the dotted arrow shown in FIG. 11B, thereby the first light emitting element 103 emits light. That is, a forward bias voltage is applied to the first light emitting element 103.

Further, by turning on the second driving transistor 1002, the first electrode of the second light emitting element 104 is inputted with an L electrical potential and the second electrode thereof is inputted with an H electrical potential. That is, a reverse bias voltage is applied from the second electrode side to the first electrode side of the second light emitting element 104. Then, a forward bias voltage is applied to the first light emitting element 103 and a reverse bias voltage is applied to the second light emitting element alternately. Accordingly, uneven charge of the light emitting element can be regularly alleviated. While the light emitting element emits light, high reliability and long life of the second light emitting element 104 can be achieved.

Figure 11C:
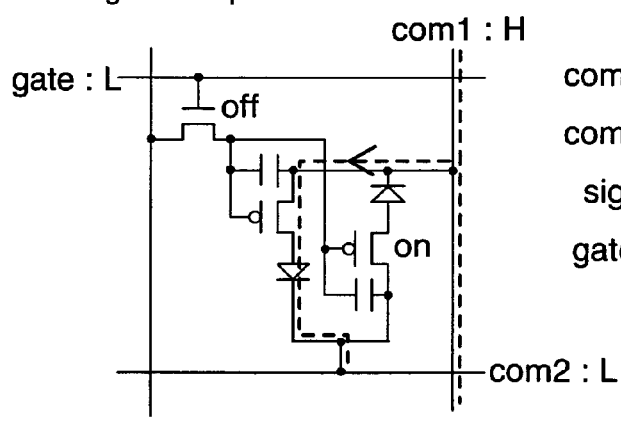

Next, a state of FIG. 11C (a signal hold period) starts. By setting the scan line gate at an L electrical potential, the selecting transistor 101 is turned off. The first capacitor 105 holds a voltage to turn on the first driving transistor 1001 and the second driving transistor 1002, thereby the first light emitting element 103 can hold a light emission state.

Figure 11D:
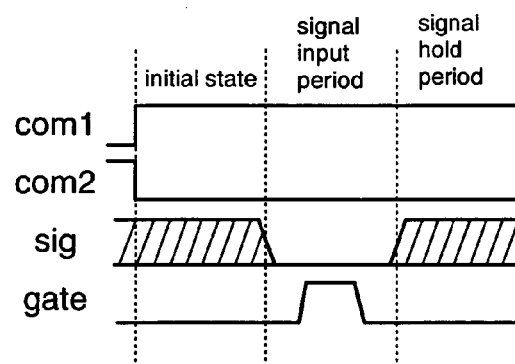

FIG. 11D shows a timing chart of each voltage of the scan line gate, the data line sig, the first power source line com1, and the second power source line com2, and the third power source line com3 in each stage (the initial state, the signal input period, and the signal hold period) shown in FIGS. 11A to 11C. By controlling the electrical potential of each wire as shown in FIG. 11D, light emission of the light emitting element and an operation to apply a reverse bias voltage can be controlled at the same time. It is to be noted in FIG. 11D that shaded regions of the data line sig are undefined value regions where the electrical potential may be at H or L.

Next, FIGS. 12A to 12D show a voltage of each wire and a timing chart when the second light emitting element 104 is selected for light emission in the pixel of this embodiment mode.

Figure 12A:
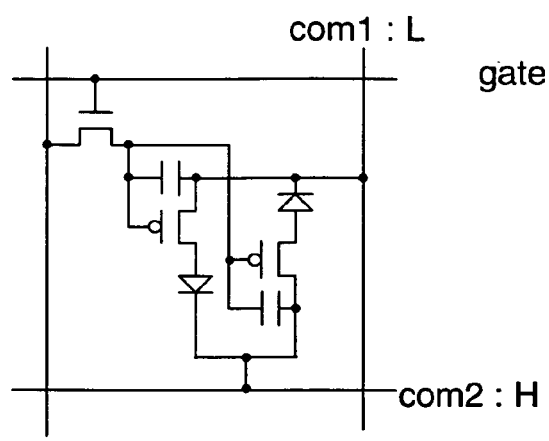
FIGS. 12A to 12C are circuit diagrams showing configurations of Embodiment Mode 2 and FIG. 12D is a timing chart thereof.

Description is made on a state (an initial state) of FIG. 12A. The data line sig is inputted with an H or L electrical potential, the first power source line com1 is inputted with an L electrical potential, and the second power source line com2 is inputted with an H electrical potential.

Figure 12B:
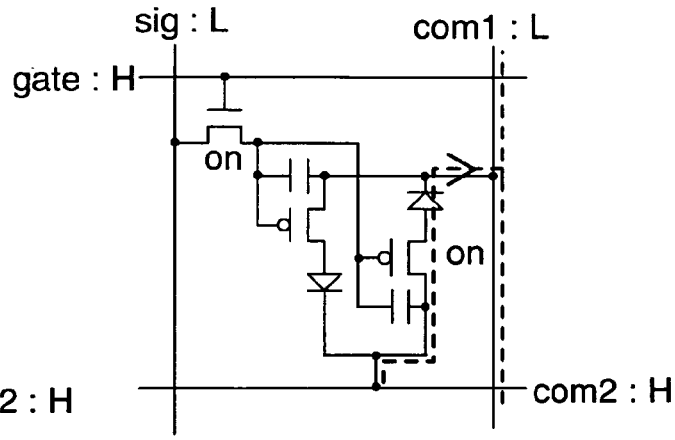

Next, a state of FIG. 12B (a signal input period) starts. Here, the data line sig has an L electrical potential. An H electrical potential is inputted to the scan line gate in order to turn on the selecting transistor 101. By turning on the selecting transistor 101, one electrode of each of the first capacitor 105 in pix1 and the second capacitor 106 in pix2 is inputted with an L electrical potential from the data line sig. The other electrode of the first capacitor 105 is inputted with an L electrical potential from the first power source line com1, and then electrical potentials applied to the two electrodes of the first capacitor 105 become the same, thereby a charge is not accumulated. Further, the other electrode of the second capacitor 106 is inputted with an H electrical potential which is the electrical potential of the second power source line com2, thereby a charge is accumulated in the second capacitor 106.

When an L electrical potential is applied to the gates of the first driving transistor 1001 and the second driving transistor 1002 by the charge accumulated in the second capacitor 106, the first driving transistor 1001 and the second driving transistor 1002 are turned on. At this time, the first power source line is inputted with an L electrical potential. Accordingly, an H electrical potential is applied to the first electrode of the second light emitting element 104 and an L electrical potential is applied to the second electrode of the second light emitting element 104. By a electrical potential difference generated at this time, a current flows in a direction of a dotted arrow shown in FIG. 12B, thereby the second light emitting element 104 emits light. That is, a forward bias voltage is applied to the second light emitting element 104.

Further, the first electrode of the first light emitting element 103 is inputted with an H electrical potential and the second electrode thereof is inputted with an L electrical potential. That is, a reverse bias voltage is applied from the second electrode side to the first electrode side of the first light emitting element 103. Then, a forward bias voltage is applied to the second light emitting element 104 and a reverse bias voltage is applied to the first light emitting element 103 alternately. Accordingly, uneven charge of the light emitting element can be regularly alleviated. While the second light emitting element 104 emits light, high reliability and long life of the first light emitting element 103 can be achieved.

Figure 12C:
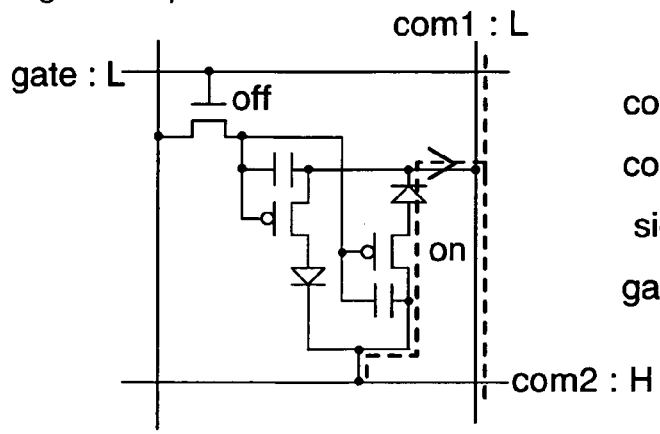

Next, a state of FIG. 12C (a signal hold period) starts. By setting the scan line gate at an L electrical potential, the selecting transistor 101 is turned off. The second capacitor 106 holds a voltage to turn on the first driving transistor 1001 and the second driving transistor 1002, thereby the second light emitting element 104 can hold a light emission state.

Figure 12D:
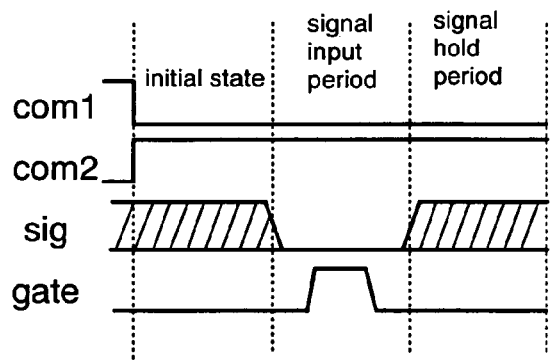

FIG. 12D shows a timing chart of each voltage of the scan line gate, the data line sig, the first power source line com1, and the second power source line com2, and the third power source line com3 in each stage (the initial state, the signal input period, and the signal hold period) shown in FIGS. 12A to 12C. By controlling the electrical potential of each wire as shown in FIG. 12D, light emission of the light emitting element and an operation to apply a reverse bias voltage can be controlled at the same time. It is to be noted in FIG. 12D that shaded regions of the data line sig are undefined value regions where the electrical potential may be at H or L.

It is to be noted that a signal for erasing the electrical potentials which are held in the first capacitor 105 and the second capacitor 106 to turn on the first driving transistor 1001 and the second driving transistor 1002 may be inputted from the scan line gate.

It is to be noted that this embodiment mode can be freely implemented in combination with other embodiment modes in this specification. Therefore, the number of transistors which form pixels and the number of wires such as the scan lines and the power source lines can be reduced, thereby the aperture ratio can be increased. Thus, a voltage applied to a light emitting element for holding desired luminance can be suppressed and low power consumption can be achieved. Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Further, in a light emitting device of the invention, a visible pseudo contour which is a problem in displaying an image by the time gray scale method can be reduced by employing a method (an interlace method) for sequentially performing light emission of pixels of every other row in an extending direction of the data lines or the scan lines. Further, a visible pseudo contour can be reduced by employing a method (a checker method) for performing light emission of pixels in what is called a check pattern so that pixels emit light which are one pixel aside of the pixels which emit light in the preceding row in the extending direction of the data lines.

Embodiment Mode 3

In the aforementioned embodiment mode, an erasing transistor may be provided for erasing the electrical potentials held in the first capacitor and the second capacitor. Specific configurations thereof are described below.

Figure 13:
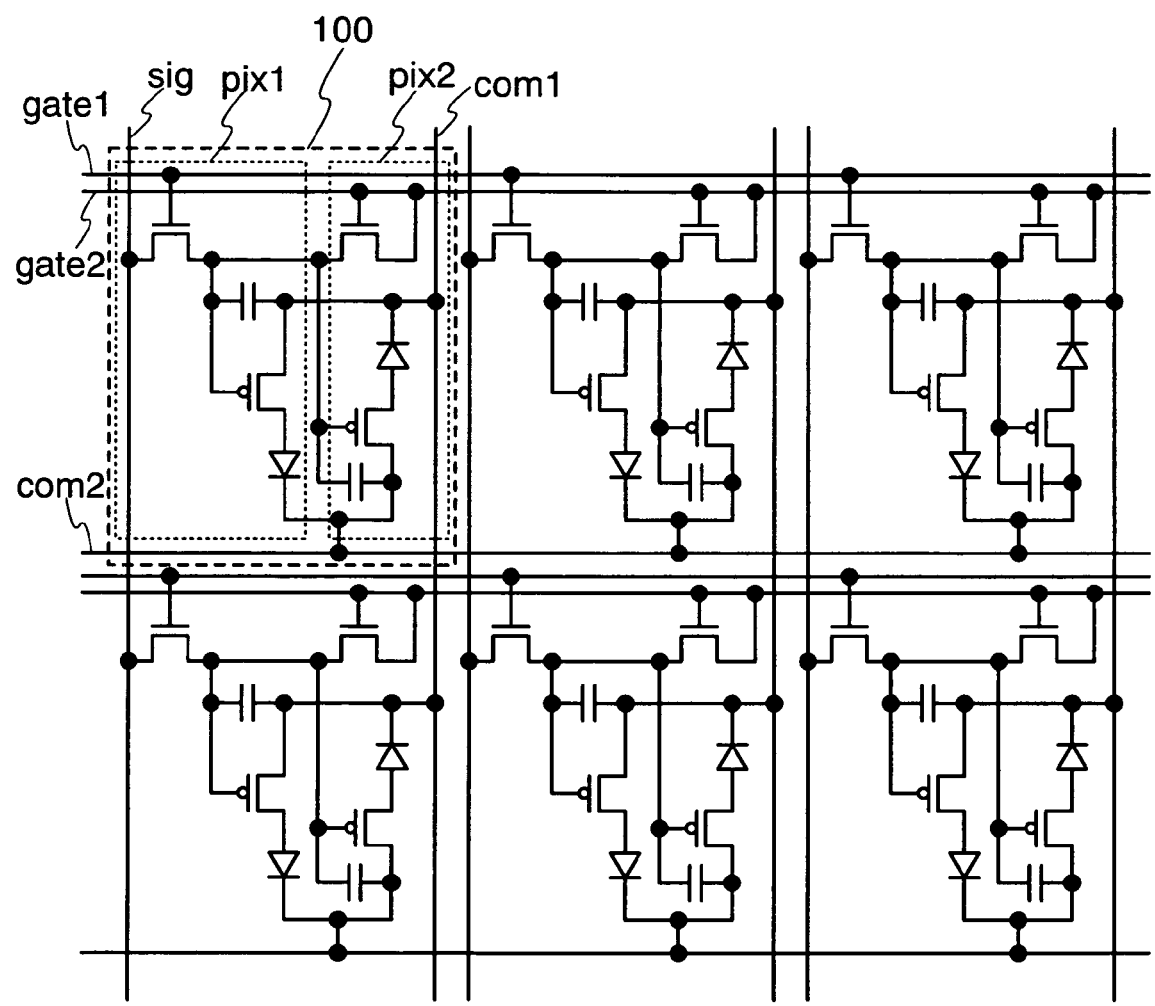
FIG. 13 is a circuit diagram showing a configuration of Embodiment Mode 3.
Figure 14A:
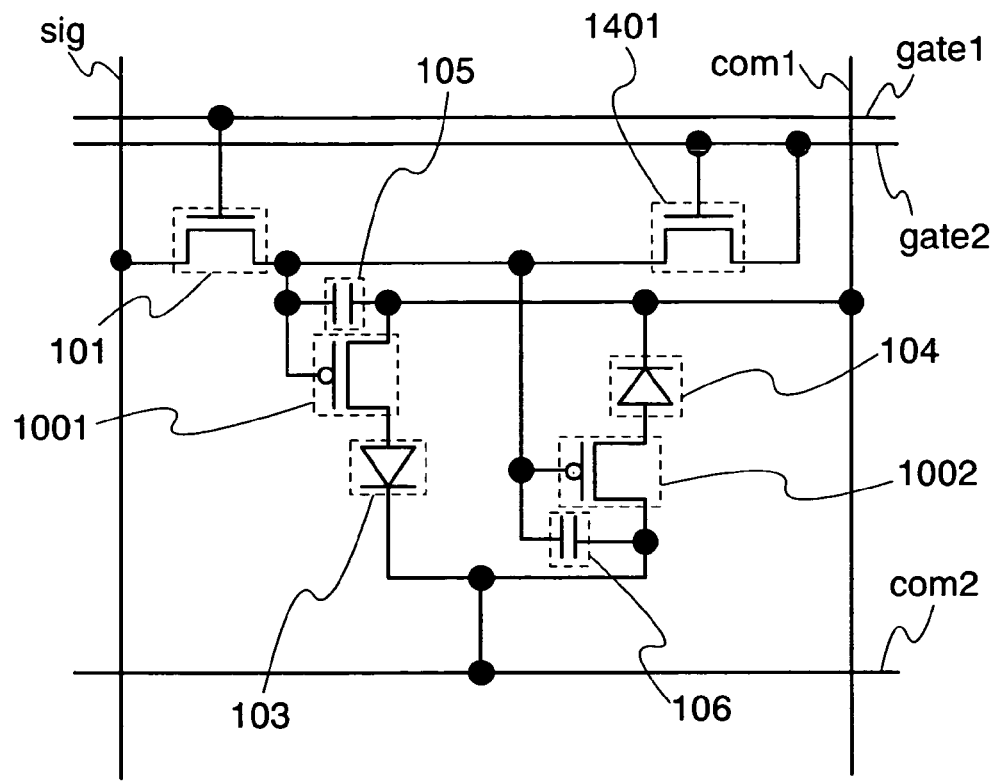
FIGS. 14A and 14B are circuit diagrams showing configurations of Embodiment Mode 3.

FIG. 13 shows a circuit diagram where pixel portions of this embodiment mode are arranged in matrix. FIG. 14A shows an enlarged circuit configuration of the pixel portion of this embodiment mode. The region 100 shown in FIG. 13 includes the first pixel pix1 and the second pixel pix2. Further, each of the region 100 shown in FIG. 13 and the enlarged region 100 shown in FIG. 14A includes a scan line gate1, an erase line gate2, a data line sig, a first power source line com1, and a second power source line com2.

In FIG. 14A, the pixel portion includes the selecting transistor 101, the first driving transistor 1001, the second driving transistor 1002, an erasing transistor 1401, the first light emitting element 103, the second light emitting element 104, the first capacitor 105, and the second capacitor 106.

One of the source and the drain of the selecting transistor 101 is connected to the data line sig and the other electrode thereof is connected to the gate of the first driving transistor 1001 and the gate of the second driving transistor 1002. Further, one of a source and a drain of the erasing transistor 1401 is connected to one electrode of the first capacitor 105 and the other thereof is connected to the erase line gate2. A gate of the erasing transistor 1401 is connected to the erase line gate2. Further, one electrode of the first capacitor 105 is connected to the gate of the first driving transistor 1001 and the other electrode thereof is connected to the first power source line com1. Further, one electrode of the second capacitor 106 is connected to the gate of the second driving transistor 1002 and the other electrode thereof is connected to the second power source line com2.

Figure 14B:
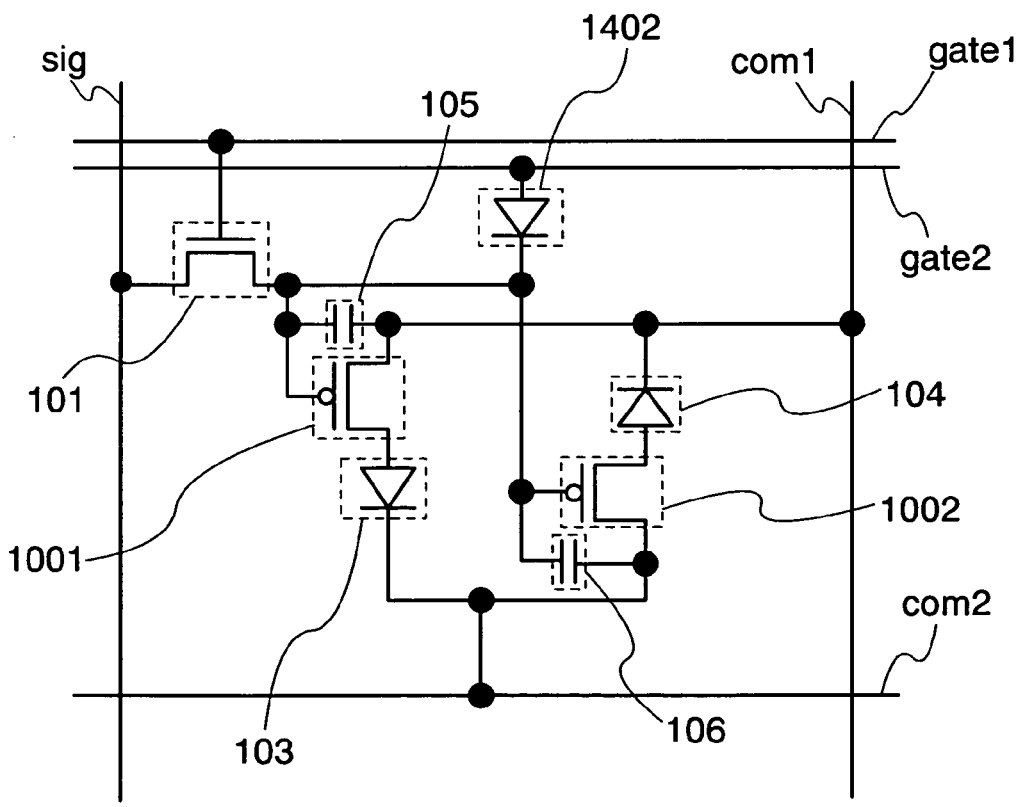

It is to be noted that the erasing transistor 1401 may be an erasing diode 1402 which has a first electrode connected to the erase line gate2 and a second electrode connected to the first capacitor 105 and the second capacitor. FIG. 14B shows a configuration in which the erasing diode 1402 is provided instead of the erasing transistor 1401 of FIG. 14A. In this case, the erasing diode 1402 has a rectifying property in a direction from the first electrode to the second electrode. It is to be noted that the erasing diode may be any element having a rectifying property, such as a PN diode, a PIN diode, a Schottky diode, and a Zener diode.

Further, the first electrode of the first light emitting element 103 is connected to one of the source and the drain of the first driving transistor 1001 and the second electrode of the first light emitting element 103 is connected to the second power source line com2. The first electrode of the second light emitting element 104 is connected to one of the source and the drain of the driving transistor and the second electrode thereof is connected to the first power source line com1. One of the source and the drain of the first driving transistor 1001, which is not connected to the first light emitting element 103 is connected to the first power source line com1. Further, one of the source electrode and the drain electrode of the second driving transistor 1002, which is not connected to the first light emitting element 104 is connected to the power source line com2.

It is to be noted in this embodiment mode that the first light emitting element 103 emits light when a current flows from the first electrode to the second electrode thereof. Further, the second light emitting element 104 emits light when a current flows from the first electrode to the second electrode thereof. Further, it is to be noted that polarity of the first electrode is opposite to that of the second electrode.

It is to be noted that the first capacitor 105 and the second capacitor 106 for holding video signals inputted to gates of the first driving transistor 1001 and the second driving transistor 1002 may be provided between the gates of the first driving transistor 1001 and the second driving transistor 1002 and another wire (a dedicated wire, a gate signal line of a pixel of a preceding stage, and the like). It is to be noted in this embodiment mode that the selecting transistor 101 and the erasing transistor 1401 are N-channel type and the driving transistor 102 is a P-channel type. However, the invention is not limited to this.

Next, description is made in specific on an operating method of the pixel configuration of this embodiment mode shown in FIG. 14A.

FIGS. 15A to 15E is a diagram showing a voltage of each wire and a timing chart when the first light emitting element 103 is selected for light emission in the pixel of this embodiment mode.

Figure 15A:
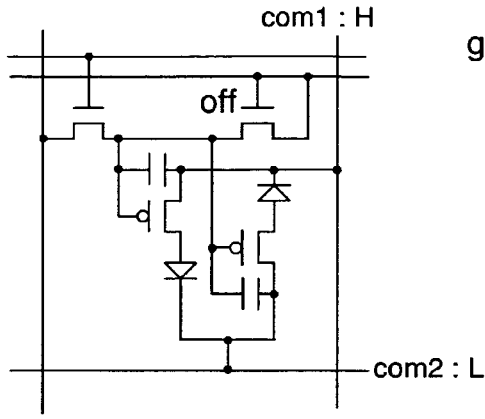
FIGS. 15A to 15E are circuit diagrams showing configurations of Embodiment Mode 3 and timing charts thereof.

Description is made on a state (initial state) of FIG. 15A. A High electrical potential or a Low electrical potential is inputted to the data line sig, an H electrical potential is inputted to the first power source line com1, and an L electrical potential is inputted to the second power source line com2.

Figure 15B:
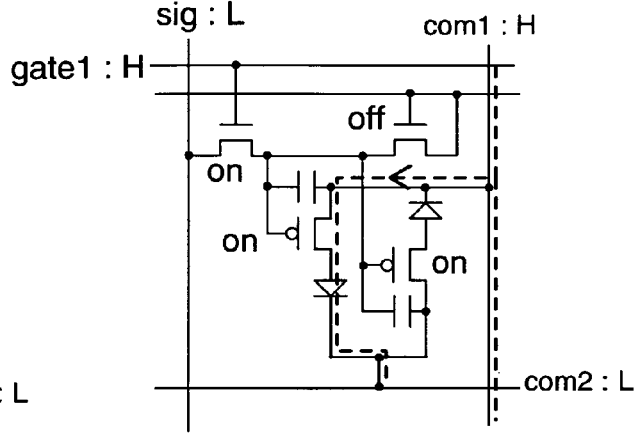

Next, a state of FIG. 15B (a signal input period) starts. Here, the data line sig has an L electrical potential. An H electrical potential is inputted to the scan line gate1 in order to turn on the selecting transistor 101. By turning on the selecting transistor 101, one electrode of each of the first capacitor 105 in pix1 and the second capacitor 106 in pix2 is inputted with an L electrical potential from the data line sig. The other electrode of the first capacitor 105 is inputted with an H electrical potential which is the electrical potential of the first power source line com1, and then a charge is accumulated in the first capacitor 105. Further, the other electrode of the second capacitor 106 is inputted with an L electrical potential from the second power source line com2, thereby electrical potentials applied to the two electrodes of the second capacitor 106 become the same. Thus, a charge is not accumulated in the second capacitor 106.

When an L electrical potential is applied to the gates of the first driving transistor 1001 and the second driving transistor 1002 by the charge accumulated in the first capacitor 105, the first driving transistor 1001 and the second driving transistor 1002 are turned on. At this time, the second power source line is inputted with an L electrical potential. Accordingly, an H electrical potential is applied to the first electrode of the first light emitting element 103 and an L electrical potential is applied to the second electrode of the first light emitting element 103. By a electrical potential difference generated at this time, a current flows in the direction of a dotted arrow shown in FIG. 15B, thereby the first light emitting element 103 emits light. That is, a forward bias voltage is applied to the first light emitting element 103.

Further, by turning on the second driving transistor 1002, the first electrode of the second light emitting element 104 is inputted with an L electrical potential and the second electrode thereof is inputted with an H electrical potential. That is, a reverse bias voltage is applied from the second electrode side to the first electrode side of the second light emitting element 104. Accordingly, uneven charge of the light emitting element can be regularly alleviated. While the first light emitting element 103 emits light, high reliability and long life of the second light emitting element 104 can be achieved.

Figure 15C:
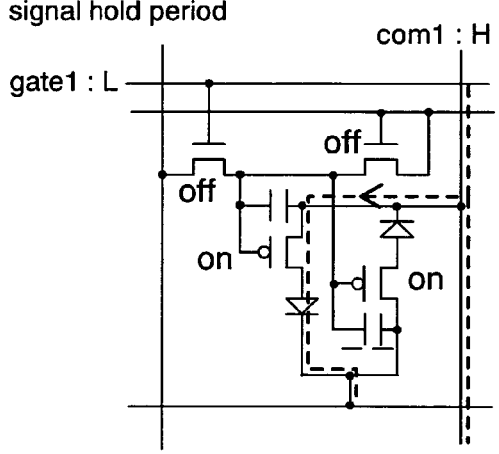

Next, a state of FIG. 15C (a signal hold period) starts. By setting the scan line gate1 at an L electrical potential, the selecting transistor 101 is turned off. The first capacitor 105 holds a voltage to turn on the first driving transistor 1001 and the second driving transistor 1002, thereby the first light emitting element 103 can hold a light emission state.

Figure 15D:
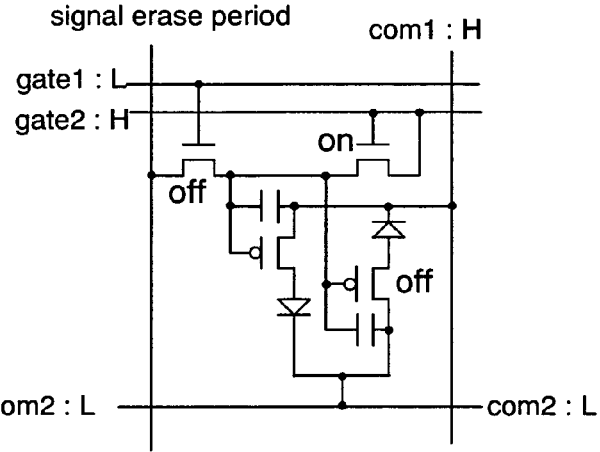

Next, a state of FIG. 15D (a signal erase period) starts. By setting the electrical potential of the erase line gate2 at H, the erasing transistor 1401 is turned on. Then, an H electrical potential is inputted from the erase line gate2 and the charge of an L electrical potential held in the first capacitor 105 is discharged. An H electrical potential is applied from the erase line gate2 to one electrode of the second capacitor and an L electrical potential is applied from the second power source line com2 to the other electrode of the second capacitor 106. Accordingly, a charge is accumulated in the second capacitor 106. By charging the second capacitor 106, H electrical potentials are applied to the gates of the first driving transistor 1001 and the second driving transistor 1002. However, the first driving transistor 1001 and the second driving transistor 1002 are not turned on since they are both P-channel transistors. As a result, the charge held in the first capacitor 105 and the second capacitor 106 for turning on the first driving transistor 1001 and the second driving transistor 1002 can be erased, thereby light emission and non-light emission of the first light emitting element and the second light emitting element can be controlled.

Figure 15E:
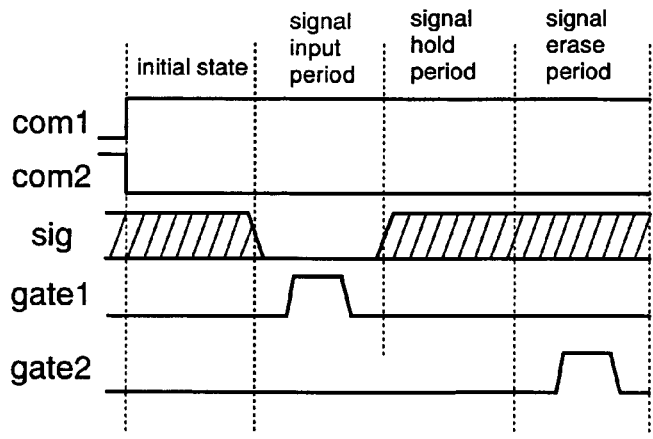

FIG. 15E shows a timing chart of each voltage of the scan line gate1, the erase line gate2, the data line sig, the first power source line com1, and the second power source line com2 in each stage (the initial state, the signal input period, the signal hold period, and the signal erase period) shown in FIGS. 15A to 15D. By controlling the electrical potential of each wire as shown in FIG. 15E, light emission of the light emitting element and an operation to apply a reverse bias voltage can be controlled at the same time. It is to be noted in FIG. 15E that shaded regions of the data line sig are undefined value regions where the electrical potential may be at H or L.

Next, FIGS. 16A to 16E shows a voltage of each wire and a timing chart when the second light emitting element 104 is selected for light emission in the pixel of this embodiment mode.

Figure 16A:
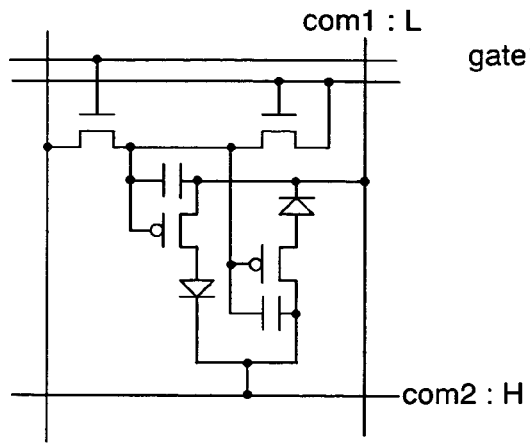
FIGS. 16A to 16D are circuit diagrams showing configurations of Embodiment Mode 3 and FIG. 16E is a timing chart thereof.

Description is made on a state (initial state) of FIG. 16A. The data line sig is inputted with an L electrical potential, the first power source line com1 is inputted with an L electrical potential, and the second power source line com2 is inputted with an H electrical potential.

Figure 16B:
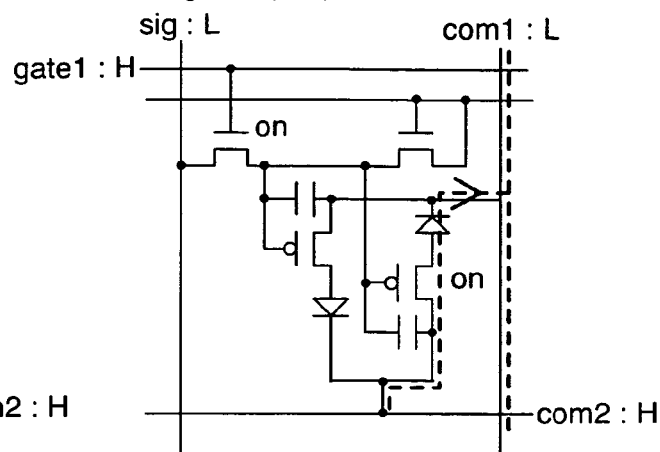

Next, a state of FIG. 16B (a signal input period) starts. An H electrical potential is inputted to the scan line gate in order to turn on the selecting transistor 101. By turning on the selecting transistor 101, one electrode of each of the first capacitor 105 in pix1 and the second capacitor 106 in pix2 is inputted with an L electrical potential. The other electrode of the first capacitor 105 is inputted with an L electrical potential from the first power source line com1, and then electrical potentials applied to the two electrodes of the first capacitor 105 become the same, thereby a charge is not accumulated. Further, the other electrode of the second capacitor 106 is inputted with an H electrical potential which is an electrical potential of the second power source line com2, thereby a charge is accumulated in the second capacitor 106.

When an L electrical potential is applied to the gates of the first driving transistor 1001 and the second driving transistor 1002 by the charge accumulated in the second capacitor 106, the first driving transistor 1001 and the second driving transistor 1002 are turned on. At this time, the first power source line is inputted with an L electrical potential. Accordingly, an H electrical potential is applied to the first electrode of the second light emitting element 104 and an L electrical potential is applied to the second electrode of the second light emitting element 104. By an electrical potential difference generated at this time, a current flows in the direction of a dotted arrow shown in FIG. 16B, thereby the second light emitting element 104 emits light.

Further, the first electrode of the first light emitting element 103 is inputted with an H electrical potential and the second electrode thereof is inputted with an L electrical potential. That is, a reverse bias voltage is applied from the second electrode side to the first electrode side of the first light emitting element 103. Accordingly, uneven charge of the light emitting element can be regularly alleviated. While the light emitting element emits light, high reliability and long life thereof can be achieved.

Figure 16C:
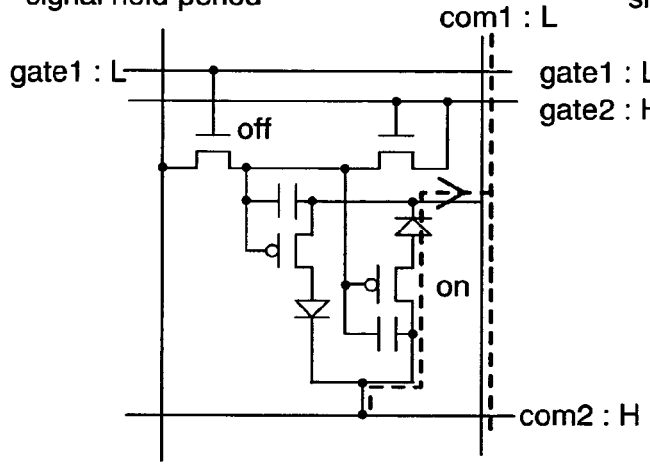

Next, a state of FIG. 16C (a signal hold period) starts. By setting the scan line gate at an L electrical potential, the selecting transistor 101 is turned off. The second capacitor 106 holds a voltage to turn on the first driving transistor 1001 and the second driving transistor 1002, thereby the second light emitting element 104 can hold a light emission state.

Figure 16D:
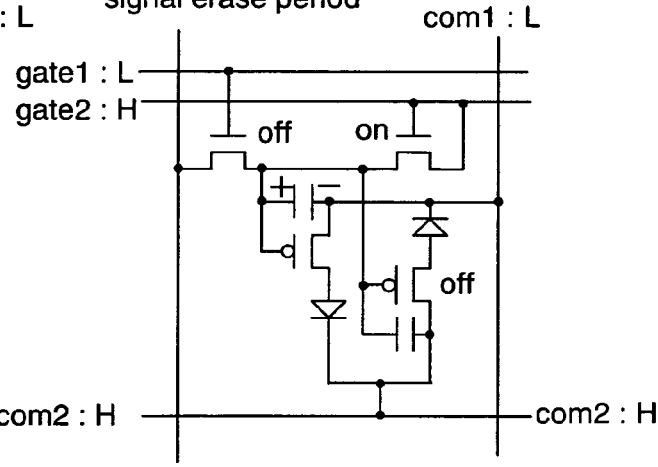

Next, a state of FIG. 16D (a signal erase period) starts. By setting the electrical potential of the erase line gate2 at H, the erasing transistor 1401 is turned on. Then, an H electrical potential is inputted from the erase line gate2, an H electrical potential is inputted to one electrode of the first capacitor 105, and an L electrical potential is inputted from the first power source line com1 to the other electrode of the first capacitor 105, thereby a charge is accumulated in the first capacitor 105. An H electrical potential is applied from the erase line gate2 to one electrode of the second capacitor 106 and an H electrical potential is applied from the second power source line com2 to the other electrode of the second capacitor 106. Accordingly, a charge is not accumulated in the second capacitor 106. By charging the first capacitor 105, H electrical potentials are applied to the gates of the first driving transistor 1001 and the second driving transistor 1002. However, the first driving transistor 1001 and the second driving transistor 1002 are not turned on since they are both P-channel transistors. As a result, the charge held in the first capacitor 105 and the second capacitor 106 for turning on the first driving transistor 1001 and the second driving transistor 1002 can be erased, thereby light emission and non-light emission of the first light emitting element and the second light emitting element can be controlled.

Figure 16E:
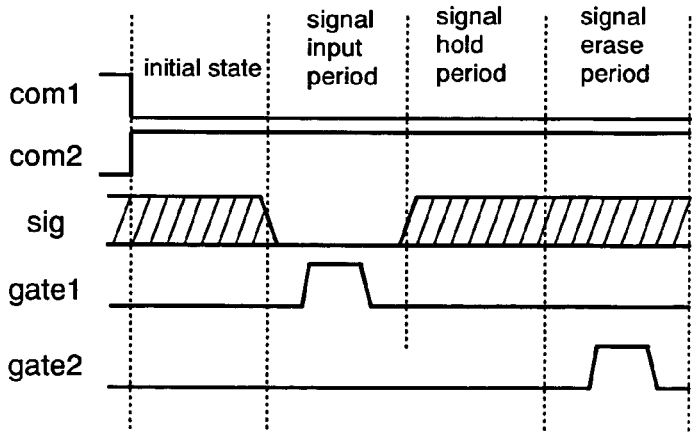

FIG. 16E shows a timing chart of each voltage of the scan line gate1, the erase line gate 2, the data line sig, the first power source line com1, and the second power source line com2 in each stage (the initial state, the signal input period, the signal hold period, and the signal erase period) shown in FIGS. 16A to 16D. By controlling the electrical potential of each wire as shown in FIG. 16E, light emission of the light emitting element and an operation to apply a reverse bias voltage can be controlled at the same time. It is to be noted in FIG. 16E that shaded regions of the data line sig are undefined value regions where the electrical potential may be at H or L.

It is to be noted that this embodiment mode can be freely implemented in combination with other embodiment modes in this specification. Therefore, the number of transistors which form pixels and the number of wires such as the scan lines and the power source lines can be reduced, thereby the aperture ratio can be increased. Thus, a voltage applied to a light emitting element for holding desired luminance can be suppressed and low power consumption can be achieved. Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Further, in a light emitting device of the invention, a visible pseudo contour which is a problem in displaying an image by the time gray scale method can be reduced by employing a method (an interlace method) for sequentially performing light emission of pixels of every other row in an extending direction of the data lines or the scan lines. Further, a visible pseudo contour can be reduced by employing a method (a checker method) for performing light emission of pixels in what is called a check pattern so that pixels emit light which are one pixel aside of the pixels which emit light in the preceding row in the extending direction of the data lines.

Embodiment Mode 4

In this embodiment mode, description is made on an example where an image is displayed when the first pixel and the second pixel in a light emitting device of the invention emit light by a different method than the interlace method described in Embodiment Mode 1.

Figures 17A, 17B:
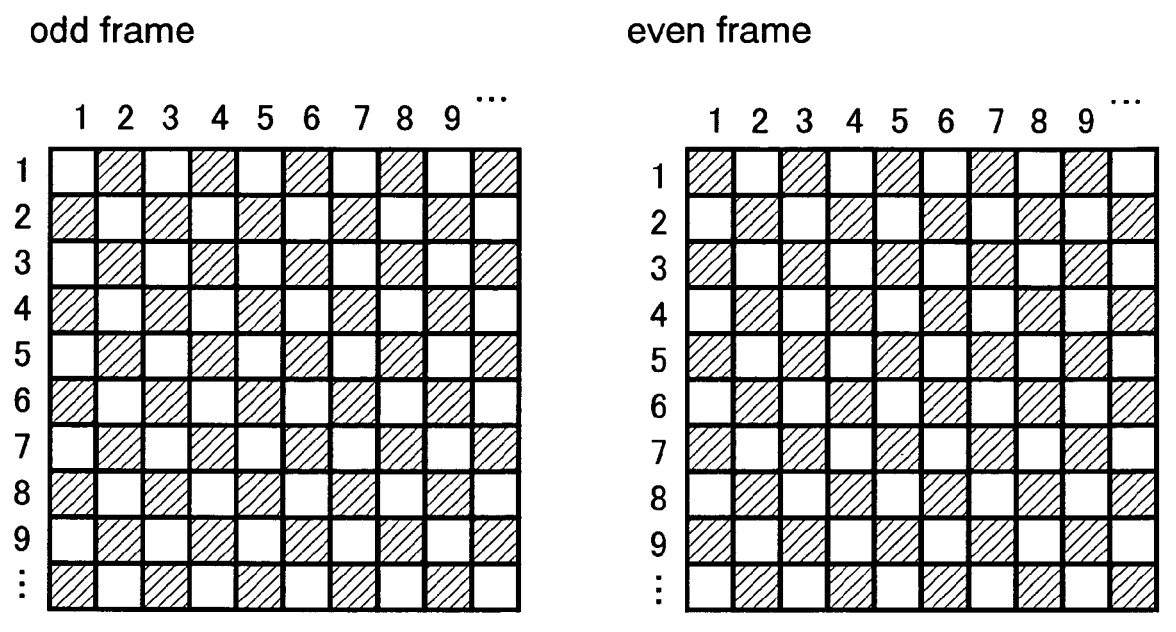

FIGS. 17A and 17B show pixel portions of a light emitting device having semiconductor elements arranged in matrix, in which display pixels are shown in white and non-display pixels are shown in black. In such pixel portions, only pixels in odd rows and odd columns and pixels in even rows and even columns perform display in a first frame (see FIG. 17A) and only pixels in odd rows and even columns and pixels in even rows and odd columns perform display in a second frame (see FIG. 17B). That is, in the pixel portions, display regions and non-display regions are provided in a grid.

It is to be noted in this embodiment mode that the first pixel pix1 is provided in pixels of odd rows and odd columns and pixels of even rows and even columns while the second pixel pix2 is provided in pixels of odd rows and even columns and pixels of even rows and odd columns. It is needless to say that the arrangement of the first pixel pix1 and the second pixel pix2 may be interchanged.

It is to be noted in this embodiment mode that the first frame is referred to as an odd frame and the second frame is referred to as an even frame.

Alternatively, in the pixel portion of this embodiment mode, only pixels of odd rows and even columns, which are the second pixels pix2 and pixels in even rows and odd columns, which are the first pixels pix1 may perform display in the odd frame and only pixels in odd rows and odd columns and pixels in even rows and even columns may perform display in the even frame.

FIGS. 18A and 18B show timing charts for performing such display. FIG. 18A shows a scan line start pulse (GSP), a scan line clock signal (GCK), and an inversion signal (SW) for selecting scan lines in a row direction in the odd frame. Further, a start pulse (SSP) and a start clock signal (SCK) for selecting scan lines in a column direction in odd rows and even rows are shown. Timing of a video signal (DATA) to be written is shown using these signals.

FIG. 18B shows a timing chart in the even frame. The SW signal is inverted to that in FIG. 18A although the other timing are similar to FIG. 18A.

In the odd frames, pixels in the odd rows are selected when the SW signal is High and pixels in the even rows are selected when the SW signal is Low. In the even frames, pixels in the even rows are selected when the SW signal is High and pixels in the odd rows are selected when the SW signal is High.

The video signal (DATA) is inputted to a selected pixel after the SSP signal is inputted. It is to be noted that the selected pixel is a pixel including a semiconductor element connected to a selected scan line.

As described above, pixels sequentially emit light per two pixels in each row. In the next row, pixels emit light which are one pixel aside of the pixels which emit light in the preceding row in the extending direction of the data lines. That is, light emission and non-light emission of the pixels can be selected in what is called a check pattern.

With the configuration of this embodiment mode, generation of a stripe pattern and a pseudo contour can be reduced as compared to the interlace method in the light emitting device which is driven by the time division gray scale method.

It is preferable to employ the pixel configuration of a light emitting device of the invention in which the number of transistors is reduced and the aperture ratio is increased since an effect of the invention can be increased by expressing a gray scale by the checker method of this embodiment mode.

It is to be noted that luminance may decrease when the checker method is employed. By using an organic material for a light emitting element of a matrix light emitting device, however, luminance of the light emitting element decreases exponentially. Therefore, an increase in supplied voltage in accordance with the decrease in luminance is not a big problem. That is, the checker method is infinitely preferable to the light emitting device of the invention, which includes a light emitting element having an organic material.

It is to be noted that this embodiment mode can be freely implemented in combination with other embodiment modes in this specification. That is, the number of transistors which form pixels and the number of wires such as the scan lines and the power source lines can be reduced, thereby the aperture ratio can be increased. Thus, a voltage applied to a light emitting element for holding desired luminance can be suppressed and low power consumption can be achieved. Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Embodiment Mode 5

Figure 19A:
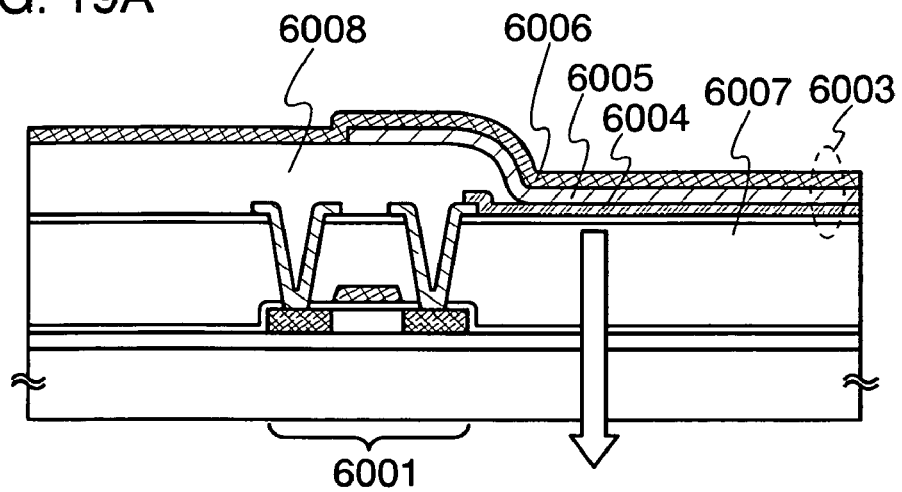
FIGS. 19A to 19C are configuration diagrams of Embodiment Mode 5.
Figure 19B:
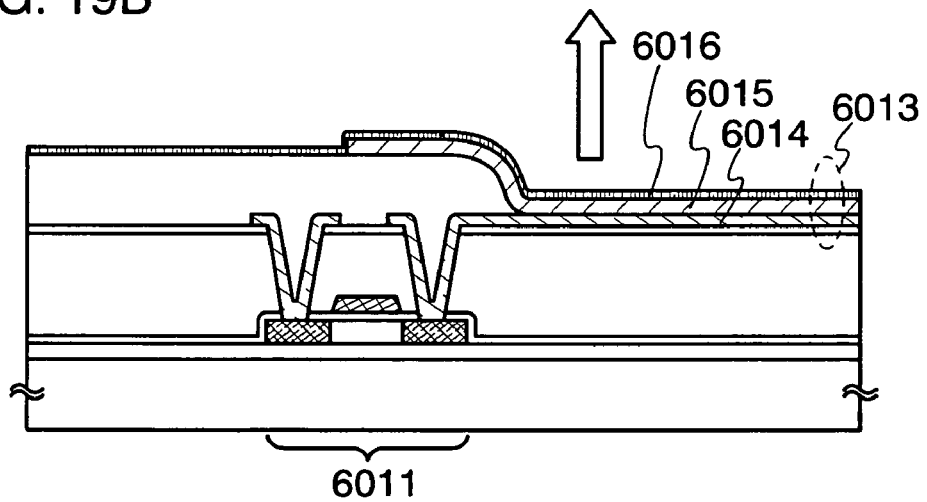
Figure 19C:
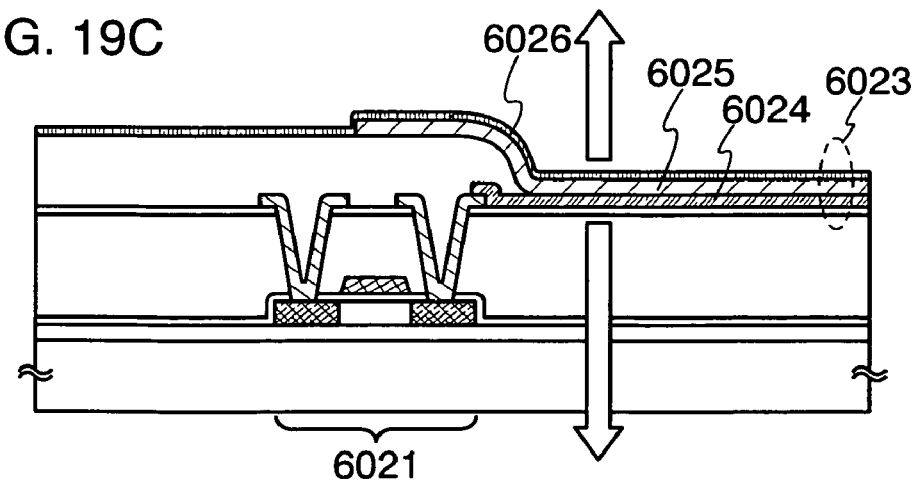

In this embodiment mode, description is made on a cross sectional structure of a pixel including a light emitting element. Description is made with reference to FIGS. 19A to 19C on a cross sectional structure of a pixel in the case where a transistor which controls a current supply to the light emitting element is a P-type thin film transistor (TFT) as described above. It is to be noted in this embodiment mode that one of an anode and a cathode included in the light emitting element, which has a electrical potential controlled by a transistor, is a first electrode while the other is a second electrode. In FIGS. 19A to 19C, the first electrode is an anode and the second electrode is a cathode, however, the first electrode may be a cathode and the second electrode may be an anode.

FIG. 19A shows a cross sectional view of a pixel in the case where a TFT 6001 is a P-type transistor and light emitted from a light emitting element 6003 is extracted from a first electrode 6004 side. In FIG. 19A, the first electrode 6004 of the light emitting element 6003 and the TFT 6001 are electrically connected.

The TFT 6001 is covered with an interlayer insulating film 6007 over which a partition 6008 having an aperture is formed. A portion of the first electrode 6004 is exposed in the aperture of the partition 6008, and the first electrode 6004, an electroluminescent layer 6005, and a second electrode 6006 are sequentially stacked in the aperture.

The interlayer insulating film 6007 can be formed using an organic resin film, an inorganic insulating film, or an insulating film containing a Si—O—Si bond formed of a siloxane-based material as a starting material (hereinafter referred to as a siloxane-based insulating film). The siloxane-based insulating film contains hydrogen as a substituent and may additionally contain at least one of fluoride, an alkyl group, and aromatic hydrocarbon. The interlayer insulating film 6007 may be formed of a material called a low dielectric constant material (low-k material).

The partition 6008 may be formed of an organic resin film, an inorganic insulating film, or a siloxane-based insulating film. The organic resin film may be formed of acryl, polyimide, polyamide and the like, and the inorganic insulating film may be formed of silicon oxide, silicon nitride oxide and the like. In particular, when the partition 6008 is formed of a photosensitive organic resin film and an aperture is formed over the first electrode 6004 so as to have the side face having a slope with a continuous curvature, it can be prevented that the first electrode 6004 and the second electrode 6006 are connected.

The first electrode 6004 is formed of a material or with a thickness to transmit light, which is also suitable as an anode. For example, the first electrode 6004 can be formed of indium tin oxide (ITO), zinc oxide (ZnO), indium zinc oxide (IZO), gallium-doped zinc oxide (GZO), or other light transmissive conductive oxide materials. Alternatively, the first electrode 6004 may be formed of ITO, indium tin oxide containing silicon oxide (hereinafter referred to as ITSO), or a mixture of indium oxide containing silicon oxide with zinc oxide (ZnO) of 2 to 20%. Further, in addition to the aforementioned light transmissive conductive oxide materials, the first electrode 6004 may be formed of, for example, a single-layer film of one or more of TiN, ZrN, Ti, W, Ni, Pt, Cr, Ag, Al and the like, a laminated layer of a titanium nitride film and a film containing aluminum as a main component, or a three-layer structure of a titanium nitride film, a film containing aluminum as a main component and a titanium nitride film. However, when adopting a material other than the light transmitting conductive oxide materials, the first electrode 6004 is formed thin enough to transmit light (preferably about 5 to 30 nm).

The second electrode 6006 is formed of a material or with a thickness to reflect or shield light. For example, metals, alloys, electrically conductive compounds or mixtures of them each having a low work function can be used. Specifically, alkaline metals such as Li and Cs, alkaline earth metals such as Mg, Ca and Sr, alloys containing such metals (Mg:Ag, Al:Li, Mg:In or the like), compounds of such metals (calcium fluoride such as $CaF_2$ or calcium nitride such as $Ca_3N_2$), or rare-earth metals such as Yb and Er can be employed. When providing an electron injection layer, other conductive layers such as an Al layer can be employed as well.

The electroluminescent layer 6005 is formed of a single layer or a plurality of layers. In the case of a plurality of layers, these layers may be classified into a hole injection layer, a hole transporting layer, a light emitting layer, an electron transporting layer, an electron injection layer and the like in terms of carrier transporting properties. When the electroluminescent layer 6005 has, in addition to the light emitting layer, any of the hole injection layer, the hole transporting layer, the electron transporting layer and the electron injection layer, then the hole injection layer, the hole transporting layer, the light emitting layer, the electron transporting layer and the electron injection layer are stacked in this order over the first electrode 6004. Note that the boundary between each layer is not necessarily distinct, and the boundary can not be distinguished clearly in some cases since the materials forming the layers are partially mixed into the adjacent layers. Each of the layers may be formed of an organic material or an inorganic material. As for the organic material, either of a high, medium or low molecular weight material can be employed. Note that the medium molecular weight material is a low polymer in which the number of repeated structural units (the degree of polymerization) is about 2 to 20. There is no clear distinction between the hole injection layer and the hole transporting layer, and both of them have a hole transporting property (hole mobility) as a major property. The hole injection layer is in contact with the anode, and a layer in contact with the hole injection layer is distinguished as a hole transporting layer for convenience. The same applies to the electron transporting layer and the electron injection layer. A layer in contact with the cathode is called an electron injection layer while a layer in contact with the electron injection layer is called an electron transporting layer. The light emitting layer may also function as the electron transporting layer in some cases, and it is therefore called a light emitting electron transporting layer.

In the case of the pixel shown in FIG. 19A, light emitted from the light emitting element 6003 may be extracted from the first electrode 6004 side as shown by a hollow arrow.

FIG. 19B illustrates a cross-sectional view of a pixel in the case where a TFT 6011 is a P-channel transistor and light emitted from a light emitting element 6013 is extracted from a second electrode 6016 side. FIG. 19B shows the structure in which a first electrode 6014 of the light emitting element 6013 is electrically connected to the TFT 6011. Over the first electrode 6014, an electroluminescent layer 6015 and the second electrode 6016 are stacked in this order.

The first electrode 6014 is formed of a material or with a thickness to reflect or shield light, which is also suitable as an anode. For example, the first electrode 6014 may be formed of, a single-layer of one or more of TiN, ZrN, Ti, W, Ni, Pt, Cr, Ag, Al and the like, a stacked layer of a titanium nitride film and a film containing aluminum as a main component, or a three-layer structure of a titanium nitride film, a film containing aluminum as a main component and a titanium nitride film.

The second electrode 6016 is formed of a material or with a thickness to transmit light. For example, metals, alloys, electrically conductive compounds or mixtures of them each having a low work function can be used. Specifically, alkaline metals such as Li and Cs, alkaline earth metals such as Mg, Ca and Sr, alloys containing such metals (Mg:Ag, Al:Li, Mg:In or the like), compounds of such metals (calcium fluoride such as $CaF_2$ or calcium nitride such as $Ca_3N_2$), or rare-earth metals such as Yb and Er can be employed. When providing an electron injection layer, other conductive layers such as an Al layer can be employed as well. The second electrode 6016 is formed thin enough to transmit light (preferably about 5 to 30 nm). Note that the second electrode 6016 may be formed of indium tin oxide (ITO), zinc oxide (ZnO), indium zinc oxide (IZO), gallium-doped zinc oxide (GZO), or other light transmissive conductive oxide materials. Alternatively, the second electrode 6016 may be formed of a mixture of ITO, ITSO or indium oxide containing silicon oxide with zinc oxide (ZnO) of 2 to 20%. When adopting such light transmissive conductive oxide materials, the electroluminescent layer 6015 is preferably provided with an electron injection layer.

The electroluminescent layer 6015 can be formed similarly to the electroluminescent layer 6005 shown in FIG. 19A.

In the case of the pixel shown in FIG. 19B, light emitted from the light emitting element 6013 can be extracted from the second electrode 6016 side as shown by a hollow arrow.

FIG. 19C illustrates a cross-sectional view of a pixel in the case where a TFT 6021 is a P-channel transistors, and light emitted from a light emitting element 6023 is extracted from both sides of a first electrode 6024 and a second electrode 6026. FIG. 19C illustrates the structure in which the first electrode 6024 of the light emitting element 6023 is electrically connected to the TFT 6021. Over the first electrode 6024, an electroluminescent layer 6025 and a second electrode 6026 are stacked in this order.

The first electrode 6024 may be formed similarly to the first electrode 6004 shown in FIG. 19A. The second electrode 6026 may be formed similarly to the second electrode 6016 shown in FIG. 19B. In addition, the electroluminescent layer 6025 may be formed similarly to the electroluminescent layer 6005 shown in FIG. 19A.

In the case of the pixel shown in FIG. 19C, light emitted from the light emitting element 6023 can be extracted from both sides of the first electrode 6024 and the second electrode 6026 as shown by hollow arrows.

It is to be noted that this embodiment mode can be freely implemented in combination with other embodiment modes in this specification. That is, the number of transistors which form pixels and the number of wires such as the scan lines and the power source lines can be reduced, thereby the aperture ratio can be increased. Thus, a voltage applied to a light emitting element for holding desired luminance can be suppressed and low power consumption can be achieved. Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Further, in a light emitting device of the invention, a visible pseudo contour which is a problem in displaying an image by the time gray scale method can be reduced by employing a method (an interlace method) for sequentially performing light emission of pixels of every other row in an extending direction of the data lines or the scan lines. Further, a visible pseudo contour can be reduced by employing a method (a checker method) for performing light emission of pixels in what is called a check pattern so that pixels emit light which are one pixel aside of the pixels which emit light in the preceding row in the extending direction of the data lines.

Embodiment Mode 6

Figure 20A:
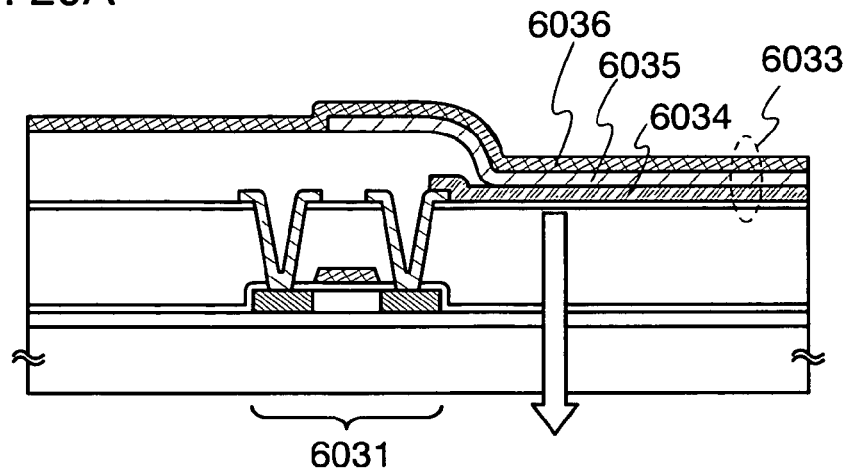
FIGS. 20A to 20C are configuration diagrams of Embodiment Mode 6.
Figure 20B:
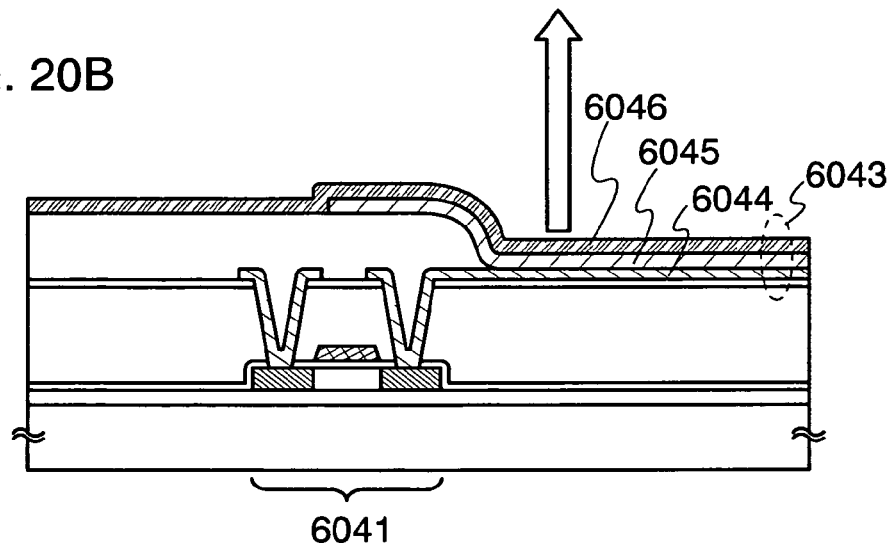
Figure 20C:
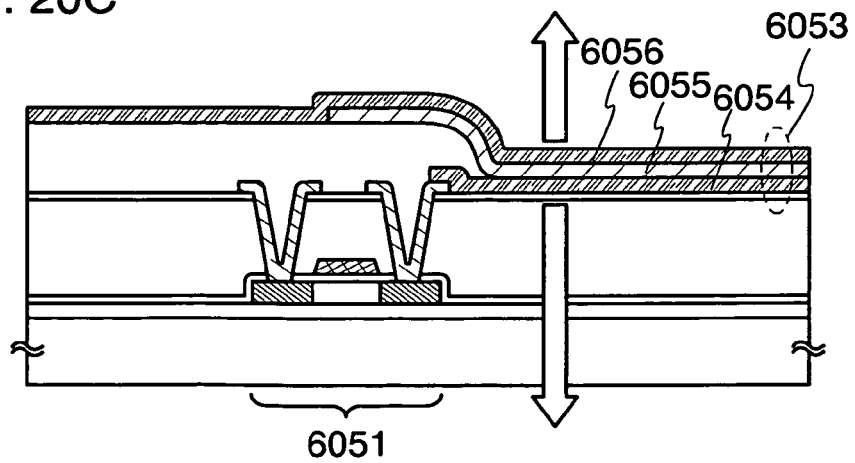

In this embodiment mode, description is made with reference to FIGS. 20A to 20C on the cross-sectional structure of a pixel in the case where a transistor which controls a current supply to a light emitting element is an N-channel transistor. Although FIGS. 20A to 20C each illustrates the case where the first electrode is a cathode while the second electrode is an anode, the first electrode may be an anode and the second electrode may be a cathode.

FIG. 20A illustrates a cross-sectional view of a pixel in the case where a TFT 6031 is an N-channel transistor and light emitted from a light emitting element 6033 is extracted from a first electrode 6034 side. FIG. 20A illustrates the structure in which the first electrode 6034 of the light emitting element 6033 is electrically connected to the TFT 6031. Over the first electrode 6034, an electroluminescent layer 6035 and a second electrode 6036 are stacked in this order.

The second electrode 6016 is formed of a material or with a thickness to transmit light. For example, metals, alloys, electrically conductive compounds or mixtures of them each having a low work function can be used. Specifically, alkaline metals such as Li and Cs, alkaline earth metals such as Mg, Ca and Sr, alloys containing such metals (Mg:Ag, Al:Li, Mg:In or the like), compounds of such metals (calcium fluoride such as $CaF_2$ or calcium nitride such as $Ca_3N_2$), or rare-earth metals such as Yb and Er can be employed. When providing an electron injection layer, other conductive layers such as an Al layer can be employed as well. The second electrode 6016 is formed thin enough to transmit light (preferably about 5 to 30 nm). Note that the second electrode 6016 may be formed of indium tin oxide (ITO), zinc oxide (ZnO), indium zinc oxide (IZO), gallium-doped zinc oxide (GZO), or other light transmissive conductive oxide materials. Alternatively, the second electrode 6016 may be formed of a mixture of ITO, ITSO or indium oxide containing silicon oxide with zinc oxide (ZnO) of 2 to 20%. When adopting such light transmissive conductive oxide materials, the electroluminescent layer 6015 is preferably provided with an electron injection layer.

The second electrode 6036 is formed of a material or with a thickness to reflect or shield light, which is also suitable as an anode. For example, the second electrode 6036 may be formed of a single-layer structure of one or more of TiN, ZrN, Ti, W, Ni, Pt, Cr, Ag, Al and the like, a two-layer structure of a titanium nitride film and a film containing aluminum as a main component, or a three-layer structure of a titanium nitride film, a film containing aluminum as a main component, and a titanium nitride film.

The electroluminescent layer 6035 can be formed similarly to the electroluminescent layer 6005 shown in FIG. 20A. However, when the electroluminescent layer 6035 has, in addition to the light emitting layer, any of a hole injection layer, a hole transporting layer, an electron transporting layer and an electron injection layer, the electron injection layer, the electron transporting layer, the light emitting layer, the hole transporting layer and the hole injection layer are stacked in this order over the first electrode 6034.

In the pixel shown in FIG. 20A, light emitted from the light emitting element 6033 can be extracted from the first electrode 6034 side as shown by a hollow arrow.

FIG. 20B illustrates a cross-sectional view of a pixel in the case where a TFT 6041 is an N-channel transistor and light emitted from a light emitting element 6043 is extracted from a second electrode 6046 side. Although FIG. 20B shows the structure in which a first electrode 6044 of the light emitting element 6043 is electrically connected to the 6041. Over the first electrode 6044, an electroluminescent layer 6045 and the second electrode 6046 are stacked in this order.

The first electrode 6044 is formed of a material or with a thickness to reflect or shield light. For example, metals, alloys, electrically conductive compounds or mixture of them each having a low work function can be used. Specifically, alkaline metals such as Li and Cs, alkaline earth metals such as Mg, Ca and Sr, alloys containing such metals (Mg:Ag, Al:Li, Mg:In or the like), compounds of such metals (calcium fluoride such as $CaF_2$ or calcium nitride such as $Ca_3N_2$), or rare-earth metals such as Yb and Er can be employed. When providing an electron injection layer, other conductive layers such as an Al layer can be employed as well.

The second electrode 6046 is formed of a material or with a thickness to transmit light, which is also suitable as an anode. For example, the second electrode 6046 may be formed of indium tin oxide (ITO), zinc oxide (ZnO), indium zinc oxide (IZO), gallium-doped zinc oxide (GZO), or other light transmissive conductive oxides. Alternatively, the second electrode 6046 may be formed of a mixture of ITO, ITSO or indium oxide containing silicon oxide with zinc oxide (ZnO) of 2 to 20%. Further, in addition to the aforementioned light transmissive conductive oxide materials, the second electrode 6046 may be formed of, for example, a single-layer structure of one or more of TiN, ZrN, Ti, W, Ni, Pt, Cr, Ag, Al and the like, a two-layer structure of a titanium nitride film and a film containing aluminum as a main component, or a three-layer structure of a titanium nitride film, a film containing aluminum as a main component and a titanium nitride film. However, when adopting a material other than the light transmissive conductive oxide materials, the second electrode 6046 is formed thin enough to transmit light (preferably about 5 to 30 nm).

The electroluminescent layer 6045 can be formed similarly to the electroluminescent layer 6035 shown in FIG. 20A.

In the case of the pixel shown in FIG. 20B, light emitted from the light emitting element 6043 can be extracted from the second electrode 6046 side as shown by a hollow arrow.

FIG. 20C illustrates a cross-sectional view of a pixel in the case where a TFT 6051 is an N-channel transistors, and light emitted from a light emitting element 6053 is extracted from both sides of a first electrode 6054 and a second electrode 6056. FIG. 20C illustrates the structure in which the first electrode 6054 of the light emitting element 6053 is electrically connected to the TFT 6051. Over the first electrode 6054, an electroluminescent layer 6055 and a second electrode 6056 are stacked in this order.

The first electrode 6054 may be formed similarly to the first electrode 6034 shown in FIG. 20A. The second electrode 6056 may be formed similarly to the second electrode 6046 shown in FIG. 20B. In addition, the electroluminescent layer 6055 may be formed similarly to the electroluminescent layer 6035 shown in FIG. 20A.

In the case of the pixel shown in FIG. 20C, light emitted from the light emitting element 6053 can be extracted from both sides of the first electrode 6054 and the second electrode 6056 as shown by hollow arrows.

It is to be noted that this embodiment mode can be freely implemented in combination with other embodiment modes in this specification. That is, the number of transistors which form pixels and the number of wires such as the scan lines and the power source lines can be reduced, thereby the aperture ratio can be increased. Thus, a voltage applied to a light emitting element for holding desired luminance can be suppressed and low power consumption can be achieved. Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Further, in a light emitting device of the invention, a visible pseudo contour which is a problem in displaying an image by the time gray scale method can be reduced by employing a method (an interlace method) for sequentially performing light emission of pixels of every other row in an extending direction of the data lines or the scan lines. Further, a visible pseudo contour can be reduced by employing a method (a checker method) for performing light emission of pixels in what is called a check pattern so that pixels emit light which are one pixel aside of the pixels which emit light in the preceding row in the extending direction of the data lines.

Embodiment Mode 7

Figure 21A:
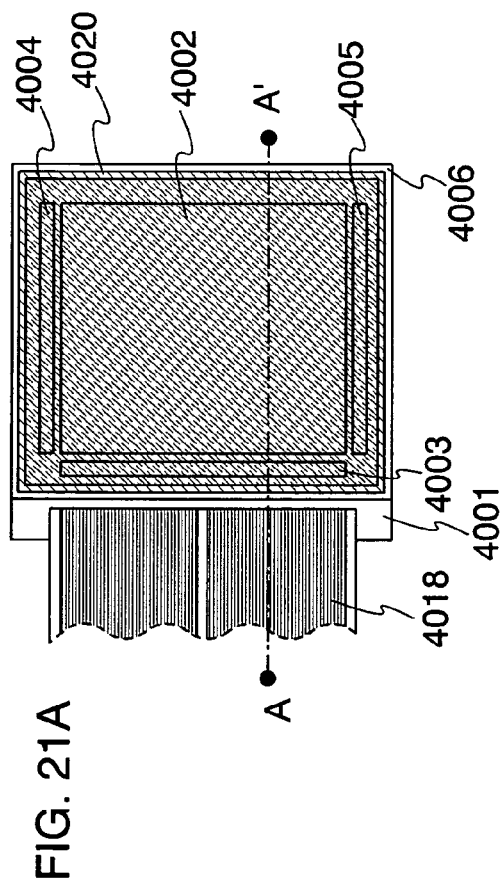
FIGS. 21A and 21B are a perpendicular view and a cross sectional view of an EL module of Embodiment Mode 7 respectively.
Figure 21B:
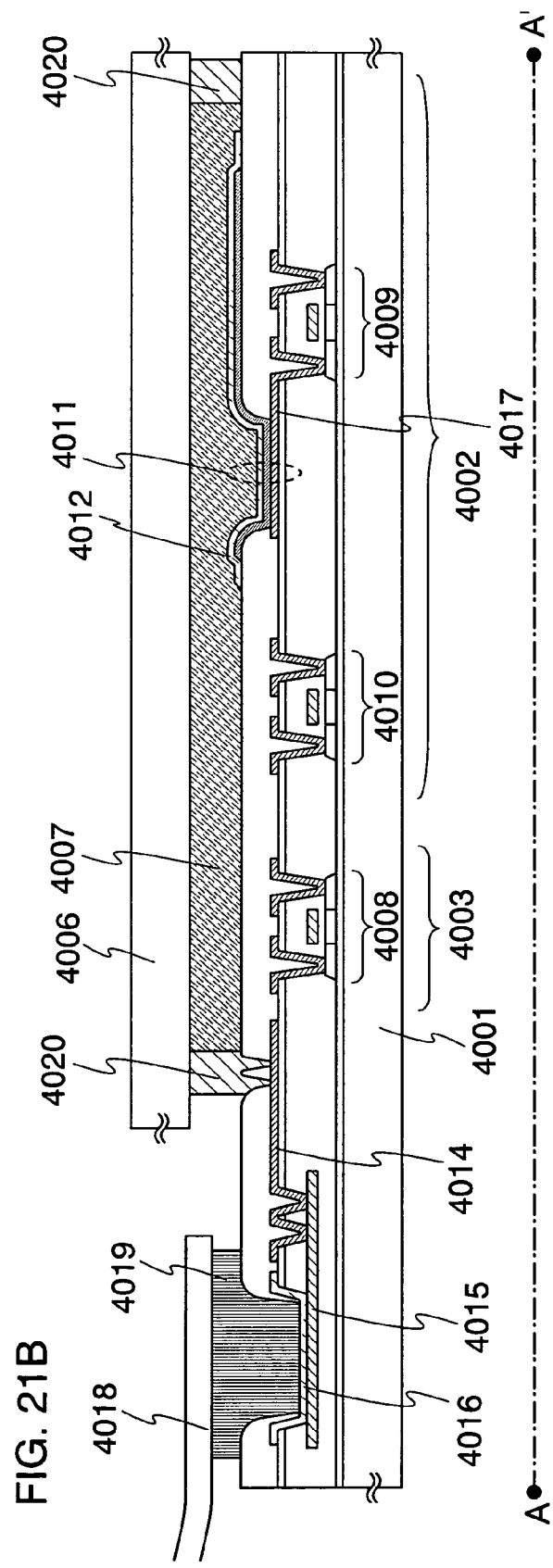

In this embodiment mode, description is made with reference to FIGS. 21A and 21B on an exterior view of a panel which corresponds to one mode of the light emitting device of the invention. FIG. 21A illustrates a top plan view of a panel obtained by sealing transistors and light emitting elements between a first substrate and a second substrate with a sealant. FIG. 21B illustrates a cross-sectional view along a line A-A' of FIG. 21A.

A sealant 4020 is provided so as to surround a pixel portion 4002, a signal line driver circuit 4003, a first scan line driver circuit 4004, and a second scan line driver circuit 4005 formed over a first substrate 4001. In addition, a second substrate 4006 is provided over the pixel portion 4002, the signal line driver circuit 4003, the first scan line driver circuit 4004 and the second scan line driver circuit 4005. Accordingly, the pixel portion 4002, the signal line driver circuit 4003, the first scan line driver circuit 4004 and the second scan line driver circuit 4005 are tightly sealed up with a filler 4007 by the first substrate 4001, the sealant 4020 and the second substrate 4006.

Each of the pixel portion 4002, the signal line driver circuit 4003, the first scan line driver circuit 4004 and the second scan line driver circuit 4005 which are formed over the first substrate 4001 has a plurality of transistors. FIG. 21B illustrates a transistor 4008 included in the signal line driver circuit 4003, and a driving transistor 4009 and a switching transistor 4010 included in the pixel portion 4002.

Reference numeral 4011 corresponds to a light emitting element, and a portion of a wire 4007 connected to a drain of the driving transistor 4009 functions as a first electrode of the light emitting element 4011. Further, a light transmissive conductive film functions as a second electrode 4012 of the light emitting element 4011. Note that the structure of the light emitting element 4011 is not limited to the one shown in this embodiment mode. The structure of the light emitting element 4011 can be appropriately changed in accordance with the direction of light extracted from the light emitting element 4011 and the conductivity of the driving transistor 4009.

Various signals and electrical potentials supplied to the signal line driver circuit 4003, the first scan line driver circuit 4004, the second scan line driver circuit 4005, or the pixel portion 4002 are not shown in the cross-sectional view in FIG. 21B, however, they are supplied from a connecting terminal 4016 through lead wires 4014 and 4015.

In this embodiment mode, the connecting terminal 4016 is formed of the same conductive film as the second electrode 4012 of the light emitting element 4011. The lead wire 4014 is formed of the same conductive film as the wire 4017. The lead wire 4015 is formed of the same conductive film as the respective gates of the driving transistor 4009, the switching transistor 4009, and the transistor 4008.

The connecting terminal 4016 is electrically connected to a terminal of an FPC 4018 through an anisotropic conductive film 4019.

Note that each of the first substrate 4001 and the second substrate 4006 may be formed of glass, metal (typically, stainless), ceramics, plastics and the like. As for the plastic, an FRP (Fiberglass-Reinforced Plastics) substrate, an PVF (Polyvinylfluoride) film, a mylar film, a polyester film or an acrylic resin film can be employed. In addition, a sheet having a structure that an aluminum foil is sandwiched between a PVF films or mylar films can be employed.

Note that the second substrate 4006 is required to transmit light since it is disposed on the side from which light emitted from the light emitting element 4011 is extracted. In this case, light transmissive materials are employed such as a glass substrate, a plastic substrate, a polyester film or an acrylic film.

As for the filler 4007, inert gas such as a nitrogen gas and an argon gas, an ultraviolet curable resin or a heat curable resin can be used as well as PVC (polyvinyl chloride), acrylic, polyimide, an epoxy resin, a silicone resin, PVB (polyvinyl butyral) or EVA (ethylene vinyl acetate). In this embodiment mode, a nitrogen gas is employed as the filler.

As for driver circuits provided on the periphery, a first scan line driver circuit 4004, a second scan line driver circuit 4005, and a signal line driver circuit 4003 are connected to a pixel portion through a gate wire and a source wire.

Further, a panel in which a pixel portion having a light emitting element is formed and a module in which an IC is mounted on the panel are included in a category of a light emitting device of the invention.

In a panel and a module with such a configuration as that of this embodiment mode, reliability of a light emitting element can be improved by reducing the number of thin film transistors which form pixels in a display portion and regularly applying a reverse bias voltage to a light emitting element. As the number of thin film transistors and wires which form pixels in the display portion can be reduced, an increase in the aperture ratio of the pixel portion can be expected, which contributes to the reduction in power consumption. Further, a panel and a module can be obtained which can reduce the layout area of a driver circuit portion in the periphery of the pixel portion.

It is to be noted that this embodiment mode can be freely implemented in combination with other embodiment modes in this specification. That is, the number of transistors which form pixels and the number of wires such as the scan lines and the power source lines can be reduced, thereby the aperture ratio can be increased. Thus, a voltage applied to a light emitting element for holding desired luminance can be suppressed and low power consumption can be achieved. Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Further, in a light emitting device of the invention, a visible pseudo contour which is a problem in displaying an image by the time gray scale method can be reduced by employing a method (an interlace method) for sequentially performing light emission of pixels of every other row in an extending direction of the data lines or the scan lines. Further, a visible pseudo contour can be reduced by employing a method (a checker method) for performing light emission of pixels in what is called a check pattern so that pixels emit light which are one pixel aside of the pixels which emit light in the preceding row in the extending direction of the data lines.

Embodiment Mode 8

In this embodiment mode, an example of manufacturing an active matrix display device having a channel etch type TFT as a switching element is described with reference to the drawings.

Figure 30A:
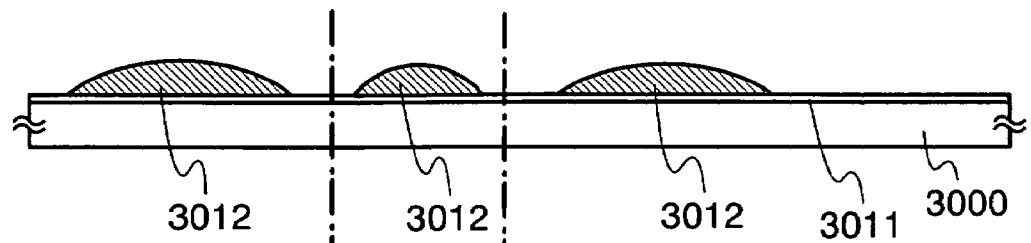
FIGS. 30A to 30E are cross sectional views showing Embodiment Mode 8.

As shown in FIG. 30A, a base layer 3011 is formed for improving adhesion of a substrate 3000 and a material layer which is formed later thereover by a droplet discharge method. The base layer 3011 does not necessarily have a stacked-layer structure as long as it is formed quite thin. The base layer 3011 is formed by forming a photocatalytic substance (titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$)) over the entire surface of the substrate 3000 by a spraying or sputtering method. Alternatively, an organic material (a coating insulating film formed by using polyimide, acrylic, or a material which has a skeleton structure of a Si—O bond and has at least one of hydrogen, fluoride, an alkyl group, or aromatic carbon hydride as a substituent) may be selectively formed by an ink-jetting or sol-gel method. This can be regarded as pretreatment of the base layer as well.

An example of providing the pretreatment of the base layer for improving adhesion between a discharged conductive material and a substrate has been described. In the case of forming a material layer (for example, an organic layer, an inorganic layer, or a metal layer), or further forming a material layer (for example, an organic layer, an inorganic layer, or a metal layer) on the discharged conductive layer by a droplet discharge method, $TiO_x$ deposition treatment may be performed for improving adhesion between the material layers. That is to say, when discharging and drawing a conductive material by a droplet discharge method, it is preferable to provide a pretreatment of the base layer for the top and bottom interfaces of the conductive material layer for improving adhesion thereof.

The material of the base layer 3011 is not limited to a photocatalytic material, and it can be formed of a 3d transition metal (Sc, Ti, Cr, Ni, V, Mn, Fe, Co, Cu, Zn, and the like), or an oxide, a nitride, or an oxynitride thereof.

It is to be noted that the substrate 3000 may be a non-alkaline glass substrate formed by a fusing method or a floating method, such as a barium borosilicate glass, an aluminoborosilicate glass, and an aluminosilicate glass as well as a plastic substrate and the like having heat resistance against a processing temperature of this manufacturing step.

Next, a conductive film pattern 3012 is formed by discharging a liquid conductive material by a droplet discharge method represented by an ink-jetting method (see FIG. 30A). As a conductive material contained in the liquid conductive material, gold (Au), silver (Ag), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti), or aluminum (Al), or an alloy thereof, dispersive nanoparticles of these, or micro particles of halogenated silver are used. In particular, it is preferable that a gate wire have low resistance, therefore, gold, silver, or copper dissolved or dispersed in solvent is preferably used in consideration of resistivity. More preferably, low resistant silver or copper is used. In the case of using silver or copper, however, a barrier film is preferably provided in combination for preventing impurities from dispersing. For the solvent, esters such as butyl acetate, alcohols such as isopropyl alcohol, an organic solvent such as acetone and the like are used. The surface tension and viscosity are appropriately controlled by controlling the concentration of a solvent, adding surfactant, or the like.

Figure 31:
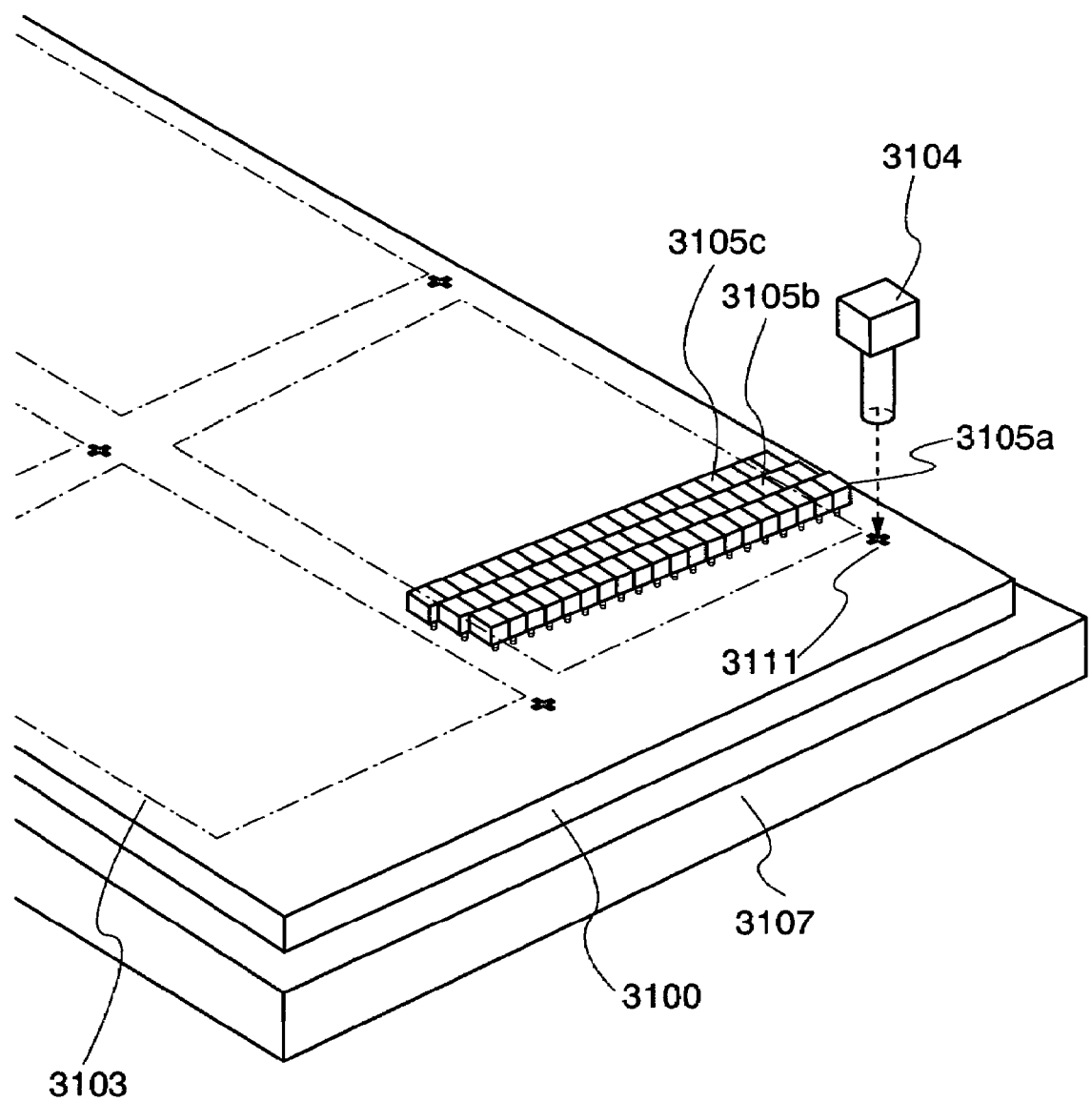
FIG. 31 is a schematic view showing Embodiment Mode 8.

FIG. 31 shows an example of a droplet discharge apparatus. In FIG. 31, reference numeral 3100 denotes a large substrate, 3104 denotes an image pick-up unit, 3107 denotes a stage, 3111 denotes a marker, and 3103 denotes a region for one panel. Heads 3105a, 3105b, and 3105c each of which has the same width as the width of one panel are provided, which are scanned in zigzag or back and forth while moving the stage to form a pattern of a material layer appropriately. A head having the same width as that of the large substrate can be used as well, however, the head of a panel size as shown in FIG. 31 is easy to operate. In order to improve throughput, it is preferable to discharge a material while the stage is moving.

Moreover, it is preferable that each of the heads 3105a, 3105b, and 3105c and the stage 3107 have a temperature control function. Note that the distance between the head (tip of a nozzle) and the large substrate is about 1 mm. The shorter this distance is, the higher the discharge accuracy is.

In FIG. 31, each of the heads 3105a, 3105b, and 3105c arranged in three columns to a scan direction may be capable of forming different material layers respectively, or may discharge the same material. By patterning an interlayer insulating film 128 by discharging the same material using the three heads, throughput is improved. When scanning by the apparatus shown in FIG. 31, a substrate 3100 can be moved with a head portion fixed or the head portion can be moved with the substrate 3100 fixed.

Each of the heads 3105a, 3105b, and 3105c of the droplet discharge apparatus is connected to a control unit which enables to draw a pattern which is programmed in advance by using a computer. The amount of discharge is controlled by a pulse voltage to be applied. The timing to draw is, for example, based on the marker formed on the substrate. Alternatively, a reference point may be determined based on the frame of the substrate. This is detected by an image pick-up unit such as a CCD, then converted into a digital signal by an image processing unit and processed by a computer to generate a control signal to be transmitted to the control unit. It is needless to say that data on pattern to be formed over the substrate is stored in a memory medium. Based on this data, a control signal is transmitted to the control unit to control each of the heads of the droplet discharge apparatus independently.

Figure 30B:
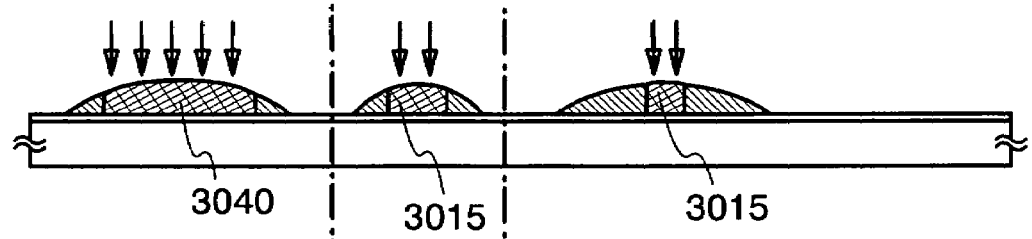

Next, a portion of the conductive film pattern is exposed by selective laser light irradiation (see FIG. 30B). A photosensitive material is contained in advance in the liquid conductive film material to be discharged so that it chemically reacts with the laser light. The photosensitive material here is a negative type that a portion which chemically reacts with the laser light remains. By laser irradiation, an accurate pattern can be formed, in particular a wire with thin width can be obtained.

Figure 32:
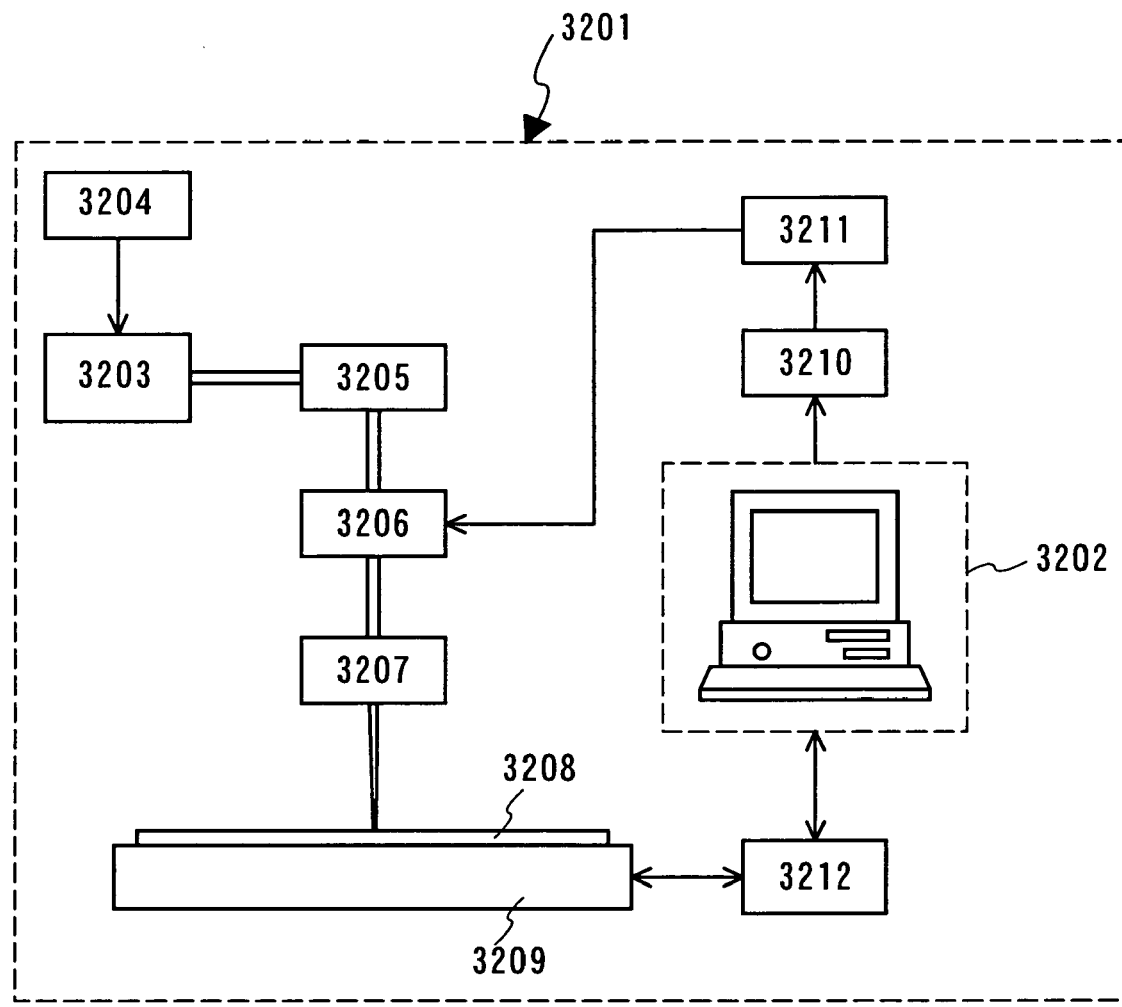
FIG. 32 is a block diagram showing Embodiment Mode 8.

Here, description is made with reference to FIG. 32 on a laser beam drawing apparatus. A laser beam drawing apparatus 3201 includes a personal computer (hereinafter also referred to as a PC) 3202 which executes various controls of laser beam irradiation, a laser oscillator 3203 which outputs a laser beam, a power source 3204 of the laser oscillator 3203, an optical system (ND filter) 3205 for attenuating a laser beam, an acousto-optic modulator (AOM) 3206 for modulating the intensity of a laser beam, a lens for enlarging or narrowing the laser beam cross-section, an optical system 3207 formed by a mirror and the like for changing light path, a substrate moving assembly 3209 having an X stage and a Y stage, a D/A converter 3210 for converting control data outputted from the PC between digital and analog, a driver 3211 for controlling the acousto-optic modulator 3206 in accordance with an analog voltage outputted from the D/A converter 3210, and a driver 3212 for outputting a driving signal for driving the substrate moving assembly 3209.

For the laser oscillator 3203, a laser oscillator capable of oscillating ultraviolet light, visible light, or infrared light can be used. As such a laser oscillator, an excimer laser oscillator such as KrF, ArF, XeCl, and Xe, a gas laser oscillator such as He, He—Cd, Ar, He—Ne, and HF, a solid state laser oscillator using a crystal such as YAG $GdVO_4$, $YVO_4$, YLF, and $YAlO_3$ doped with Cr, Nd, Er, Ho, Ce, Co, Ti, or Tm or a semiconductor laser oscillator such as GaN, GaAs, GaALAs, and InGaAsP can be used. It is to be noted that first to fifth harmonic waves of the fundamental wave are preferably used for the solid state laser oscillator.

Hereinafter described is an exposing method of a photosensitive material using a laser beam direct drawing apparatus. It is to be noted that the photosensitive material here is a conductive film material (including a photosensitive material) to be a conductive film pattern.

After a substrate 3208 is mounted on the substrate moving assembly 3209, the PC 3202 detects the position of the marker on the substrate by a camera which is not shown in the drawing. Then, the PC 3202 generates movement data for moving the substrate moving assembly 3209 based on the detected position data of the marker and drawing pattern data which is inputted in advance. After that, the PC 3202 controls the amount of output light from the acoustic-optic modulator 3206 through the driver 3211, thereby a laser beam outputted from the laser oscillator 3203 is attenuated by the optical system 3205 and controlled so as to be a predetermined amount by the acousto-optic modulator 3206. On the other hand, the laser beam outputted from the acousto-optic modulator 3206 is changed in light path and beam shape by the optical system 3207 and condensed by the lens. Then, the photosensitive material formed over the substrate is irradiated with the laser beam to be exposed. At this time, the substrate moving assembly 3209 is controlled to move in X and Y directions based on the movement data generated by the PC 3202. As a result, a predetermined place is irradiated with a laser beam, thereby the photosensitive material is exposed.

It is to be noted that a portion of the energy of laser light irradiated to the photosensitive material is converted into heat, which makes a portion of the photosensitive material react. Therefore, a pattern width becomes slightly wider than that of the laser beam. It is preferable to use a laser beam of a shorter wavelength to form a pattern of a fine width since a beam diameter can be condensed to be small.

A spot shape of the laser beam on the surface of the photosensitive material is processed by the optical system to be a dot shape, a circular shape, an oval shape, a rectangular shape, or a linear shape (strictly speaking, a shape of an elongated rectangle). It is to be noted that the spot shape may be a circular shape, however, a linear shape is more preferable to obtain a pattern with even width.

According to the apparatus shown in FIG. 32, the surface of the substrate is exposed by laser light irradiation, however, the back side of the substrate may be exposed by the laser light by appropriately changing the optical system and the substrate moving assembly. It is to be noted that the laser beam is selectively irradiated by moving the substrate, however, the invention is not limited to this. The laser beam can be scanned in X and Y directions to be irradiated. In this case, it is preferable to use a polygon mirror or a galvanometer mirror for the optical system 3207.

Figure 30C:

Next, development is performed by using etchant (or developer) to remove unnecessary portions, then main baking is performed to form a metal wire 3015 to be a gate or a gate wire (see FIG. 30C).

A wire 3040 which extends to a terminal is formed similarly to the metal wire 3015. Although not shown here, a power source line for supplying a current to a light emitting element may be formed as well. Moreover, a capacitor electrode or a capacitor wire for forming a capacitor is formed as required. When using a positive type photosensitive material, laser irradiation is performed to a portion to be removed to achieve chemical reaction therein. Then, that portion is dissolved by etchant. Moreover, laser light may be irradiated after performing room temperature drying or selective baking after discharging a liquid conductive material.

Next, a gate insulating film 3018, a semiconductor film, and an N-type semiconductor film are sequentially deposited by a plasma CVD method or a sputtering method. For the gate insulating film 3018, a material containing silicon oxide, silicon nitride, or silicon nitride oxide as a main component, which is obtained by a PCVD method is used. Moreover, a $SiO_x$ film containing an alkyl group may be used for the gate insulating film 3018, which is discharged by a droplet discharge method using siloxane-based polymer and baked.

A semiconductor film is formed of an amorphous semiconductor film or a semi-amorphous semiconductor film formed by a vapor deposition method, a sputtering method, or a thermal CVD method using a semiconductor material gas represented by silane and germane. For an amorphous semiconductor film, an amorphous silicon film formed by the PCVD method using $SiH_4$ or a mixed gas of $SiH_4$ and $H_2$ can be used. Moreover, for a semi-amorphous (also referred to as microcrystal) semiconductor film, a semi-amorphous silicon film obtained by the PCVD method using a mixed gas obtained by diluting $SiH_4$ with 3 to 1000 times of $H_2$, a mixed gas obtained by diluting $Si_2H_6$ with $GeF_4$ at a gas flow rate of 20 to 40:0.9 ($Si_2H_6$:$GeF_4$), a mixed gas of $Si_2H_6$ and $F_2$, or a mixed gas of $SiH_4$ and $F_2$. Note that the semi-amorphous silicon film is favorably used since more crystallinity can be given to the interface with the base layer.

Further, the crystallinity may be improved by irradiating the semi-amorphous silicon film obtained by a PCVD method using a mixed gas of $SiH_4$ and $F_2$ with laser light.

The N-type semiconductor film may be an amorphous semiconductor film or a semi-amorphous semiconductor film formed by a PCVD method using a silane gas and phosphine gas. It is preferable to provide an N-type semiconductor film 3020 since contact resistance between the semiconductor film and an electrode (electrode formed later) becomes low, however, it may be provided as required.

Figure 30D:
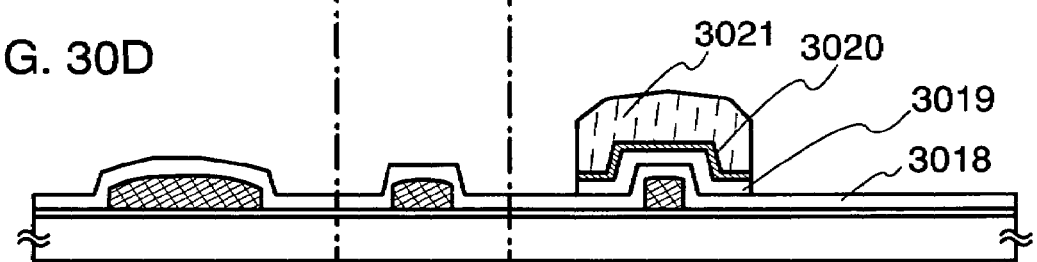

Next, a mask 3021 is provided and the semiconductor film and the N-type semiconductor film are selectively etched to obtain an island-shaped semiconductor film 3019 and an N-type semiconductor film 3020 (see FIG. 30D). The mask 3021 is formed by a droplet discharge method and a printing method (relief printing, surface printing, copperplate printing, screen printing, and the like). A desired mask pattern may be formed directly by a droplet discharge method or a printing method, however, a rough resist pattern may be formed by a droplet discharge method or a printing method and then selectively exposed by laser light to obtain a fine resist pattern with accuracy.

By using the laser beam drawing apparatus shown in FIG. 32, exposure of resist can be performed. In that case, the resist mask 3021 is to be formed by laser light exposure with a photosensitive material as a resist.

Next, after removing the mask 3021, a mask (not shown) is provided to etch a gate insulating film selectively, thereby a contact hole is formed. The gate insulating film is removed in the terminal. The mask may be formed by a typical photolithography technique, by forming a resist pattern by a droplet discharge method, or by forming a resist pattern by applying a positive resist over the entire surface and performing laser light exposure and development. In an active matrix light emitting device, a plurality of TFTs are formed in one pixel, which are connected to a wiring of the upper layer through the gate and the gate insulating film.

Figure 30E:
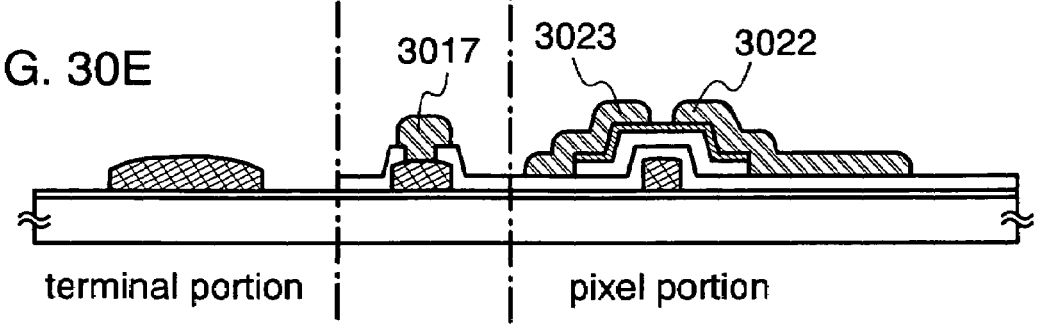

Next, a composition containing a conductive material (Ag (silver), Au (gold), Cu (copper), W (tungsten), Al (aluminum) and the like) is selectively discharged by a droplet discharge method to form source or drain (referred to as source/drain) wires 3022 and 3023, and a leading electrode 3017. Similarly, a power source line for supplying a current to the light emitting element and a connecting wire (not shown) at the terminal are formed (see FIG. 30E).

Figure 33A:
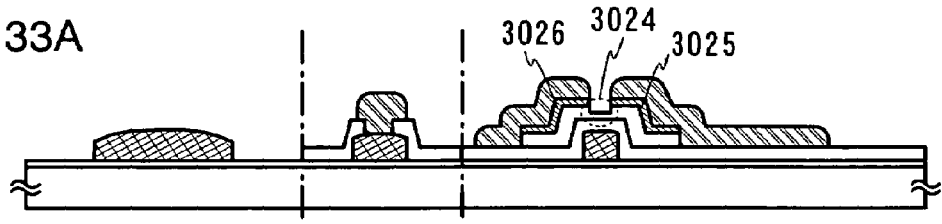
FIGS. 33A to 33D are cross sectional views showing Embodiment Mode 8.

Next, the N-type semiconductor film and a top layer of the semiconductor film are etched using the source/drain wires 3022 and 3023 as masks to obtain a state of FIG. 33A. At this stage, a channel etch type TFT provided with a channel forming region 3024 to be an active layer, a source region 3026, and a drain region 3025 is completed.

Figure 33B:
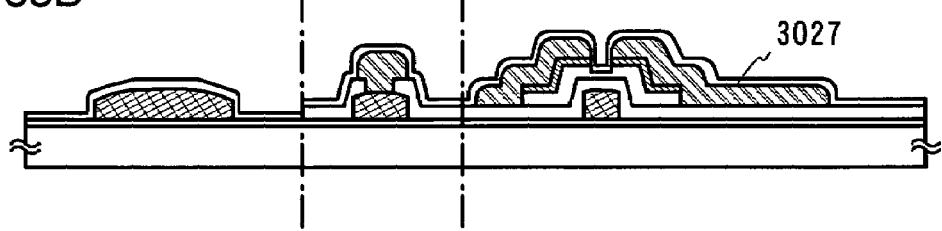

Next, a protective film 3027 is formed for preventing the channel forming region 3024 from being contaminated by impurities (see FIG. 33B). For the protective film 3027, a material mainly containing silicon nitride or silicon nitride oxide obtained by a sputtering method or a PCVD method is used. Here, the protective film 3027 is formed as an example, however, it is not necessarily formed.

Next, an interlayer insulating film 3028 is selectively formed by a droplet discharge method. The interlayer insulating film 3028 is formed of a resin material such as an epoxy resin, an acrylic resin, a phenol resin, a novolac resin, a melamine resin, and a urethane resin. In addition, the interlayer insulating film 3028 is formed by a droplet discharge method using an organic material such as benzocyclobutene, parylene, flare, and light-transmissive polyimide; a compound material formed of polymerization of siloxane polymer, and the like; a composition material containing water-soluble homopolymer and water-soluble copolymer; or the like. The interlayer insulating film 3028 is not limited to be formed by a droplet discharge method, and it can be formed over the entire surface by a coating method, a PCVD method and the like.

Next, the protective film 3027 is etched using the interlayer insulating film 3028 as a mask to form a projecting portion (pillar) 3029 formed of a conductive material over portions of the source/drain wires 3022 and 3023. The projecting portion (pillar) 3029 may be formed by repeating discharging and baking of a composition containing a conductive material (Ag (silver), Au (gold), Cu (copper), W (tungsten), Al (aluminum) and the like).

Figure 33C:
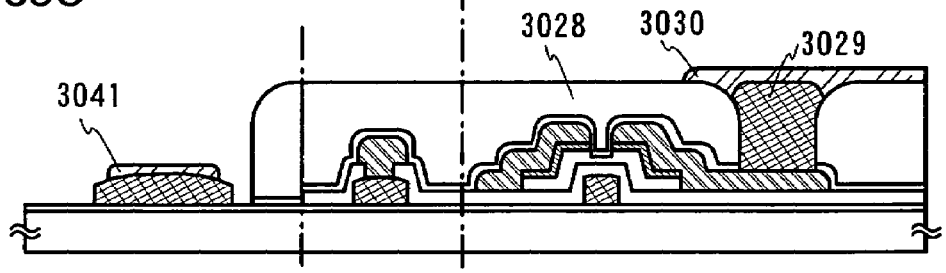

A first electrode 3030 in contact with the projecting portion (pillar) 3029 is formed over the interlayer insulating film 3028 (see FIG. 33C). It is to be noted that a terminal electrode 3041 in contact with a wire 3040 is similarly formed. Here, shown is an example that a driving TFT is an N-channel TFT, therefore, it is preferable that the first electrode 3030 function as a cathode. In the case of a light-transmissive type, the first electrode 3030 and the terminal electrode 3041 are formed by baking using a predetermined pattern which is formed by a droplet discharge method or a printing method of a composition containing indium tin oxide (ITO), indium tin oxide containing silicon oxide (ITSO), zinc oxide (ZnO), tin oxide ($SnO_2$) and the like. Moreover, in the case of reflecting light on the first electrode 3030, a predetermined pattern is formed by a droplet discharge method using a composition containing mainly metal particles such as Ag (silver), Au (gold), Cu (copper), W (tungsten), and Al (aluminum), and then baked to form the first electrode 3030 and the terminal electrode 3041. Alternatively, the first electrode 3030 may be formed by forming a light-transmissive conductive film or a light-reflective conductive film by a sputtering method, forming a mask pattern by a droplet discharge method, and performing etching in combination.

Figure 33D:
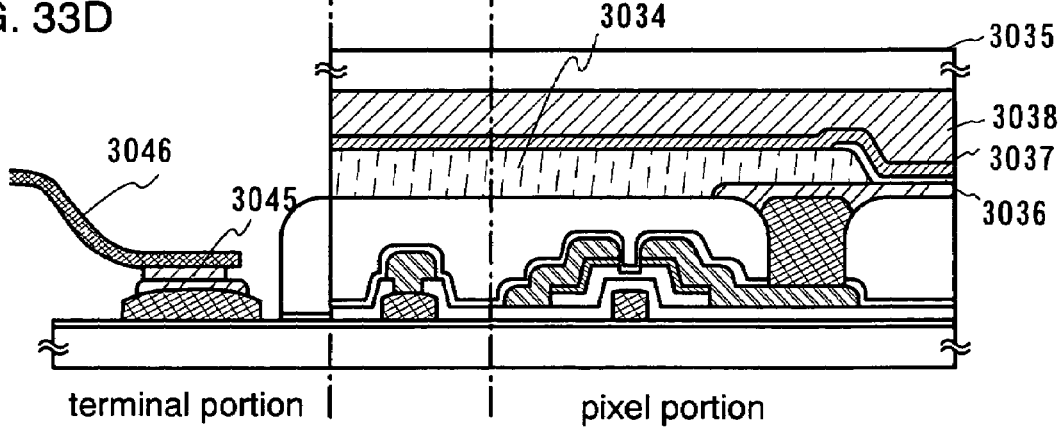
Figure 34:
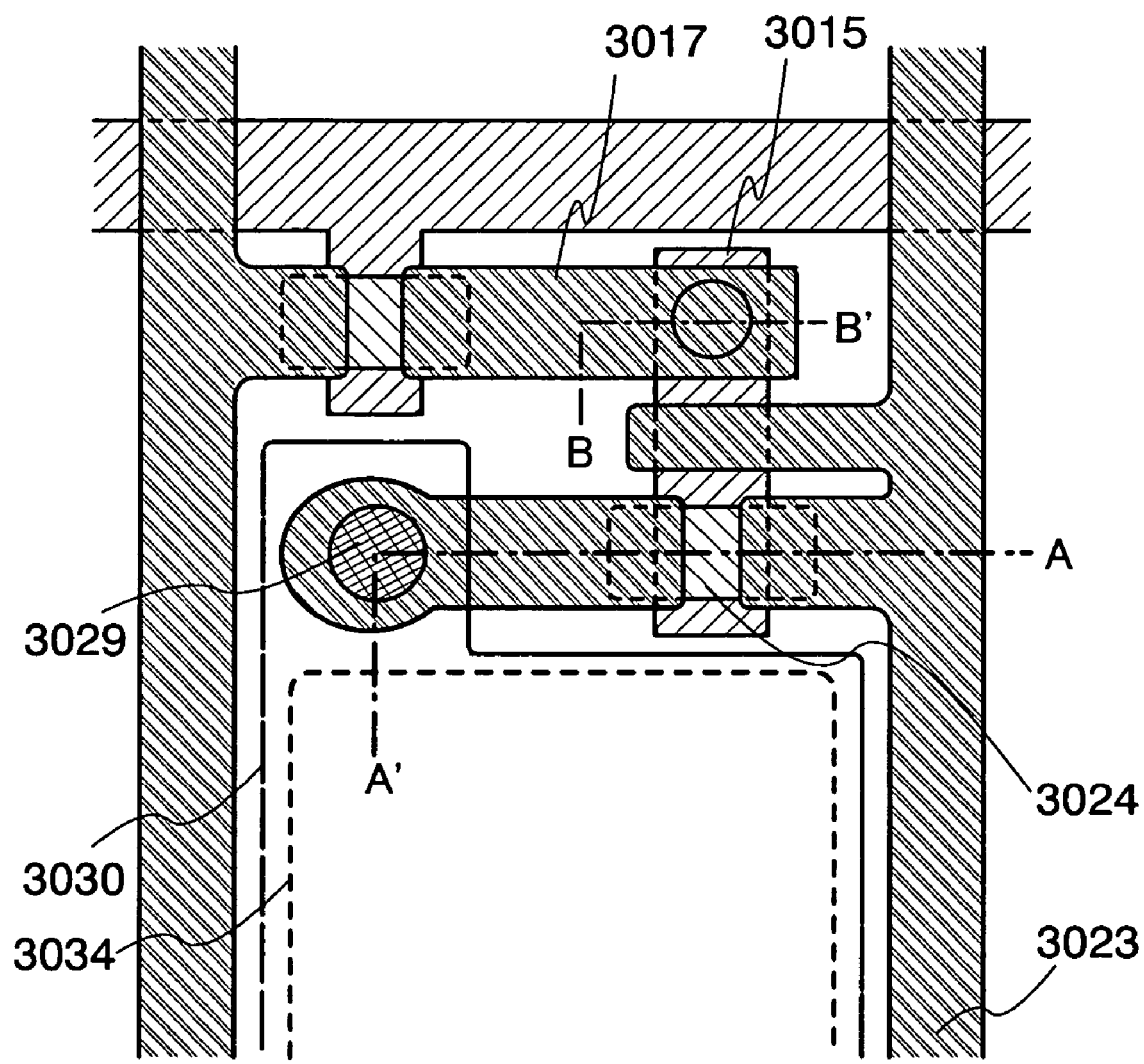
FIG. 34 is a top plan view showing Embodiment Mode 8.

FIG. 34 is an example of a top plan view of the pixel of the FIG. 33C. A cross-sectional view of the right side of the pixel portion of FIG. 33C corresponds to a cross-sectional view taken along a chain line A-A' in FIG. 34, while the left side thereof corresponds to a cross-sectional view taken along a chain line B-B'. In FIG. 34, the same reference numerals are used for the identical portions to FIGS. 30 and 33. In FIG. 34, an edge of a partition 3034 formed later is shown by a dotted line.

Although the interlayer insulating film 3028 and the projecting portion (pillar) 3029 are formed separately as the protective film 3027 is provided here, they can be formed by the same apparatus by a droplet discharge method when the protective film 3027 is not provided.

Next, the partition 3034 for covering a peripheral portion of the first electrode 3030 is formed. The partition (also referred to as a bank) 3034 is formed of a material containing silicon, an organic material, and a compound material. Moreover, a porous film may be used as well. It is preferable to use a photosensitive or non-photosensitive material such as acrylic and polyimide, since a side thereof has a curvature radius which continuously changes, and an upper thin film can be formed without breaking.

In the above-mentioned manner, a TFT substrate for a light emitting display panel in which a bottom gate (also referred to as an inverted staggered type) TFT and the first electrode 3030 are formed over the substrate 3000 is completed.

Next, a layer which functions as an electroluminescent layer (also referred to as an EL layer), that is a layer 3036 containing an organic compound is formed. The layer 3036 containing an organic compound has a stacked-layer structure each of which is formed by a vapor deposition method or a coating method. For example, an electron transporting layer (electron injection layer), a light emitting layer, a hole transporting layer, and a hole injection layer are sequentially stacked over a cathode.

The electron transporting layer contains a charge injecting-transporting substance. As a charge injecting-transporting substance having a high electron transporting property, in particular, a metal complex or the like having a quinoline skeleton or a benzoquinoline skeleton can be used, such as tris(8-quinolinolate) aluminum ($Alq_3$), tris(5-methyl-8-quinolinolate) aluminum ($Almq_3$), bis(10-hydroxybenzo[h]-quinolinato) beryllium ($BeBq_2$), and bis(2-methyl-8-quinolinolate)-4-phenylphenolato-aluminum (BAlq). As a material having a high hole transporting property, an aromatic amine-based compound (that is, the one having a benzene ring-nitrogen bond) such as 4,4'-bis[N-(1-naphthyl)-N-phenyl-amino]-biphenyl (a-NPD), 4,4'-bis[N-(3-methylphenyl)-N-phenyl-amino]-biphenyl (TPD), 4,4',4"-tris(N,N-diphenyl-amino)-triphenyl amine (TDATA), and 4,4',4"-tris[N-(3-methylphenyl)-N-phenyl-amino]-triphenyl amine (MTDATA).

Among the charge injecting-transporting material, as a material having an especially high electron injection property, a compound of an alkali metal or an alkali earth metal such as lithium fluoride (LiF), cesium fluoride (CsF), and calcium fluoride ($CaF_2$) can be used. Besides, mixture of a material having a high electron transportating property such as $Alq_3$ and an alkali earth metal such as magnesium (Mg) may be used.

A light-emitting layer is formed by a charge injecting-transporting material and a light-emitting material, each of which contains an organic compound or an inorganic compound. The light emitting layer may include one or a plurality of layers selected based on its number of molecules from a low molecular weight organic compound, an intermediate molecular weight organic compound (which can be defined as an organic compound which does not have a subliming property, and has the number of molecules of 20 or less, or a molecular chain length of 10 μm or less), and a high molecular weight organic compound. An inorganic compound having an electron injecting-transporting property or a hole injecting-transporting property may be used in combination As a material for the light-emitting layer, various materials can be used. As a low molecular weight organic light emitting material, 4-dicyanomethylene-2-methyl-6-[2-(1,1,7,7-tetramethyl-9-julolidyl)ethenyl]-4H-pyran [DCJT], 4-dicyanomethylene-2-t-butyl-6-[2-(1,1,7,7-tetramethyl julolidine- 9-yl)ethenyl]-4H-pyran [DCJTB], periflanthene, 2,5-dicyano-1,4-bis[2-(10-methoxy-1,1,7,7-tetramethyl julolidine-9-yl)ethenyl]benzene, N,N'-dimethyl quinacridon [DMQd], coumarin 6, coumarin 545T, tris(8-quinolinolate) aluminum [$Alq_3$], 9,9-bianthryl, 9,10-diphenylanthracene [DPA], 9,10-bis(2-naphthyl)anthracene [DNA], or the like can be used. Other materials may be used as well.

A high molecular weight organic light emitting material is physically stronger than a low molecular weight organic light emitting material. A light emitting element formed by the high molecular weight organic light emitting material is superior in durability. A light emitting element using the high molecular weight organic light emitting material can be manufactured rather easily since a light emitting layer can be formed by coating. The structure of the light emitting element using the high molecular weight organic light emitting material is basically the same as that using the low molecular weight organic light emitting material, that is, a cathode, an organic light emitting layer, and an anode are sequentially stacked. However, in the case where the light emitting layer is formed of the high molecular weight organic light emitting material, it is difficult to form a stacked-layer structure like the case of using the low molecular weight organic light emitting material. Therefore, the light emitting element using the high molecular weight organic light emitting material is formed to have a two-layer structure in many cases. In specific, a cathode, a light emitting layer, a hole transporting layer, and an anode are sequentially stacked.

A light emission color is determined by a material of the light emitting layer. Accordingly, a light emitting element which exhibits a desired light emission color can be formed by selecting the material of the light emitting layer. As a high molecular weight-based electroluminescent material for forming the light emitting layer, a polyparaphenylene vinylene-based material, a polyparaphenylene-based material, and a polythiophene-based material, a polyfluorene-based material can be used.

As the polyparaphenylene vinylene-based material, a derivative of poly(paraphenylene vinylene) (PPV), poly(2,5-dialkoxy-1,4-phenylenevinylene) (RO-PPV), poly(2-(2'-ethyl-hexoxy)-5-methoxy-1,4-phenylenevinylene) (MEH-PPV), poly(2-dialkoxyphenyl)-1,4-phenylenevinylene) (ROPh-PPV), and the like can be used. As the polyparaphenylene-based material, a derivative of polyparaphenylene (PPP), poly(2,5-dialkoxy-1,4-phenylene) (RO-PPP), poly(2,5-dihexoxy-1,4-phenylene), and the like can be used. As the polythiophene-based material, a derivative of polythiophene (PT), poly(3-alkylthiophene) (PAT), poly(3-hexylthiophene) (PHT), poly(3-cyclohexylthiophene) (PCHT), poly(3-cyclohexyl-4-methylthiophene) (PCHMT), poly(3,4-dicyclohexylthiophene) (PDCHT), poly[3-(4-octylphenyl)-thiophene] (POPT), poly[3-(4-octylphenyl)-2,2-bithiophene] (PTOPT), and the like can be used. As the polyfluorene-based material, a derivative of polyfluorene (PF), poly(9,9-dialkylfluorene) (PDAF), poly(9,9-dioctylfluorene) (PDOF), and the like can be used.

A hole injection property from the anode can be improved by interposing a high molecular weight organic light emitting material having a hole transporting property between the anode and a high molecular weight organic light emitting material having a light emitting property. Generally, the high molecular weight organic light emitting material having a hole transporting property is dissolved in water with an acceptor material and coated by spin coating. The high molecular weight organic light emitting material having a hole transporting property is insoluble in organic solvent, thus, the organic light emitting material having a light emitting property can be stacked over the material. As the high molecular weight organic light emitting material having a hole transporting property, a mixture of PEDOT and camphoric sulfonic acid (CSA) as an acceptor material, a mixture of polyaniline (PANI) and polystyrene sulfonic acid (PSS) as an acceptor material, and the like can be used.

Besides a singlet excited light emitting material, a triplet excited material containing a metal complex or the like can be used for the light emitting layer. For example, among a red light emitting pixel, a green light emitting pixel, and a blue light emitting pixel; a red light emitting pixel whose luminance is reduced by half in a relatively short time is formed of a triplet excited light emitting material and the others are formed of a singlet excited light emitting material. The triplet excited light emitting material has a characteristic that it consumes less power than the singlet excited light emitting material to obtain the same luminance since the triplet excited light emitting material has high light emission efficiency. In the case where the triplet excited light emitting material is used for forming the red light emitting pixel, the reliability can be improved since the light emitting element requires a small amount of current. To reduce power consumption, the red light emitting pixel and the green light emitting pixel may be formed of a triplet excited light emitting material, and the blue light emitting pixel may be formed of a singlet excited light emitting material. The power consumption can be reduced by forming a green light emitting element which is highly visible to human eyes using the triplet excited light emitting material.

As an example for the triplet excited light emitting material, a material using a metal complex as a dopant is well known, such as a metal complex including platinum which is the third transition element as a central metal or a metal complex including iridium as a central metal. The triplet excited light emitting material is not limited to these compounds. A compound that has the aforementioned structure and has an element belonging to groups 8 to 10 of the periodic table as a central metal can be used.

The hole transporting layer contains a charge injecting-transporting substance. As a material having a high hole injection property, for example, metal oxide such as molybdenum oxide ($MoO_x$), vanadium oxide ($VO_x$), ruthenium oxide ($RuO_x$), tungsten oxide ($WO_x$), and manganese oxide ($MnO_x$), can be nominated. Besides, a phthalocyanine-based compound such as phthalocyanine ($H_2Pc$) and copper phthalocyanine (CuPc) can be used.

Before forming the layer 3036 containing an organic compound, plasma treatment in the oxygen atmosphere or heat treatment in a vacuum atmosphere is preferably performed. In the case of employing vapor deposition, an organic compound is vaporized by resistance heating in advance and scattered toward a substrate by opening a shutter in depositing the organic compound. The vaporized organic compound is scattered upward and deposited over the substrate through an opening portion provided in a metal mask. To realize a full color display, a mask may be aligned per emission color (R, G, and B).

A light emitting layer may have a structure in which light emitting layers having different emission wavelength bands respectively are provided to each pixel for realizing a full color display. Typically, light emitting layers corresponding to the colors of R (red), G (green), and B (blue) are formed. In this case, color purity can be improved and a mirror surface (glare) of a pixel portion can be prevented by providing a filter (colored layer) which transmits light of each emission wavelength band to the light emission side of the pixel. By providing the filter (colored layer), a circular polarizer or the like which is conventionally required is not required any longer. Further, light can be emitted from the light emitting layer without any loss. Moreover, a change of tone which occurs when the pixel portion (display screen) is seen obliquely can be reduced.

Alternatively, a full color display may be realized by using a material exhibiting a monochromatic emission as the layer 3036 containing an organic compound, and combining a color filter or a color conversion layer without separate deposition. For example, in the case where an electroluminescent layer exhibiting white or orange light emission is formed, a full color display can be realized by separately providing a color filter, a color conversion layer, or a combination of the color filter and the color conversion layer on the light emission side of the pixel. The color filter or the color conversion layer may be formed, for example, over a second substrate (sealing substrate) and attached to the substrate. Further, as described above, all of the material exhibiting monochromatic light emission, the color filter, and the color conversion layer can be formed by a droplet discharge method.

To form a light emitting layer which exhibits white light emission, for example, $Alq_3$, $Alq_3$ partly doped with Nile red which is a red light emitting pigment, p-EtTAZ, TPD (aromatic diamine) are sequentially deposited by vapor deposition. In the case where the EL layer is formed by spin coating, the coated layer is preferably baked by vacuum heating after being coated. For example, poly(ethylene dioxythiophene)/poly(styrene sulfonate) solution (PEDOT/PSS) which acts as the hole injecting layer may be coated over the whole surface and baked, and then polyvinylcarbazole (PVK) doped with light emission center pigments (1,1,4,4-tetraphenyl-1,3-butadiene (TPB), 4-dicyanomethylene-2-methyl-6-(p-dimethylamino-styryl)-4H-pyran (DCM1), Nile red, coumarin 6, or the like) which acts as the light emitting layer may be coated over the whole surface and baked.

The light emitting layer may be formed of a single layer as well. In this case, the light emitting layer may be formed of polyvinylcarbazole (PVK) with the hole transporting property dispersed with a 1,3,4-oxadiazole derivative (PBD) with the electron transporting property. Further, white light emission can be obtained by dispersing PBD by 30 wt % as the electron transporting material and dispersing an appropriate amount of four kinds of pigments (TPB, coumarin 6, DCM1, and Nile red).

The aforementioned materials for forming the layer containing an organic compound are only examples. The light emitting element can be formed by appropriately stacking functional layers such as a hole injecting-transporting layer, a hole transporting layer, an electron injecting-transporting layer, an electron transporting layer, a light emitting layer, an electron blocking layer, and a hole blocking layer. A mixed layer or mixed junction of mixing the aforementioned layers may also be formed. The layer structure of the light emitting layer may vary. Instead of providing a specific electron injecting region or light emitting region, modifications of the structure such as providing a dedicated electrode, or providing a dispersed light emitting material can be allowed unless such modifications depart from the scope of the invention.

It is needless to say that a monochromatic light emission display may be performed. For example, an area color type light emitting display device can be formed by utilizing monochromatic light emission. A passive matrix type display portion is suitable for the area color type display device. The display device can mainly display text or symbols.

Then, a second electrode 3037 is formed. The second electrode 3037 serving as an anode of the light emitting element is formed of a light transmissive conductive film, for example, a light transmissive conductive film such as ITO, ITSO, or a film obtained by mixing indium oxide with zinc oxide (ZnO) by 2 to 20%. The light emitting element has a structure in which the layer 3036 containing an organic compound is interposed between the first electrode 3030 and the second electrode 3037. A material for the first electrode 3030 and the second electrode 3037 is required to be selected in consideration of the work function. Either of the first electrode 3030 or the second electrode 3037 can be an anode or a cathode depending on a pixel structure.

The light emitting element formed of the foregoing materials emits light under forward bias. A pixel of a display device formed by using the light emitting element can be driven by either a passive matrix driving method or an active matrix driving method. At any rate, each pixel emits light by applying forward bias at certain timing. Further, the respective pixels are in non-light emission state for a certain period. The reliability of the light emitting element can be improved by applying reverse bias in the non-light emission period. The light emitting element may be in a deterioration mode in which emission intensity decreases under a certain driving condition or may be in a deterioration mode in which apparent luminance decreases due to the expansion of a non-light emission region within the pixel. The deterioration can be delayed by alternating current (AC) driving to apply forward bias and reverse bias, which leads to improve the reliability of the light emitting device.

In order to lower the resistance of the second electrode 3037, an auxiliary electrode may be provided over the second electrode 3037 which does not serve as a light emitting region. A protective film for protecting the second electrode 3037 may be formed as well. For example, a protective film composed of a silicon nitride film can be formed by using a disc-form target formed of silicon in a deposition chamber of nitrogen atmosphere or atmosphere containing nitrogen and argon. Further, a thin film containing carbon as a main component (a DLC film, a CN film, or an amorphous carbon film) can be formed as the protective film and another deposition chamber using a (CVD) method may be additionally provided. A diamond like carbon film (also referred to as a DLC film) can be formed by a plasma CVD method (typically, RF plasma CVD method, microwave CVD method, electron cyclotron resonance (ECR) CVD method, heat filament CVD method, or the like), a combustion-flame method, a sputtering method, an ion beam deposition method, a laser deposition method, or the like. A hydrogen gas and a hydrocarbon gas ($CH_4$, $C_2H_2$, $C_6H_6$, or the like) are used as a reaction gas for deposition. The reaction gases are ionized by glow discharge, and the ions are accelerated to collide with a cathode applied with negative self-bias, thereby the DLC film is deposited. Further, the carbon nitride film (also referred to as a CN film) may be formed by using a $C_2H_4$ gas and a $N_2$ gas as reaction gases. In addition, the DLC film and the CN film are insulating films transparent or semitransparent to visible light. The term "transparent to visible light" means having a transmittance of 80 to 100% to visible light. The term "semitransparent to visible light" means having a transmittance of 50 to 80% to visible light. The protective film is not necessarily provided.

Then, the sealing substrate 3035 is attached with a sealant (not shown) to seal the light emitting element. The space surrounded by the sealant is filled with a light transmissive filler material 3038. The filler material 3038 is not particularly limited as long as it transmits light. Representatively, an ultraviolet ray curable or heat curable epoxy resin may be used. Here, a high heat-resistant UV epoxy resin (manufactured by Electrolyte Cooperation: 2500 Clear) having refractivity of 1.50, viscosity of 500 cps, shore D hardness of 90, tensile intensity of 3000 psi, Tg point of 150° C., volume resistance of $1\times10^{15}$ O·cm, and withstand voltage of 450 V/mil. By filling the filler material 3038 between a pair of substrates, the transmittance can be improved as a whole.

At last, an FPC 3046 is attached to the terminal electrode 3041 by an anisotropic conductive film 3045 by a known method (see FIG. 33D). In this manner, an active matrix light emitting device can be manufactured.

Figure 35:
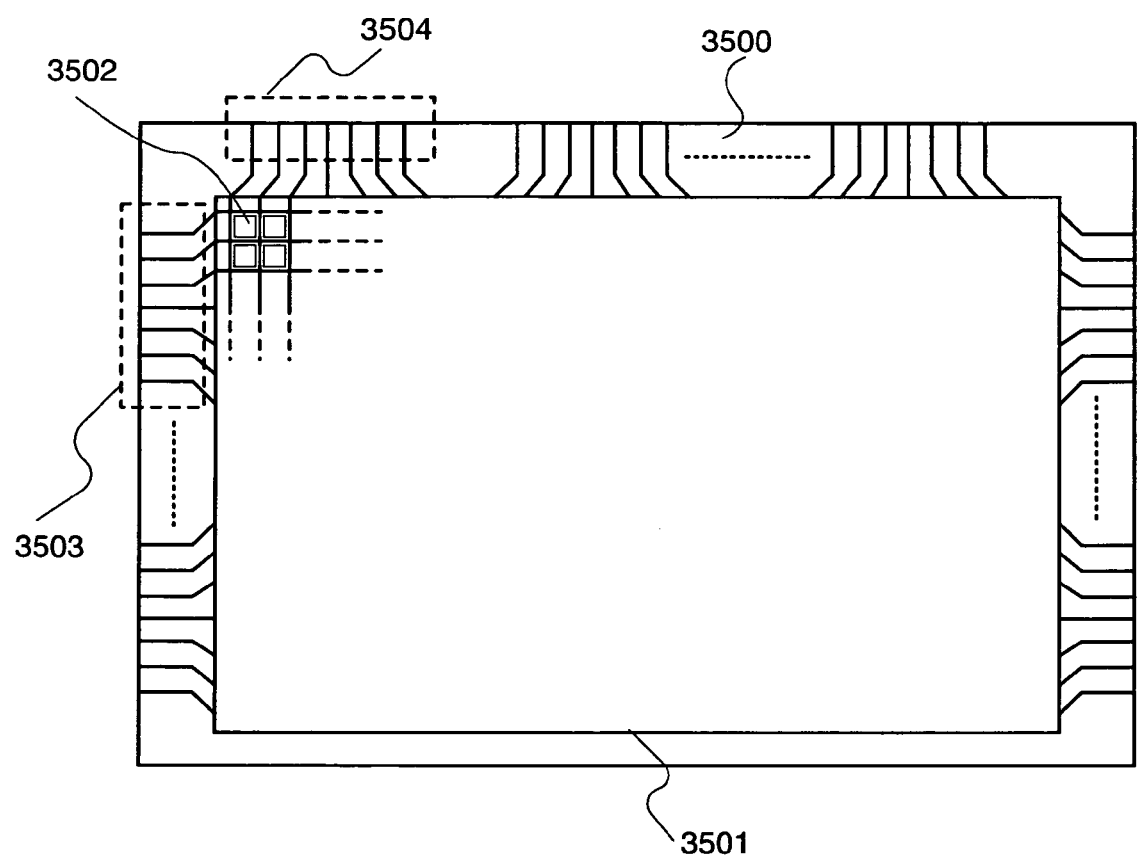
FIG. 35 is a schematic view showing Embodiment Mode 8.

FIG. 35 is a top plan view showing an example of a structure of an EL display panel. FIG. 35 shows a structure of a light emitting display panel which controls a signal to be inputted to a scan line and a signal line by an external driver circuit. A pixel portion 3501 in which a pixel 3502 is arranged in matrix, a scan line input terminal 3503, and a signal line input terminal 3504 are formed over a substrate 3500 having an insulating surface. The number of pixels may be set according to various specifications, for example, 1024×768×3 (RGB) for XGA, 1600×1200×3 (RGB) for UXGA, or 1920×1080×3 (RGB) in the case of a full spec high vision.

The pixels 3502 are arranged in matrix with scan lines extending from the scan line input terminal 3503 and signal lines extending from the signal line input terminal 3504 crossing each other. Each of the pixels 3502 is provided with a switching element and a pixel electrode connected thereto. A typical example of the switching element is a TFT. Each of the pixels can be independently controlled by signals inputted externally as a gate of the TFT is connected to the scan line and a source or drain electrode thereof is connected to the signal line.

In the case of forming the first electrode 3030 shown in FIGS. 33A to 33D using a light transmissive material and forming the second electrode 3037 using a metal material, a structure of emitting light through the substrate 3000, that is a bottom emission type is formed. Alternatively, in case of forming the first electrode 3030 using a metal material and forming the second electrode 3037 using a light transmissive material, a structure of emitting light through the sealing substrate 3035, that is a top emission type is formed. Moreover, in the case of forming the first electrode 3030 and the second electrodes 3037 using light transmissive materials, a structure of emitting light through both of the substrate 3000 and the sealing substrate 3035 can be formed. The invention may appropriately adopt any one of the aforementioned structures. Further, a driver circuit may be mounted on the EL display panel. One mode thereof is described with reference to FIG. 36.

Figure 36:
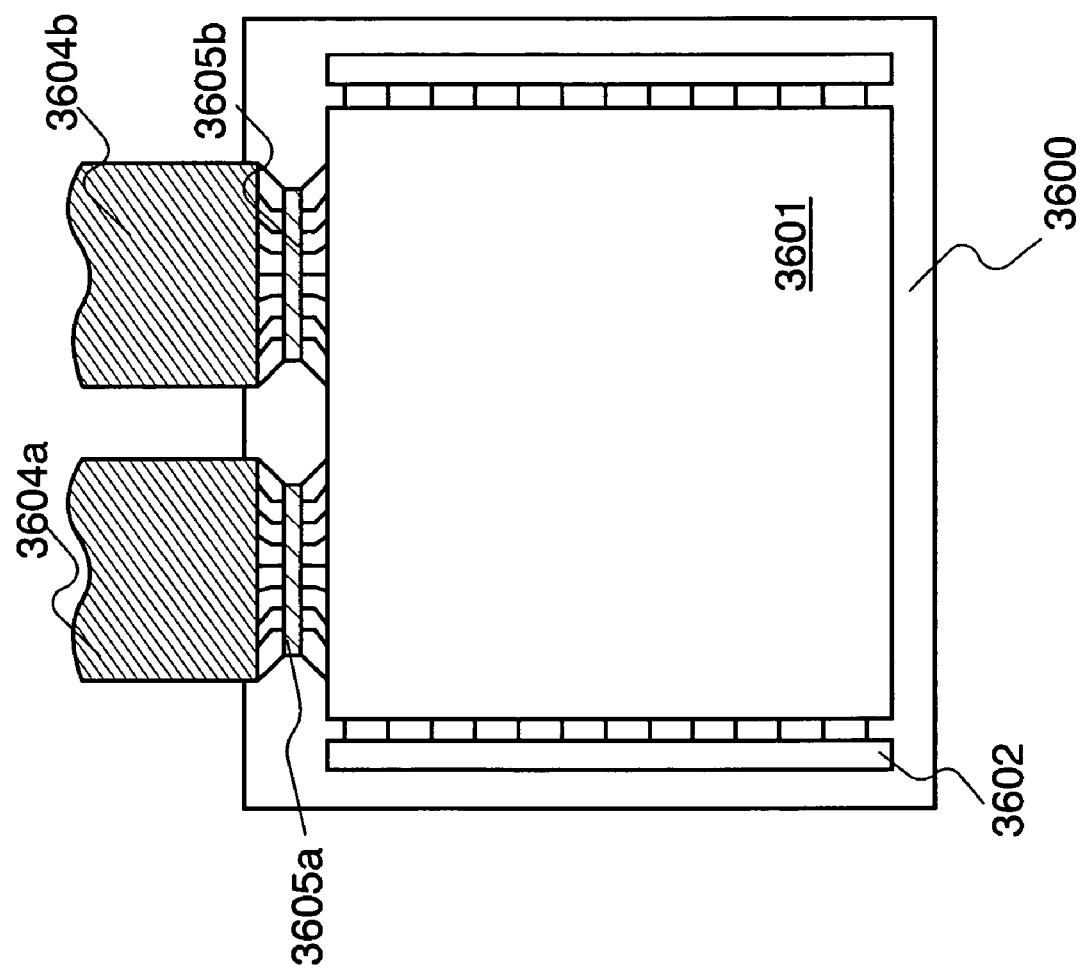
FIG. 36 is a schematic view showing Embodiment Mode 8.

First, a display device employing a COG method is described with reference to FIG. 36. A pixel portion 3601 for displaying data such as text and images and a scan line driver circuit 3602 are provided over a substrate 3600. A substrate provided with a plurality of driver circuits is divided into rectangles, and the divided driver circuits (hereinafter referred to as driver ICs) 3605a and 3605b are mounted on the substrate 3600. FIG. 36 shows a mode of mounting a plurality of driver ICs 3605a and 3605b and tapes 3604a and 3604b at the end of the driver ICs 3605a and 3605b. In addition, a divided size may be almost the same as the length of a side of the pixel portion on a signal line side, and a tape may be mounted at the end of the single driver IC.

A TAB method may be adopted, in which case a plurality of tapes may be attached, on which a driver IC may be mounted. Similarly to the case of the COG method, a single driver IC may be mounted on a single tape, in which case a metal piece or the like for fixing the driver IC may be attached due to strength problems.

It is preferable to form a plurality of the driver ICs to be mounted on an EL display panel over a rectangular substrate having a side of 300 to 1000 mm or longer in view of improving productivity. In other words, a plurality of circuit patterns including a driver circuit portion and an input/output terminal as a unit are formed over the substrate, and may be finally divided and taken out. In consideration of the side length of the pixel portion and the pixel pitch, the driver IC may be formed into a rectangle having a long side of 15 to 80 mm and a short side of 1 to 6 mm. Alternatively, the driver IC may be formed to have a side length equal to the side length of the pixel region or the pixel portion which is added to the side length of each driver circuit.

In terms of external dimension, a driver IC is more advantageous than an IC chip in length of a long side. When a driver IC having a long side of 15 to 80 mm is used, a smaller number thereof is required to be mounted in accordance with the pixel portion than the case of using an IC chip. Therefore, a manufacturing yield can be improved. When a driver IC is formed over a glass substrate, productivity does not fall as a mother substrate is not limited in shape. This is a great advantage as compared with the case of taking IC chips out of a circular silicon wafer.

In FIG. 36, the driver ICs 3605a and 3605b each provided with a driver circuit are mounted in a region outside the pixel portion 3601. The driver ICs 3605a and 3605b are driver circuits on the signal line sides. In order to form a pixel region corresponding to RGB full color, 3072 signal lines are required for XGA and 4800 signal lines are required for UXGA. The signal lines formed in such numbers are divided into several blocks at an edge of the pixel portion 3601, thereby forming leading lines. The leading lines are gathered in accordance with pitches of output terminals of the driver ICs 3605a and 3605b.

The driver IC is preferably formed of a crystalline semiconductor formed over a substrate. The crystalline semiconductor is preferably formed by continuous wave laser light irradiation. Therefore, a continuous wave solid laser or gas laser is used as an oscillator for generating the laser light. There are few crystal defects when a continuous wave laser is used, and as a result, a transistor can be formed by using a polycrystalline semiconductor layer with a large grain size. In addition, high-speed driving is possible since mobility and response are favorable, and it is possible to further improve the operating frequency of an element than that of the conventional element. Therefore, high reliability can be obtained since there are few characteristics variations. Note that the channel-length direction of a transistor and a scanning direction of laser light may be preferably the same to further improve an operating frequency. This is because the highest mobility can be obtained when a channel length direction of a transistor and the scanning direction of laser light with respect to a substrate are almost parallel (preferably, from −30° to 30°) in a laser crystallization step by a continuous wave laser. The channel length direction coincides with a flowing direction of a current, in other words, a direction in which a charge moves in a unitchannel forming region. The transistor manufactured in this manner has an active layer including a polycrystalline semiconductor layer in which a crystal grain extends in a channel direction, and this means that a crystal grain boundary is formed almost along a channel direction.

In order to perform laser crystallization, it is preferable to largely narrow down the laser light, and a beam spot thereof preferably has the same width as that of a short side of the driver IC, which is approximately 1 to 3 mm. In addition, in order to obtain an enough and effective energy density for an object to be irradiated, an irradiation region of the laser light is preferably in a linear shape. A linear shape here does not refer to a line in a strict sense but refers to a rectangle or an oblong shape with a high aspect ratio, for example, an aspect ratio of 2 or higher (preferably 10 to 10000). Thus, it is possible to provide a manufacturing method of a display device whose productivity is improved by making a beam spot width of the laser light the same as that of a short side length of the driver IC.

FIG. 36 shows a mode in which the scan line driver circuit is integrated with the pixel portion and the driver IC is mounted as the signal line driver circuit. However, the invention is not limited to this and the driver ICs may be mounted as both the scan line driver circuit and the signal line driver circuit. In that case, it is preferable that specifications of the driver ICs to be used on the scan line side and the signal line side be different.

In the pixel portion 3601, the signal line and the scan line intersect to form a matrix and a transistor is arranged at each intersection. In the invention, a TFT having an amorphous semiconductor or a semi-amorphous semiconductor as a channel portion is used as the transistor arranged in the pixel portion 3601. The amorphous semiconductor is formed by a plasma CVD method, a sputtering method, or the like. The semi-amorphous semiconductor can be formed at a temperature of 300° C. or lower by a plasma CVD method. A film thickness necessary to form a transistor is formed in a short time even in the case of a non-alkaline glass substrate with an external size of, for example, 550×650 mm. The feature of such a manufacturing technique is effective in manufacturing a large-area display device. In addition, a semi-amorphous TFT can obtain field effect mobility of 2 to 10 $cm^2/V \cdot sec$ by forming a unitchannel forming region of an SAS. Therefore, this TFT can be used as a switching element of a pixel and as an element constituting the driver circuit of a scan line side. Thus, an EL display panel in which system-on-panel is realized can be manufactured.

Note that FIG. 36 is shown on the premise that the scan line driver circuit is also integrated over the substrate by using a TFT having a semiconductor layer formed of SAS. In the case of using a TFT having a semiconductor layer formed of an SAS, a driver IC may be mounted as both the scan line driver circuit and the signal line driver circuit.

In that case, it is preferable that specifications of the driver ICs to be used on the scan line side and on the signal line side be different. For example, a transistor constituting the scan line driver IC is required to withstand a voltage of approximately 30V, while a driving frequency is 100 kHz or less, thus a high-speed operation is not required so much. Therefore, it is preferable to set the channel length (L) of the transistor included in the scan line driver sufficiently long. On the other hand, a transistor of the signal line driver IC is only required to withstand a voltage of approximately 12 V, however, a driving frequency is around 65 MHz at 3 V, and thus a high speed operation is required. Therefore, it is preferable to design the transistor which forms the driver so as to be highly integrated.

A method for mounting a driver IC is not particularly limited and a known method such as a COG method, a wire bonding method, or a TAB method can be employed. The height of the driver IC and the opposing substrate can be made almost the same by forming the driver IC to have the same thickness as that of the opposing substrate, which contributes to form a thinner display device as a whole. When both substrates are formed of the same material, thermal stress is not generated and characteristics of a circuit including a TFT are not damaged even when a temperature changes in the display device. Furthermore, the number of driver ICs to be mounted on one pixel region can be reduced by mounting a driver IC as a driver circuit, which has a longer side than an IC chip as described in this embodiment mode.

As described above, a fine pattern can be formed by exposing a conductive pattern formed by a droplet discharge method with laser light and developing it. Moreover, by forming various patterns directly on a substrate by a droplet discharge method, an EL display panel can be easily formed even by using a glass substrate of the fifth generation or later having a side of 1000 mm or longer.

Further, in this embodiment mode, a step in which a spin coating is not performed and exposure steps using a photo mask are not performed as much as possible is shown, however, the invention is not limited to this. An exposure step using a photo mask may be performed as a part of patterning.

It is to be noted that this embodiment mode can be freely implemented in combination with other embodiment modes in this specification. That is, the number of transistors which form pixels and the number of wires such as the scan lines and the power source lines can be reduced, thereby the aperture ratio can be increased. Thus, a voltage applied to a light emitting element for holding desired luminance can be suppressed and low power consumption can be achieved. Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Further, in a light emitting device of the invention, a visible pseudo contour which is a problem in displaying an image by the time gray scale method can be reduced by employing a method (an interlace method) for sequentially performing light emission of pixels of every other row in an extending direction of the data lines or the scan lines. Further, a visible pseudo contour can be reduced by employing a method (a checker method) for performing light emission of pixels in what is called a check pattern so that pixels emit light which are one pixel aside of the pixels which emit light in the preceding row in the extending direction of the data lines.

Embodiment Mode 9

Next, a cross sectional view of a part of a pixel portion of a display panel is shown.

First, description is made with reference to FIGS. 37A to 38B on the case where a crystalline semiconductor film (a polysilicon (p-Si:H) film) is used for a semiconductor layer of a transistor.

For example, in order to form the semiconductor layer, an amorphous silicon (a-Si) film is formed over a substrate by a known film formation method here. It is to be noted that any semiconductor film having an amorphous structure (including a microcrystalline semiconductor film) may be used other than the amorphous silicon film. Further, a compound semiconductor film having an amorphous structure such as an amorphous silicon germanium film may be used as well.

Subsequently, the amorphous silicon film is crystallized by a laser crystallization method, a thermal crystallization method using RTA or an annealing furnace, or a thermal crystallization method using a metal element for promoting the crystallization. It is needless to say that the above-described methods may be performed in combination.

As a result of the above-described crystallization, a crystallized region is formed partially in the amorphous semiconductor film.

Next, the crystalline semiconductor film in which the crystallinity is partially enhanced is patterned into a desired shape to form an island-shaped semiconductor film from the crystallized region. This semiconductor film is used as a semiconductor layer of a transistor.

As shown in FIGS. 37A and 37B, a base film 26102 is formed over a substrate 26101, and a semiconductor layer is formed thereover. The semiconductor layers include a channel forming region 26103, and an impurity region 26105 which forms a source region or a drain region of a driving transistor 26118, and include a channel forming region 26106, an LDD region 26107, and an impurity region 26108 which form a bottom electrode of a capacitor 26119. It is to be noted that channel doping may be performed to the channel forming region 26103 and the channel forming region 26106.

As the substrate, a glass substrate, a quartz substrate, a ceramic substrate, a plastic substrate, or the like can be used. The base film 26102 can be formed using a single layer of aluminum nitride (AlN), silicon oxide ($SiO_2$), silicon oxynitride ($SiO_xN_y$), or the like, or a stacked layer thereof.

A gate 26110 and a top electrode 26111 of the capacitor 26119 are formed over the semiconductor layers respectively with a gate insulating film 26109 interposed therebetween.

An interlayer insulator 26112 is formed to cover the driving transistor 26118 and the capacitor 26119. A contact hole is opened in the interlayer insulator 26112, through which a wire 26113 contacts the impurity region 26105. A pixel electrode 26114 is formed to contact the wire 26113, and a second interlayer insulator 26115 is formed to cover an end portion of the pixel electrode 26114 and the wire 26113; it is formed using a positive photosensitive acrylic resin film here. Then, a layer 26116 containing an organic compound and an opposing electrode 26117 are formed on the pixel electrode 26114. A light emitting element 26120 is formed in a region where the layer 26116 containing an organic compound is sandwiched between the pixel electrode 26114 and the opposing electrode 26117.

In addition, as shown in FIG. 37B, an LDD region 26202 which forms a part of the bottom electrode of the capacitor 26119, may be provided so as to overlap the top electrode 26111. It is to be noted that the same reference numerals as FIG. 37A are used for the identical portions, and description thereof is omitted.

Figure 38A:
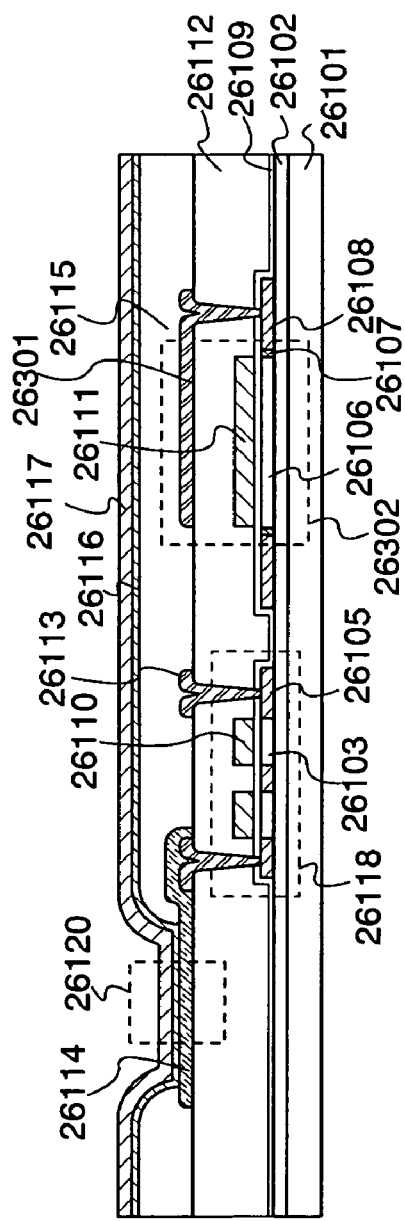
FIGS. 38A and 38B are cross sectional views showing Embodiment Mode 9.

In addition, as shown in FIG. 38A, a second top electrode 26301 may be provided which is formed in the same layer as the wire 26113 contacting the impurity region 26105 of the driving transistor 26118. It is to be noted that the same reference numerals as FIG. 37A are used for the identical portions, and description thereof is omitted. A second capacitor is formed by sandwiching the interlayer insulator 26112 between the second top electrode 26301 and the top electrode 26111. In addition, the second top electrode 26301 contacts the impurity region 26108, so that a first capacitor in which the gate insulating film 26109 is sandwiched between the top electrode 26111 and the channel forming region 26106 and a second capacitor in which the interlayer insulator 26112 is sandwiched between the top electrode 26111 and the second top electrode 26301 are connected in parallel to form a capacitor 26302. The capacitor 26302 has synthetic capacitance of the capacitance of the first capacitor and the capacitance of the second capacitor, thereby the capacitor having a large capacitance can be formed in a small area. That is, by using the capacitor in the pixel configuration of the invention, the aperture ratio can be further improved.

Figure 38B:
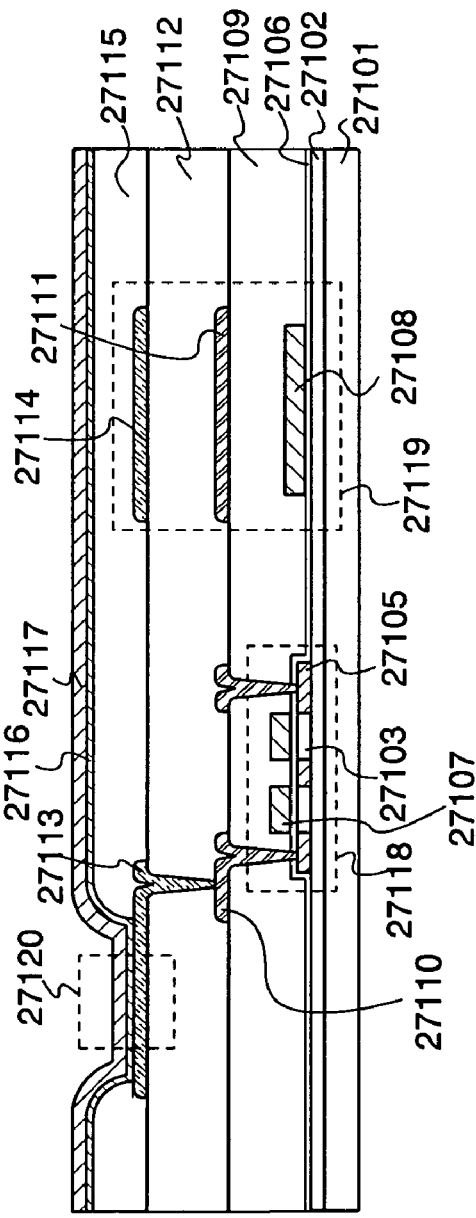

Further alternatively, a structure of a capacitor as shown in FIG. 38B may be adopted as well. A base film 27102 is formed over a substrate 27101, and a semiconductor layer is formed thereover. The semiconductor layer includes a channel forming region 27103, and an impurity region 27105 to form a source region or a drain region of a driving transistor 27118. It is to be noted that channel doping may be performed to the channel forming region 27103.

As the substrate, a glass substrate, a quartz substrate, a ceramic substrate, a plastic substrate or the like can be used. The base film 27102 can be formed using a single layer of aluminum nitride (AlN), silicon oxide ($SiO_2$), silicon oxynitride ($SiO_xN_y$), or the like, or a stacked layer thereof.

A gate 27107 and a first electrode 27108 are formed over the semiconductor layers respectively with a gate insulating film 27106 interposed therebetween.

A first interlayer insulator 27109 is formed to cover the driving transistor 27118 and the first electrode 27108. A contact hole is opened in the first interlayer insulator 27109, through which a wire 27110 contacts the impurity region 27105. In addition, a second electrode 27111 is formed in the same layer formed of the same material as the wire 27110.

Then, a second interlayer insulator 27112 is formed to cover the wire 27110 and the second electrode 27111. A contact hole is opened in the second interlayer insulating film 27112, through which a pixel electrode 27113 is formed to contact the wire 27110. A third electrode 27114 is formed in the same layer formed of the same material as the pixel electrode 27113. Accordingly, a capacitor 27119 is constituted by the first electrode 27108, the second electrode 27111 and the third electrode 27114.

An insulator 27115 is formed so as to cover an end portion of the pixel electrode 27113 and the third electrode 27114. Then, a layer 27116 containing an organic compound and an opposing electrode 27117 are formed over the third interlayer insulator 27115 and the third electrode 27114. A light emitting element 27120 is formed in a region where the layer 27116 containing an organic compound is sandwiched between the pixel electrode 27113 and the opposing electrode 27117.

As set forth above, there are the structures shown in FIGS. 37A to 38B as a structure of a transistor using a crystalline semiconductor film as its semiconductor layer. It is to be noted that FIGS. 37A to 38B show transistors having a top gate structure. That is, a transistor may be a P or N type. In the case of an N-type transistor, the LDD region may overlap the gate or is not required to overlap the gate, or the LDD region may partially overlap the gate. Further, the gate may have a tapered shape and the LDD region may be provided under the tapered portion of the gate in a self-aligned manner. In addition, the number of gates is not limited to two, and a multi-gate structure having three or more gates may be employed, or a single gate structure may be employed.

By using a crystalline semiconductor film as a semiconductor layer (e.g., a channel forming region, a source region, and a drain region) of a transistor constituting the pixel of the invention, the scan line driver circuit 910, and the signal line driver circuit 902 can be easily integrated with the pixel portion 600 in FIG. 6, for example.

Next, as a structure of a transistor using a polysilicon (p-Si:H) film as its semiconductor layer, FIGS. 39A and 39B show partial cross sectional views of a display panel in which a transistor having a structure in which a gate is sandwiched between a substrate and a semiconductor layer, namely a bottom gate structure in which a gate is disposed under a semiconductor layer is applied.

A base film 7502 is formed on a substrate 7501. Then, a gate 7503 is formed on the base film 7502. A first electrode 7504 is formed in the same layer formed of the same material as the gate. As a material for the gate 7503, phosphorus-added polycrystalline silicon can be used. Other than phosphorus-added polycrystalline silicon, silicide that is a compound of metal and silicon may be used as well.

Then, a gate insulating film 7505 is formed to cover the gate 7503 and the first electrode 7504. The gate insulating film 7505 is formed using a silicon oxide film, a silicon nitride film, or the like.

On the gate insulating film 7505, a semiconductor layer is formed. The semiconductor layer includes a channel forming region 7506, an LDD region 7507, and an impurity region 7508 which forms a source region or a drain region of a driving transistor 7522, and include a channel forming region 7509, an LDD region 7510, and an impurity region 7511 which form a second electrode of a capacitor 7523. It is to be noted that channel doping may be performed to the channel forming region 7506 and the channel forming region 7509.

As the substrate, a glass substrate, a quartz substrate, a ceramic substrate, a plastic substrate, or the like can be used. The base film 7502 can be formed using a single layer of aluminum nitride (AlN), silicon oxide ($SiO_2$), silicon oxynitride ($SiO_xN_y$), or the like, or a stacked layer thereof.

A first interlayer insulator 7512 is formed to cover the semiconductor layer. A contact hole is opened in the first interlayer insulator 7512, through which a wire 7513 contacts the impurity region 7508. A third electrode 7514 is formed in the same layer and using the same material as the wire 7513. The capacitor 7523 is constituted by the first electrode 7504, the second electrode, and the third electrode 7514.

In addition, an aperture 7515 is formed in the first interlayer insulator 7512. A second interlayer insulator 7516 is formed so as to cover the driving transistor 7522, the capacitor 7523, and the aperture 7515. A pixel electrode 7517 is formed through a contact hole on the second interlayer insulating film 7516. Then, an insulator 7518 is formed so as to cover end portions of the pixel electrode 7517. For example, a positive photosensitive acrylic resin film can be used. Subsequently, a layer 7519 containing an organic compound and an opposing electrode 7520 are formed on the pixel electrode 7517, and a light emitting element 7521 is formed in a region where the layer 7519 containing an organic compound is sandwiched between the pixel electrode 7517 and the opposing electrode 7520. The aperture 7515 is disposed under the light emitting element 7521; accordingly, in the case where light emission from the light emitting element 7521 is extracted from the substrate side, the transmissivity can be improved due to the existence of the aperture 7515.

Furthermore, as shown in FIG. 39B, a fourth electrode 7524 may be formed in the same layer and using the same material as the pixel electrode 7517 in FIG. 39A. In that case, a capacitor 7525 can be constituted by the first electrode 7504, the second electrode, the third electrode 7514, and the fourth electrode 7524.

Figure 40A:
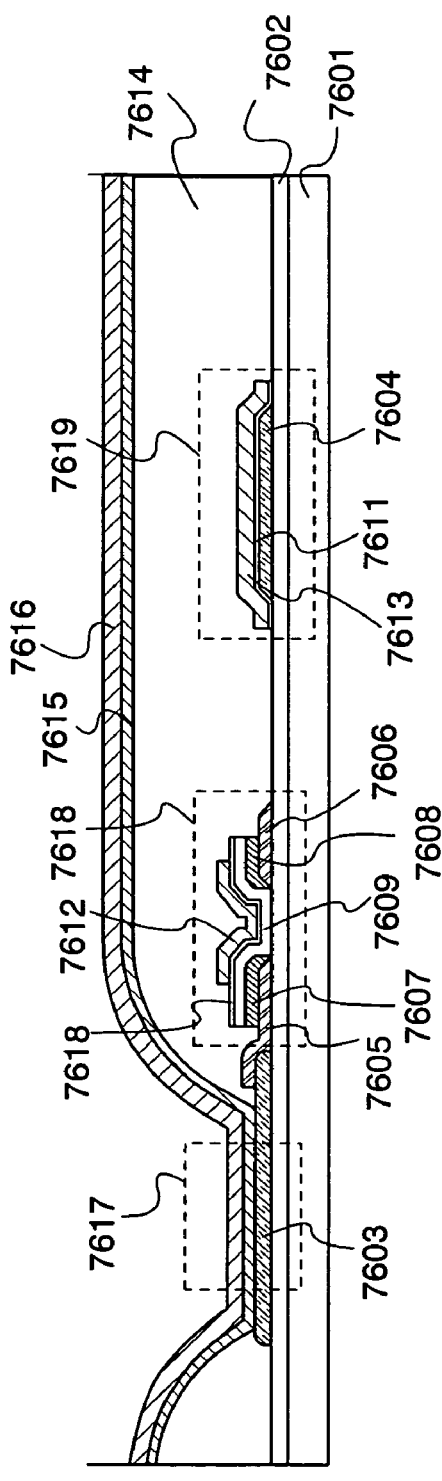
FIGS. 40A and 40B are cross sectional views showing Embodiment Mode 9.
Figure 40B:
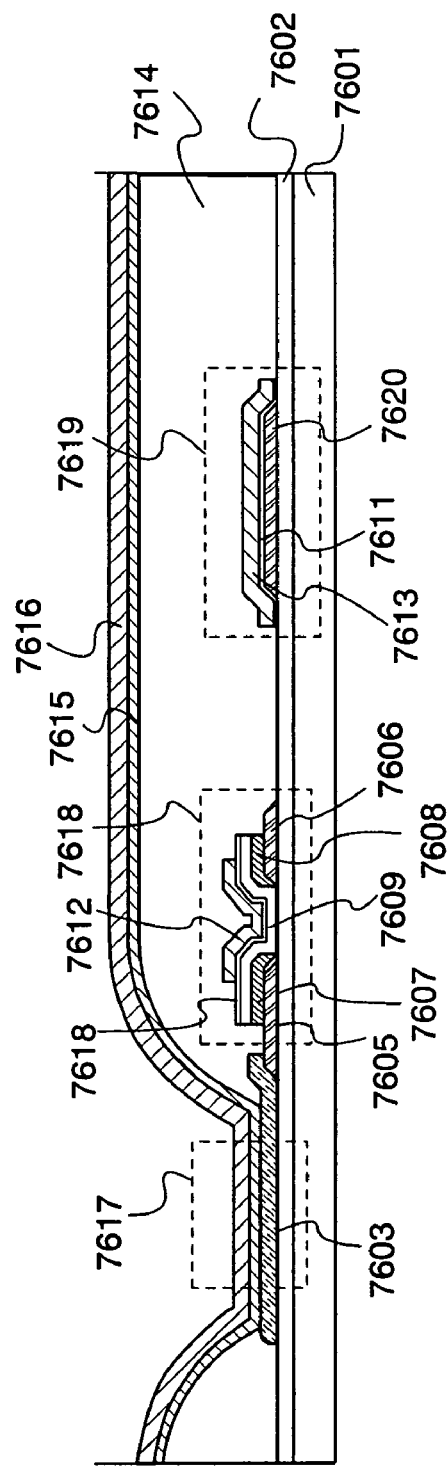

Subsequently, description is made on the case where an amorphous silicon (a-Si:H) film is used as a semiconductor layer of a transistor. FIGS. 40A and 40B show top gate transistors while FIGS. 41A to 42B show bottom gate transistors.

FIG. 40A is a cross sectional view of a transistor having a staggered structure using amorphous silicon as its semiconductor layer. As shown in FIG. 40A, a base film 7602 is formed over a substrate 7601. Over the base film 7602, a pixel electrode 7603 is formed. In addition, a first electrode 7604 is formed in the same layer and using the same material as the pixel electrode 7603.

As the substrate, a glass substrate, a quartz substrate, a ceramic substrate, a plastic substrate, or the like can be used. The base film 7602 can be formed using a single layer of aluminum nitride (AlN), silicon oxide ($SiO_2$), silicon oxynitride ($SiO_xN_y$), or the like, or a stacked layer thereof.

A wire 7605 and a wire 7606 are formed over the base film 7602, and an end portion of the pixel electrode 7603 is covered with the wire 7605. On the wire 7605 and the wire 7606, an N-type semiconductor layer 7607 and an N-type semiconductor layer 7608 having N-type conductivity are formed respectively. In addition, a semiconductor layer 7609 is formed between the wire 7606 and the wire 7607 over the base film 7602, which is partially extended over the N-type semiconductor layer 7607 and the N-type semiconductor layer 7608. It is to be noted that this semiconductor layer is formed using an amorphous semiconductor film such as amorphous silicon (a-Si:H) or a microcrystalline semiconductor (μ-Si:H). Then, a gate insulating film 7610 is formed over the semiconductor layer 7609, and an insulating film 7611 which is formed in the same layer and using the same material as the gate insulating film 7610 is formed on the first electrode 7604. It is to be noted that a silicon oxide film, a silicon nitride film, or the like is used as the gate insulating film 7610.

On the gate insulating film 7610, a gate 7612 is formed. In addition, a second electrode 7613 which is formed in the same layer and using the same material as the gate is formed over the first electrode 7604 with the insulating film 7611 interposed therebetween. A capacitor 7619 is formed by sandwiching the insulating film 7611 between the first electrode 7604 and the second electrode 7613. An interlayer insulator 7614 is formed to cover an end portion of the pixel electrode 7603, the driving transistor 7618, and the capacitor 7619.

On the interlayer insulator 7614 and the pixel electrode 7603 corresponding to an aperture of the interlayer insulator 7614, a layer 7615 containing an organic compound and an opposing electrode 7616 are formed. A light emitting element 7617 is formed in a region where the layer 7615 containing an organic compound is sandwiched between the pixel electrode 7603 and the opposing electrode 7616.

The first electrode 7604 in FIG. 40A may be a first electrode 7620 as shown in FIG. 40B. The first electrode 7620 is formed in the same layer and using the same material as the wires 7605 and 7606.

Figure 41A:
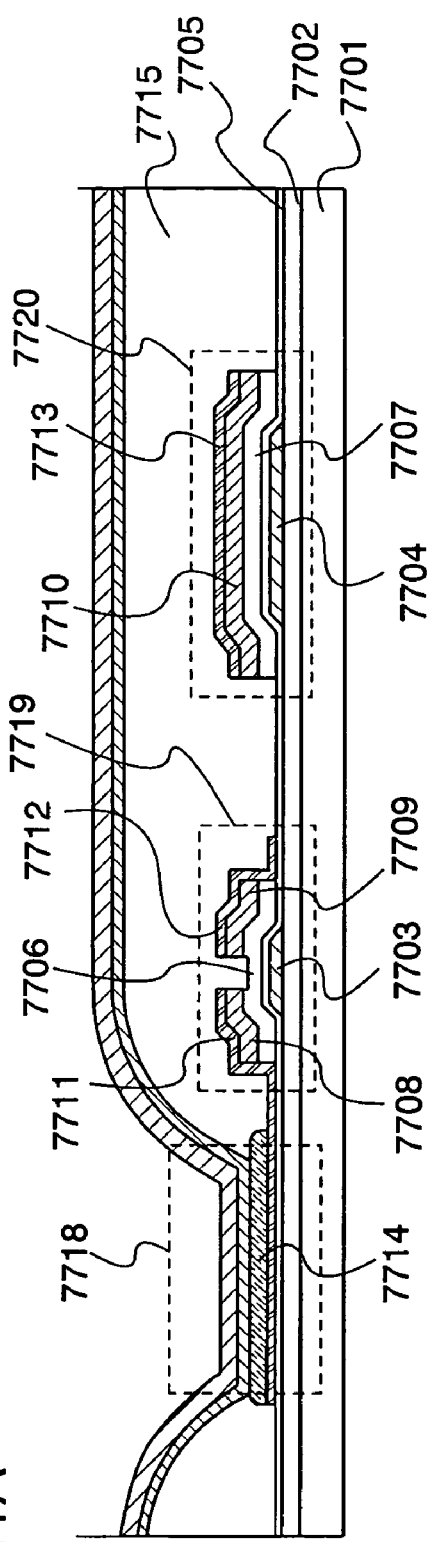
FIGS. 41A and 41B are cross sectional views showing Embodiment Mode 9.
Figure 41B:
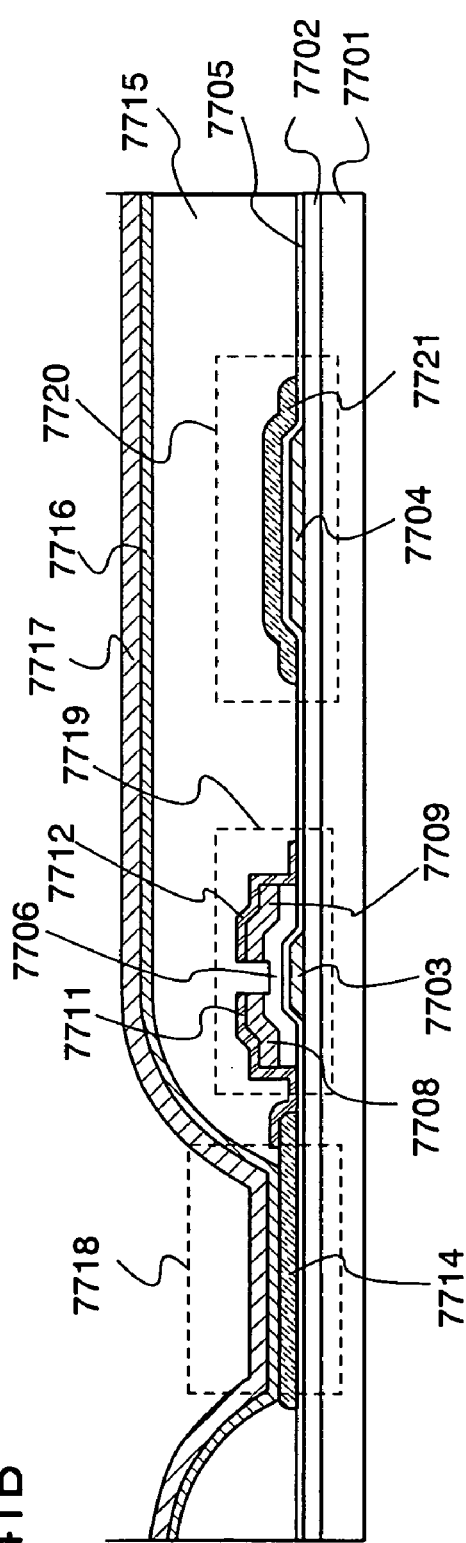

FIGS. 41A and 41B are partial cross sectional views of display panels provided with a transistor having a bottom gate structure using amorphous silicon as its semiconductor layer.

A base film 7702 is formed over a substrate 7701. Over the base film 7702, a gate 7703 is formed. In addition, a first electrode 7704 is formed in the same layer and using the same material as the gate. As a material for the gate 7703, phosphorus-added polycrystalline silicon can be used. Other than polycrystalline silicon, silicide that is a compound of metal and silicon may be used as well.

Then, a gate insulating film 7705 is formed to cover the gate 7703 and the first electrode 7704. The gate insulating film 7705 is formed using a silicon oxide film, a silicon nitride film, or the like.

A semiconductor layer 7706 is formed over the gate insulating film 7705. In addition, a semiconductor layer 7707 is formed in the same layer and using the same material as the semiconductor layer 7706.

As the substrate, a glass substrate, a quartz substrate, a ceramic substrate, a plastic substrate, or the like can be used.

The base film 7602 can be formed using a single layer of aluminum nitride (AlN), silicon oxide ($SiO_2$), silicon oxynitride ($SiO_xN_y$), or the like, or a stacked layer thereof.

N-type semiconductor layers 7708 and 7709 having N-type conductivity are formed on the semiconductor layer 7706 while an N-type semiconductor layer 7710 is formed over the semiconductor layer 7707.

Wires 7711 and 7712, and 7713 are formed on the N-type semiconductor layers 7708, 7709, and 7710 respectively while a conductive layer 7713 which is formed in the same layer using the same material as the wires 7711 and 7712 is formed over the N-type semiconductor layer 7710.

The semiconductor layer 7707, the N-type semiconductor layer 7710, and the conductive layer 7713 constitute a second electrode. It is to be noted that a capacitor 7720 is formed by sandwiching the gate insulating film 7702 between the second electrode and the first electrode 7704.

One end portion of the wire 7711 is extended, and a pixel electrode 7714 is formed in contact with the extended wire 7711.

An insulator 7715 is formed so as to cover end portions of the pixel electrode 7714, a driving transistor 7719, and the capacitor 7720.

Then, a layer 7716 containing an organic compound and an opposing electrode 7717 are formed on the pixel electrode 7714 and the insulator 7715. A light emitting element 7718 is formed in a region where the layer 7716 containing an organic compound is sandwiched between the pixel electrode 7714 and the opposing electrode 7717.

The semiconductor layer 7707 and the N-type semiconductor layer 7710 which form a part of the second electrode of the capacitor is not required to be provided. That is, the second electrode may be constituted only by the conductive layer 7713, so that the capacitor may be formed by sandwiching the gate insulating film between the first electrode 7704 and the conductive layer 7713.

In addition, the pixel electrode 7714 may be formed prior to forming the wire 7711 in FIG. 41A, so that a capacitor 7722 can be formed by sandwiching the gate insulating film 7705 between a second electrode 7721 which is formed of the pixel electrode 7714 and the first electrode 7704 as shown in FIG. 41B.

It is to be noted that FIGS. 41A and 41B show inversely staggered, channel etch type transistors; however, a channel protective type transistor may also be used. The case of a channel protective type transistor is described with reference to FIGS. 42A and 42B.

A channel protective type transistor shown in FIG. 42A is different from the driving transistor 7719 of the channel etch type shown in FIG. 41A in that an insulator 7801 which is an etching mask is provided over the channel forming region in the semiconductor layer 7706. The other portions identical to FIG. 42A are denoted by the same reference numerals.

Similarly, a channel protective type transistor shown in FIG. 42B is different from the driving transistor 7719 of the channel etch type shown in FIG. 41B in that an insulator 7802 which is an etching mask is provided over the channel forming region in the semiconductor layer 7706. The other portions identical to FIG. 42B are denoted by the same reference numerals.

By using an amorphous semiconductor film as a semiconductor layer (e.g., a channel forming region, a source region, and a drain region) of a transistor constituting the pixel of the invention, manufacturing cost can be reduced.

It is to be noted that a structure of a transistor and a structure of a capacitor applicable to the pixel configuration of the invention are not limited to the above-described structures, and various structures can be used.

It is to be noted that this embodiment mode can be freely implemented in combination with other embodiment modes in this specification. That is, the number of transistors which form pixels and the number of wires such as the scan lines and the power source lines can be reduced, thereby the aperture ratio can be increased. Thus, a voltage applied to a light emitting element for holding desired luminance can be suppressed and low power consumption can be achieved. Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Further, in a light emitting device of the invention, a visible pseudo contour which is a problem in displaying an image by the time gray scale method can be reduced by employing a method (an interlace method) for sequentially performing light emission of pixels of every other row in an extending direction of the data lines or the scan lines. Further, a visible pseudo contour can be reduced by employing a method (a checker method) for performing light emission of pixels in what is called a check pattern so that pixels emit light which are one pixel aside of the pixels which emit light in the preceding row in the extending direction of the data lines.

Embodiment Mode 10

Electronic devices provided with a light emitting device of the invention are, for example, a television receiver, a camera such as a video camera and a digital camera, a goggle type display, a navigation system, an audio reproducing device (a car audio set, and the like), a computer, a game machine, a portable information terminal (a mobile computer, a portable phone, a portable game machine, an electronic book, or the like), an image reproducing device provided with a recording medium (specifically, a device which reproduces a recording medium such as a DVD (Digital Versatile Disc) and has a display capable of displaying the reproduced image), and the like. Specific examples of these electronic devices are shown in FIGS. 22, 23, 24, 24A, 24B, 25A, 25B, 26, and 27A to 27E.

Figure 22:
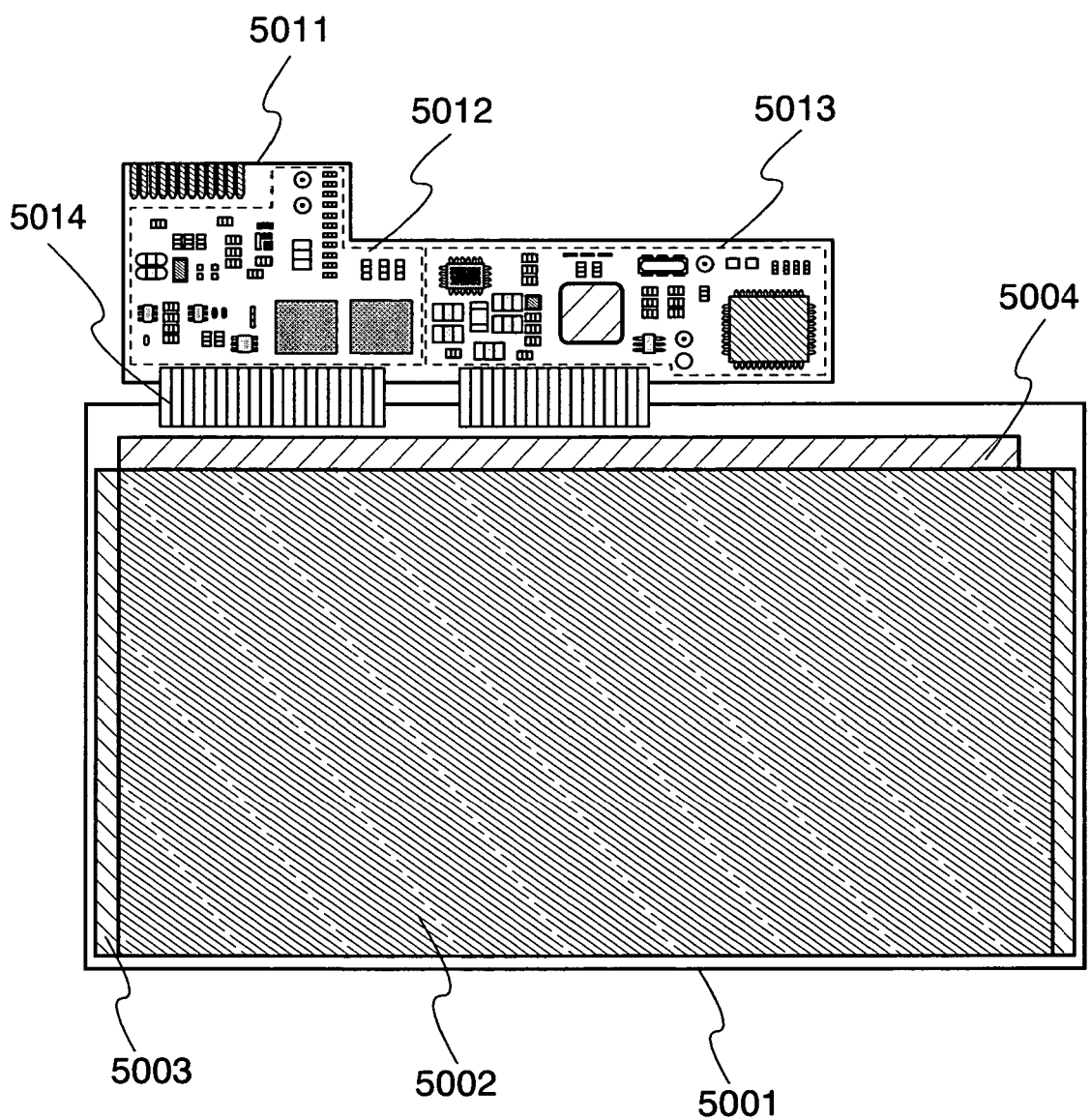
FIG. 22 is a diagram showing an example of an electronic device of Embodiment Mode 10.

FIG. 22 illustrates a module in which a display panel 5001 and a circuit substrate 5011 are combined. In the circuit substrate 5011, a control circuit 5012, a signal divider circuit 5013, and the like are formed and electrically connected to the display panel 5001 through a connecting wire 5014.

The display panel 5001 is provided with a pixel portion 5002 including a plurality of pixels, a scan line driver circuit 5003, and a signal line driver circuit 5004 which supplies a video signal to a selected pixel. The display panel 5001 may be manufactured in accordance with the aforementioned embodiment modes. Further, driver circuit portions for control such as the scan line driver circuit 5003 and the signal line driver circuit 5004 may be manufactured using thin film transistors. In this manner, the module shown in FIG. 22 can be completed.

Figure 23:
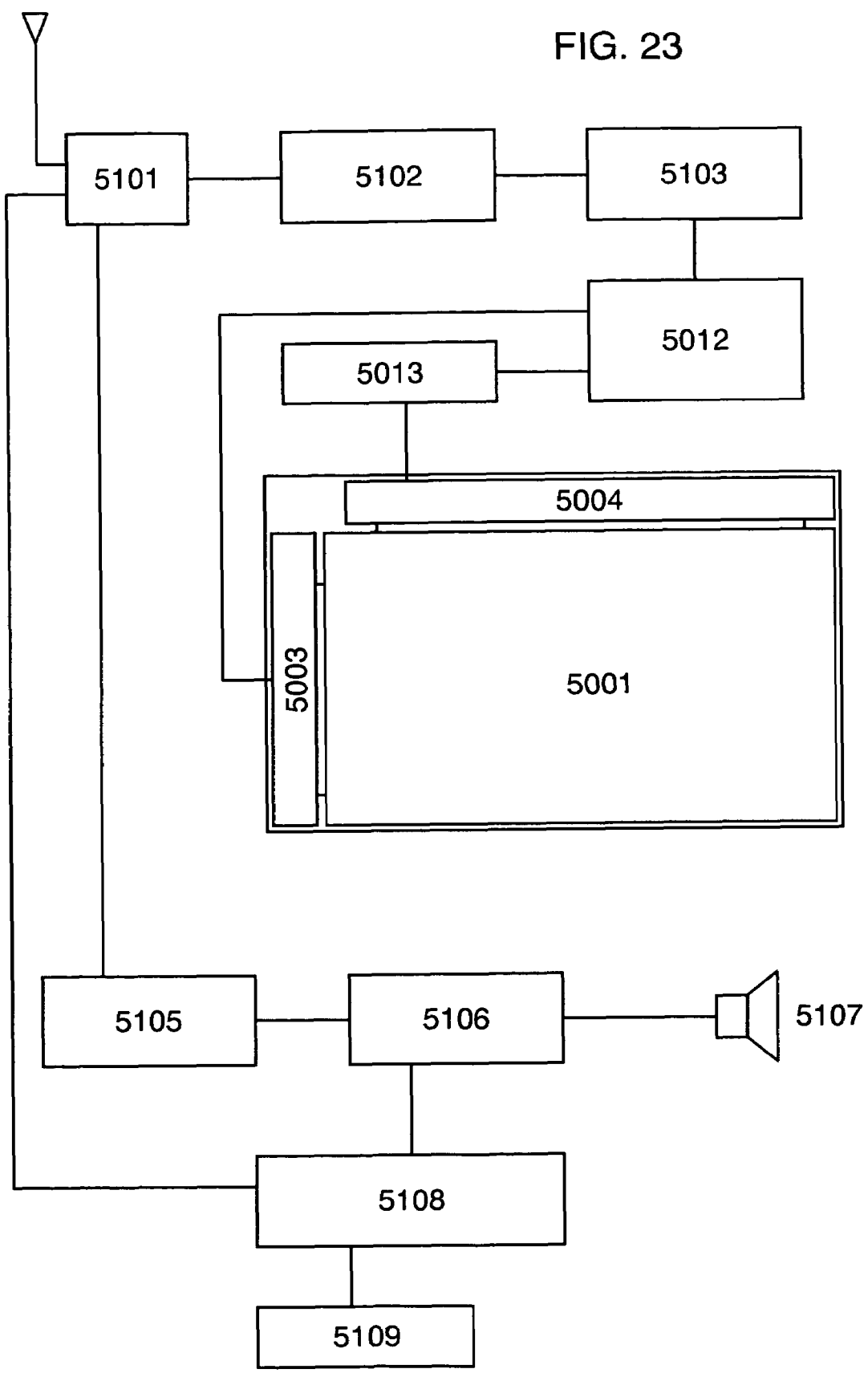
FIG. 23 is a diagram showing an example of an electronic device of Embodiment Mode 10.

FIG. 23 is a block diagram showing a major configuration of a television receiver. A tuner 5101 receives a video signal and an audio signal. The video signal is processed by a video signal amplifier circuit 5102, a video signal processing circuit 5103 which converts a signal outputted from the video signal amplifier circuit 5102 into a color signal corresponding to each of red, green, and blue, and a control circuit 5012 which converts the video signal into input specifications of a driver IC. The control circuit 5012 outputs signals to each of a scan line side and a signal line side. In the case of a digital drive, the signal divider circuit 5013 may be provided on the signal line side, and input digital signals may be divided into m signals and supplied.

Among the signals received by the tuner 5101, the audio signals are transmitted to an audio signal amplifier circuit 5105 and the output is supplied to a speaker 5107 through an audio signal processing circuit 5106. A control circuit 5108 receives control data such as a receiving station (receiving frequency) and volume from an input portion 5109 and transmits the signals to the tuner 5101 and the audio signal processing circuit 5106.

Figure 24A:
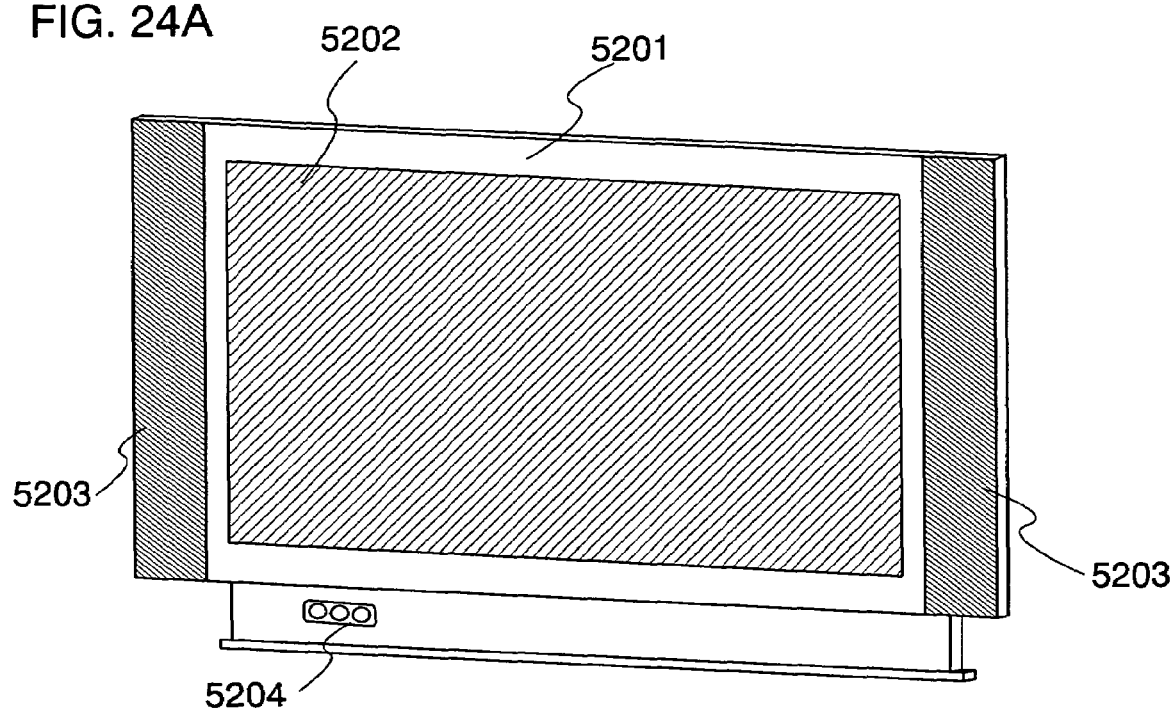
FIGS. 24A and 24B are diagrams showing examples of electronic devices of Embodiment Mode 10.

As shown in FIG. 24A, a television receiver can be completed by mounting a module in a housing 5201. With a module, a display screen 5202 can be formed. Further, speakers 5203, an operating switch 5204, and the like are provided as required.

Figure 24B:
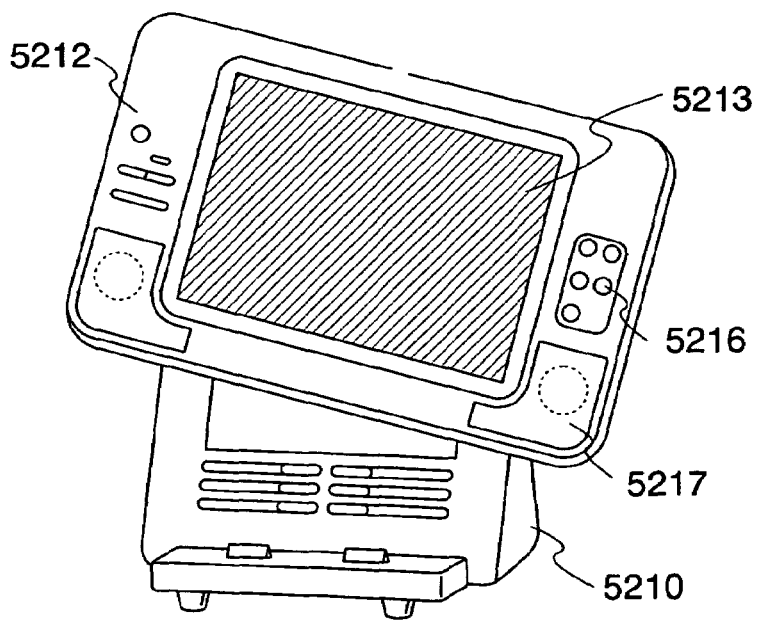

FIG. 24B illustrates a television receiver having a display which can be wirelessly carried out. A housing 5212 incorporates a battery and a signal receiver. With the battery, a display portion 5213 and a speaker portion 5217 are driven. The battery can be repeatedly charged by a charger 5210. Further, the charger 5210 can transmit and receive video signals and can transmit the video signals to a signal receiver of the display. The housing 5212 is controlled by an operating key 5216. Further, the device shown in FIG. 24B, which can transmit signals from the housing 5212 to the charger 5210 by the operation of the operating key 5216, can also be regarded as a video audio two-way communication device. Further, the device can also be regarded as a multipurpose remote control device since it can transmit a signal from the housing 5212 to the charger 5210 and the signal that the charger 5210 can transmit is received by another electronic apparatus by operating the operation keys 5216, thereby communication of another electric device can be controlled.

By applying a light emitting device of the invention to the television receiver shown in FIGS. 22, 23, 24A, and 24B, the number of transistors which form a pixel of the display portion can be reduced. Moreover, by regularly applying a reverse bias voltage to a light emitting element, reliability of the light emitting element can be improved. Further, as the number of transistors which form the pixels of the display portion and the number of wires can be reduced, an aperture ratio of the pixel portion can be expected to be increased, which contributes to the reduction in power consumption. Further, the layout area of a driver circuit portion in the periphery of the pixel portion can be reduced and a product with high yield can be provided for customers.

It is needless to say that the invention is not limited to be applied to a television receiver and can be used particularly as a large display medium for various applications such as information display boards at train stations and airports and advertisement boards on the streets.

Figure 25A:
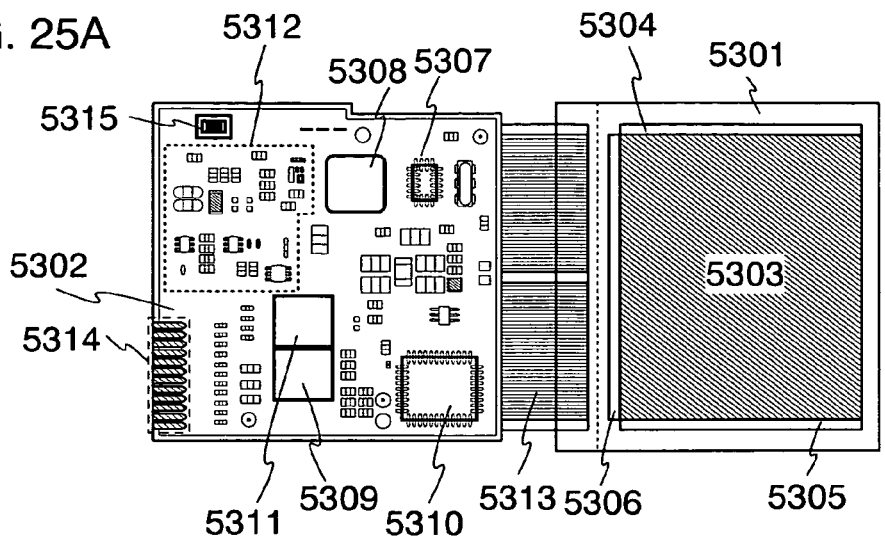
FIGS. 25A and 25B are diagrams showing examples of electronic devices of Embodiment Mode 10.

FIG. 25A illustrates a module in which a display panel 5301 and a printed wiring board 5302 are combined. The display panel 5301 is provided with a pixel portion 5303 including a plurality of pixels, a first scan line driver circuit 5304, a second scan line driver circuit 5305, and a signal line driver circuit 5306 which supplies a video signal to a selected pixel.

The printed wiring board 5302 includes a controller 5307, a central processing unit (CPU) 5308, a memory 5309, a power source circuit 5310, an audio processing circuit 5311, a transmission/reception circuit 5312, and the like. The printed wiring board 5302 and the display panel 5301 are connected by a flexible printed circuit (FPC) 5313. The flexible printed circuit 5313 may be provided with a capacitor, a buffer circuit, and the like to prevent a noise of a power source voltage and signals and a rising edge of the timing signal from being rounded. Furthermore, the controller 5307, the audio processing circuit 5311, the memory 5309, the CPU 5308, the power source circuit 5310 and the like may be mounted on the display panel 5301 by a COG (Chip On Glass) method. By the COG method, a printed wiring board 5302 can be downsized.

Various control signals are inputted and outputted through an interface (I/F) portion 5314 provided in the printed wiring board 5302. Further, an antenna port 5315 for transmitting/receiving signals to/from the antenna is provided in the printed wiring board 5302.

Figure 25B:
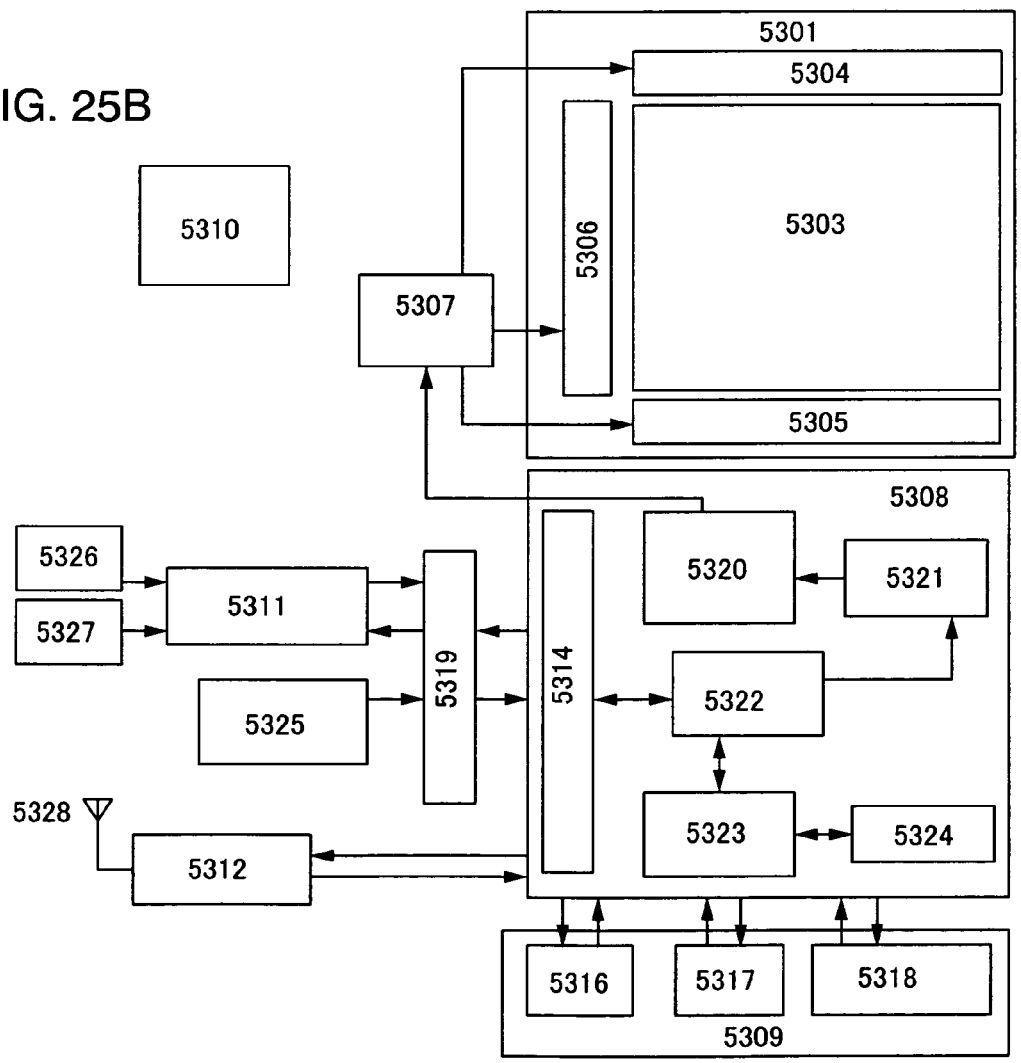

FIG. 25B is a block diagram of the module shown in FIG. 25A. This module includes the memory 5309 having a VRAM 5316, a DRAM 5317, a flash memory 5318 and the like. The VRAM 5316 stores image data to be displayed on the panel, the DRAM 5317 stores image data or audio data, and the flash memory stores various programs.

The power source circuit 5310 supplies a power to operate the display panel 5301, the controller 5307, the CPU 5308, the audio processing circuit 5311, the memory 5309, and the transmission/reception circuit 5312. Depending on the specifications of the panel, a current source is provided in the power source circuit 5310 in some cases.

The CPU 5308 includes a control signal generating circuit 5320, a decoder 5321, a register 5322, an operating circuit 5323, a RAM 5324, an interface 5319 for the CPU 5308 and the like. Various signals inputted to the CPU 5308 through the interface 5319 are held in the register 5322 once, and then inputted to the operating circuit 5323, the decoder 5321 and the like. In the operating circuit 5323, operation is performed on the basis of the inputted signals, thereby addresses for various instructions are specified. On the other hand, the signals inputted to the decoder 5321 are decoded and inputted to a control signal generating circuit 5320. The control signal generating circuit 5320 generates signals containing various instructions on the basis of the inputted signals and transmits the signals to the addresses specified by the operating circuit 5323, in specific, the memory 5309, the transmission/reception circuit 5312, the audio processing circuit 5311, the controller 5307, and the like.

The memory 5309, the transmission/reception circuit 5312, the audio processing circuit 5311, and the controller 5307 operate in accordance with the received instructions. Brief description on the operations is made below.

The signals inputted from an input unit 5325 are transmitted to the CPU 5308 mounted on the printed wiring board 5302 through the I/F portion 5314. The control signal generating circuit 5320 converts image data stored in the VRAM 5316 into a predetermined format in accordance with the signals transmitted from the input unit 5325 such as a pointing device and a keyboard, and then transmits it to the controller 5307.

The controller 5307 processes the video data contained in the signals transmitted from the CPU 5308 in accordance with the specifications of the panel and supplies them to the display panel 5301. Further, the controller 5307 generates a Hsync signal, a Vsync signal, a clock signal CLK, an alternate current voltage (AC Cont), and a switching signal L/R and supplies them to the display panel 5301.

Signals transmitted and received as radio waves by an antenna 5328 are processed in the transmission/reception circuit 5312. Specifically, the transmission/reception circuit

5312 includes a high frequency circuit such as an isolator, a band pass filter, a VCO (Voltage Controlled Oscillator), an LPF (Low Pass Filter), a coupler, and a balun. Signals containing audio data among the signals transmitted and received by the transmission/reception circuit 5312 are transmitted to the audio processing circuit 5311 in accordance with the instruction of the CPU 5308.

The signals containing audio data transmitted in accordance with the instruction of the CPU 5308 are demodulated into audio signals by the audio processing circuit 5311 to be transmitted to a speaker 5327. Further, audio signals transmitted from a microphone 5326 are modulated by the audio processing circuit 5311 to be transmitted to the transmission/reception circuit 5312 in accordance with the instruction of the CPU 5308.

The controller 5307, the CPU 5308, the power source circuit 5310, the audio processing circuit 5311, and the memory 5309 can be mounted as a package of this embodiment mode. This embodiment mode can be applied to any circuits but a high frequency circuit such as an isolator, a band pass filter, a VCO (Voltage Controlled Oscillator), an LPF (Low Pass Filter), a coupler, and a balun.

Figure 26:
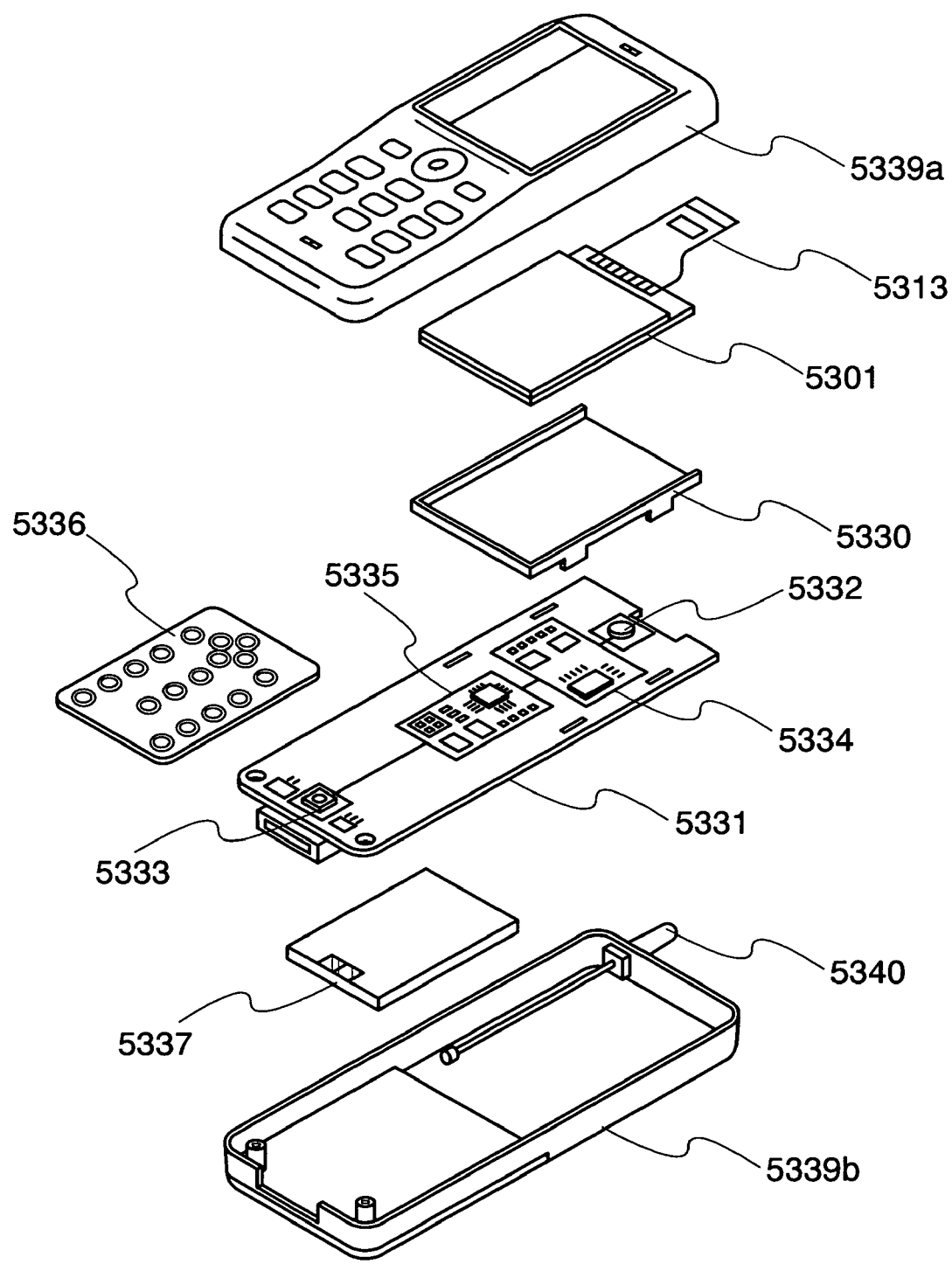
FIG. 26 is a diagram showing an example of an electronic device of Embodiment Mode 10.

FIG. 26 shows one mode of a portable phone including the module shown in FIGS. 25A and 25B. A display panel 5301 is detachably incorporated in a housing 5330. The shape or the size of the housing 5330 can be appropriately changed depending on the size of the display panel 5301. The housing 5330 in which the display panel 5301 is fixed is fit into a printed substrate 5331 so as to be incorporated as a module.

The display panel 5301 is connected to the printed substrate 5331 via the FPC 5313. The printed substrate 5331 is provided with a speaker 5332, a microphone 5333, a transmission/reception circuit 5334, and a signal processing circuit 5335 including a CPU, a controller, and the like. Such a module, an input unit 5336, a battery 5337, and an antenna 5340 are combined and stored in housings 5339*a* and 5339*b*. A pixel portion of the display panel 5301 is arranged so as to be seen from an opening window which is provided in the housing 5339*a*.

By applying the invention to the portable phones shown in FIGS. 25A, 25B, and 26, the number of transistors which form a pixel of the display panel can be reduced. Moreover, by regularly applying a reverse bias voltage to a light emitting element, reliability of the light emitting element can be improved. Further, as the number of transistors which form the pixels of the display panel and the number of wires can be reduced, an aperture ratio of the pixel portion can be expected to be increased, which contributes to the reduction in power consumption. Further, a layout area of a driver circuit portion in the periphery of the pixel portion can be reduced and the product with high yield can be provided for customers.

The portable phone in accordance with this embodiment mode can be transformed into various modes in accordance with the functions and applications thereof. For example, a plurality of display panels may be provided or a housing may be divided into a plurality of portions as required and provided with a hinge so as to be opened and closed. In that case also, by reducing the number of transistors which form the pixels of the display panel and regularly applying a reverse bias voltage to the light emitting elements, reliability of the light emitting elements can be expected to be improved. Further, as the number of transistors which form the pixels of the display panel and the number of wires can be reduced, an aperture ratio can be expected to be increased which contributes to the reduction in power consumption. Further, a layout area of a driver circuit portion in the periphery of the pixel portion can be reduced, and moreover, a product with high yield can be provided for customers.

Figure 27A:
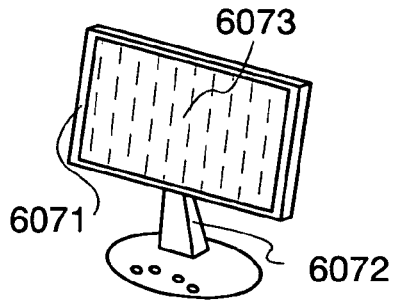
FIGS. 27A to 27E are diagrams showing examples of electronic devices of Embodiment Mode 10.

FIG. 27A illustrates a display including a housing 6071, a support base 6072, a display portion 6073, and the like. The invention can be applied to a pixel portion of the display portion 6073 using the configuration of the display panel shown in FIG. 25A.

By applying the invention, the number of transistors which form a pixel of the display portion 6073 can be reduced. Moreover, by regularly applying a reverse bias voltage to a light emitting element, reliability of the light emitting element can be improved. Further, as the number of transistors which form the pixels of the display panel and the number of wires can be reduced, an aperture ratio of the pixel portion can be expected to be increased, which contributes to the reduction in power consumption. Further, the layout area of a driver circuit portion in the periphery of the pixel portion can be reduced and a product with high yield can be provided for customers.

Figure 27B:
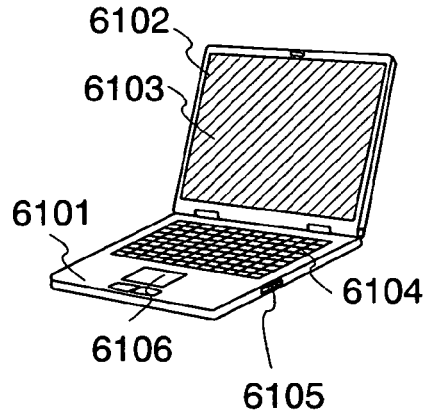

FIG. 27B illustrates a computer including a main body 6101, a housing 6102, a display portion 6103, a keyboard 6104, an external connecting port 6105, a pointing mouse 6106 and the like. The invention can be applied to the display portion 6103 using the configuration of the display panel shown in FIG. 25A.

By applying the invention, the number of transistors which form a pixel of the display portion 6073 can be reduced. Moreover, by regularly applying a reverse bias voltage to a light emitting element, reliability of the light emitting element can be improved. Further, as the number of transistors which form the pixels of the display panel and the number of wires can be reduced, an aperture ratio of the pixel portion can be expected to be increased, which contributes to the reduction in power consumption. Further, the layout area of a driver circuit portion in the periphery of the pixel portion can be reduced and a product with high yield can be provided for customers.

Figure 27C:
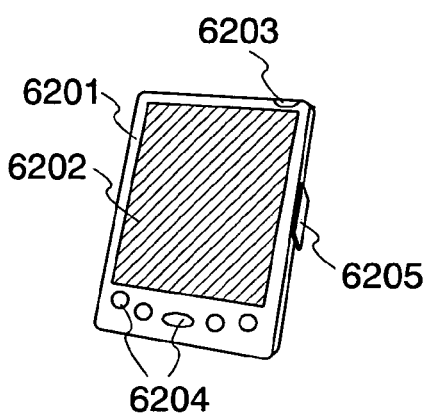

FIG. 27C illustrates a portable computer including a main body 6201, a display portion 6202, a switch 6203, operating keys 6204, an infrared port 6205, and the like. The invention can be applied to the display portion 6202 by using the configuration of the display panel shown in FIG. 25A.

By applying the invention, the number of transistors which form a pixel of the display portion 6202 can be reduced. Moreover, by regularly applying a reverse bias voltage to a light emitting element without providing a period for applying the reverse bias voltage, reliability of the light emitting element can be improved. Further, as the number of transistors which form the pixels of the display panel and the number of wires can be reduced, an aperture ratio of the pixel portion can be expected to be increased, which contributes to the reduction in power consumption. Further, the layout area of a driver circuit portion in the periphery of the pixel portion can be reduced and a product with high yield can be provided for customers.

Figure 27D:
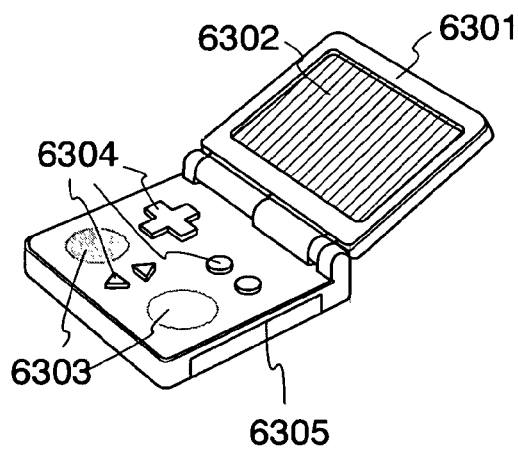

FIG. 27D illustrates a portable game machine including a housing 6301, a display portion 6302, speaker portions 6303, operating keys 6304, a recording medium insert portion 6305, and the like. The invention can be applied to the display portion 6302 by using the configuration of the display panel shown in FIG. 25A.

By applying the invention, the number of transistors which form a pixel of the display portion 6302 can be reduced. Moreover, by regularly applying a reverse bias voltage to a light emitting element, reliability of the light emitting element can be improved. Further, as the number of transistors which form the pixels of the display panel and the number of wires can be reduced, an aperture ratio of the pixel portion can be expected to be increased, which contributes to the reduction in power consumption. Further, the layout area of a driver circuit portion in the periphery of the pixel portion can be reduced and a product with high yield can be provided for customers.

Figure 27E:
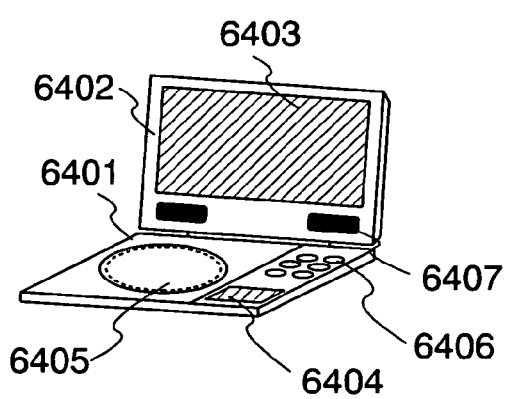
Figure 28:
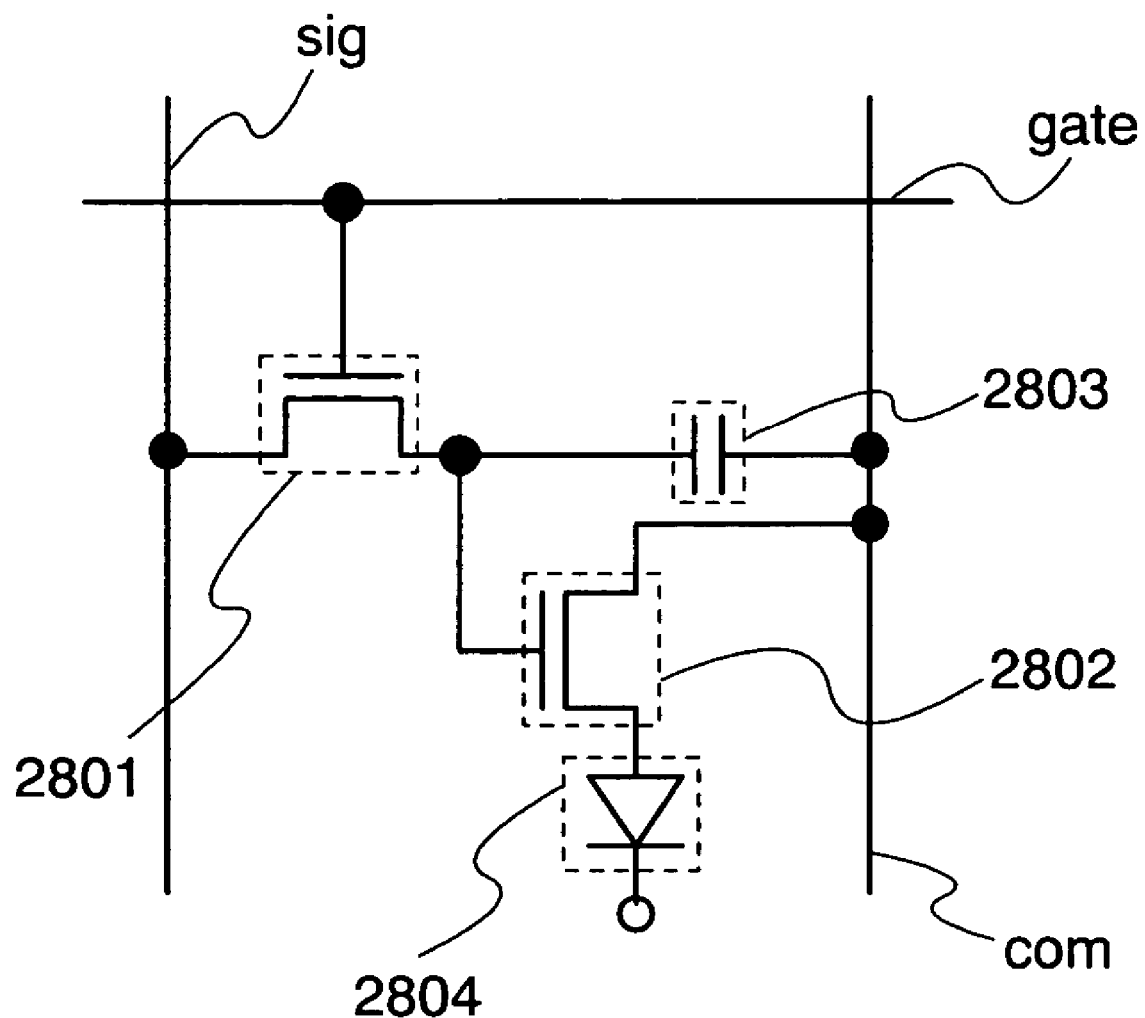
FIG. 28 is a diagram showing a conventional circuit configuration.
Figure 29:
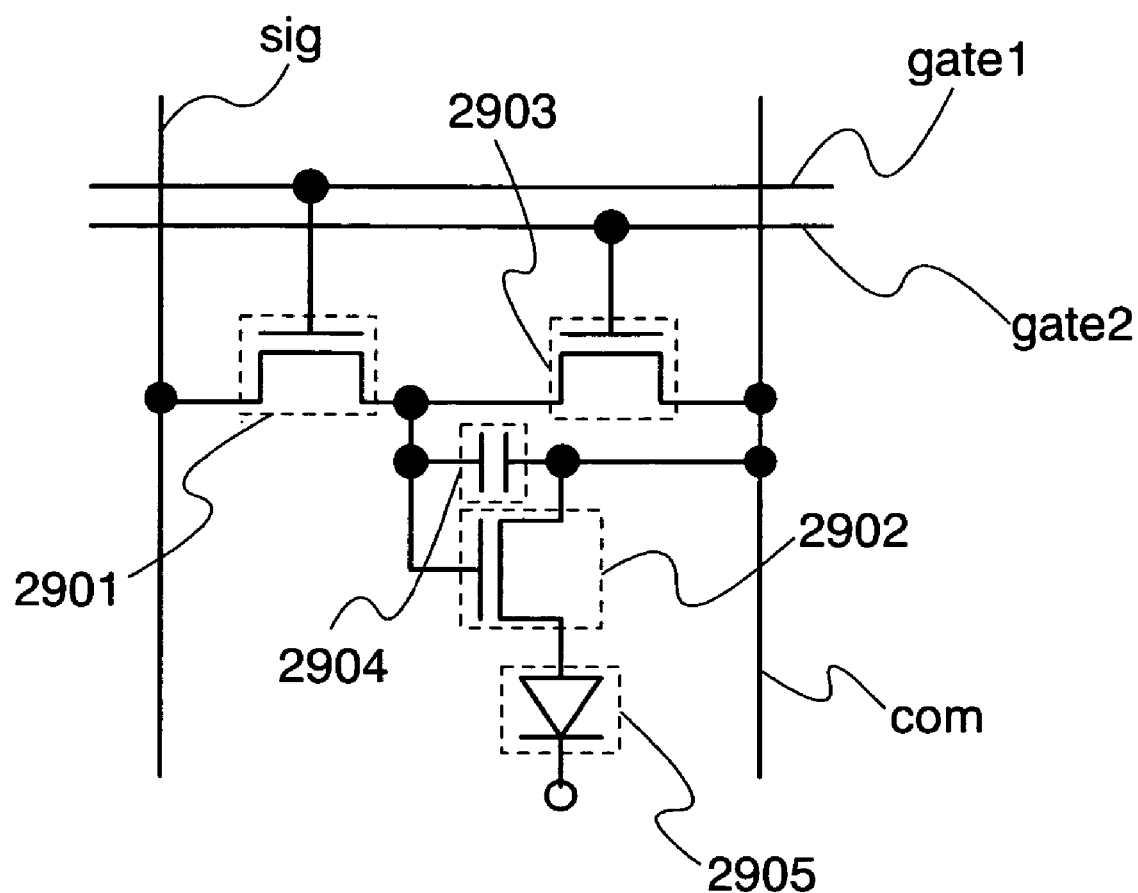
FIG. 29 is a diagram showing a conventional circuit configuration.

FIG. 27E illustrates a portable image reproducing device (specifically a DVD reproducing device) provided with a recording medium, including a main body 6401, a housing 6402, a display portion A 6403, a display portion B 6404, a recording medium (DVD and the like) reading portion 6405, an operating key 6406, a speaker portion 6407, and the like. The display portion A 6403 mainly displays image data while the display portion B 6404 mainly displays text data. The invention can be applied to the display portion A 6403, the display portion B 6404, a control circuit portion and the like by using the configuration of the display panel shown in FIG. 25A. It is to be noted that the image reproducing device provided with a recording medium includes a home game machine, and the like.

By applying the invention, the number of transistors which form a pixel of the display portion A 6403 and the display portion B 6404 can be reduced. Moreover, by regularly applying a reverse bias voltage to a light emitting element, reliability of the light emitting element can be improved. Further, as the number of transistors which form the pixels of the display panel and the number of wires can be reduced, an aperture ratio of the pixel portion can be expected to be increased, which contributes to the reduction in power consumption. Further, the layout area of a driver circuit portion in the periphery of the pixel portion can be reduced and a product with high yield can be provided for customers.

A light emitting device used for these electronic devices may employ a heat-resistant plastic substrate instead of a glass substrate in accordance with the size, strength, or the application. Accordingly, further weight saving can be achieved.

It is to be noted that the examples shown in this embodiment mode are only examples and the invention is not limited to these applications.

It is to be noted that this embodiment mode can be freely implemented in combination with other embodiment modes in this specification. That is, the number of transistors which form pixels and the number of wires such as the scan lines and the power source lines can be reduced, thereby the aperture ratio can be increased. Thus, a voltage applied to a light emitting element for holding desired luminance can be suppressed and low power consumption can be achieved. Further, in a light emitting device of the invention having adjacent pixels provided at each intersection of the scan lines and the data lines, a forward bias voltage can be applied to one pixel so that a light emitting element can emit light and a reverse bias voltage can be applied to the other pixel at the same time. Therefore, a period for applying a reverse bias voltage is not required, thus degradation of a light emitting element can be controlled and reliability thereof can be improved without decreasing a duty ratio (a ratio of a light emission period in one frame period).

Further, in a light emitting device of the invention, a visible pseudo contour which is a problem in displaying an image by the time gray scale method can be reduced by employing a method (an interlace method) for sequentially performing light emission of pixels of every other row in an extending direction of the data lines or the scan lines. Further, a visible pseudo contour can be reduced by employing a method (a checker method) for performing light emission of pixels in what is called a check pattern so that pixels emit light which are one pixel aside of the pixels which emit light in the preceding row in the extending direction of the data lines. Furthermore, in electronic devices provided with a light emitting device of the invention, the number of transistors connected to each pixel and the number of wires such as scan lines and power source lines can be reduced as described above, therefore, the layout area of a driver circuit in the periphery of the pixel portion can be reduced and the layout area of a display panel can be reduced. Accordingly, an electronic device can be downsized and reduced in weight. Further, a product with high yield can be manufactured and a more inexpensive product can be provided for customers.

This application is based on Japanese Patent Application serial no. 2005-024345 filed in Japan Patent Office on 31st, Jan. 2005, the entire contents of which are hereby incorporated by reference.

What is claimed is:

1. A light emitting device comprising:
a scan line;
a data line;
a first power source line;
a second power source line;
a third power source line;
a first light emitting element electrically connected to the first power source line;
a second light emitting element electrically connected to the second power source line;
a first transistor, wherein a gate of the first transistor is electrically connected to the scan line; and
a second transistor, wherein a gate of the second transistor is electrically connected to the data line through a source and a drain of the first transistor,
wherein the second transistor and the first light emitting element are electrically connected in series between the first power source line and the third power source line, and
wherein the second transistor and the second light emitting element are electrically connected in series between the second power source line and the third power source line.

2. A light emitting device according to claim 1, wherein each of the first and the second transistors is a thin film transistor.

3. A light emitting device according to claim 1, wherein a forward bias voltage is applied to one of the first and the second light emitting elements while a reverse bias voltage is applied to the other of the first and the second light emitting elements.

4. A light emitting device according to claim 1, wherein each of the first and the second light emitting elements is a diode having a first electrode and a second electrode, polarity of the first electrode is opposite to that of the second electrode, and the second electrodes of the first and the second light emitting elements are electrically connected to each other.

5. A light emitting device according to claim 4, wherein the first and the second electrodes are an anode and a cathode respectively.

6. A light emitting device according to claim 5, wherein an electrical potential of the third power source line is higher than that of the second power source line.

7. A light emitting device according to claim 4, wherein the first and the second transistors are N-channel type and P-channel type respectively.

8. A light emitting device according to claim 1, wherein the first light emitting element emits light on a condition that an electrical potential of the third power source line is lower than that of the first power source line, and wherein the second light emitting element emits light on a condition that an electrical potential of the third power source line is lower than that of the second power source line.

9. A light emitting device according to claim 8, wherein an electrical potential of the third power source line is higher than that of the second power source line on a condition that the electrical potential of the third power source line is lower than that of the first power source line, and the electrical potential of the third power source line is higher than that of the first power source line on a condition that the electrical potential of the third power source line is lower than that of the second power source line.

10. A light emitting device according to claim 8, wherein the first and the second transistors are N-channel type and P-channel type respectively.

11. A light emitting device comprising:
a scan line;
a data line;
a first power source line;
a second power source line;
a first light emitting element electrically connected to the second power source line;
a second light emitting element electrically connected to the first power source line;
a first transistor, wherein a gate of the first transistor is electrically connected to the scan line;
a second transistor, wherein a gate of the second transistor is electrically connected to the data line through a source and a drain of the first transistor; and
a third transistor, wherein a gate of the third transistor is electrically connected to the data line through the source and the drain of the first transistor,
wherein the second transistor and the first light emitting element are electrically connected in series between the first power source line and the second power source line, and
wherein the third transistor and the second light emitting element are electrically connected in series between the first power source line and the second power source line.

12. A light emitting device according to claim 11, wherein each of the first the second and the third transistors is a thin film transistor.

13. A light emitting device according to claim 11, wherein a forward bias voltage is applied to one of the first and the second light emitting elements while a reverse bias voltage is applied to the other of the first and the second light emitting elements.

14. A light emitting device according to claim 11, wherein each of the first and the second light emitting elements is a diode having a first electrode and a second electrode, polarity of the first electrode is opposite to that of the second electrode, the first electrode of the first light emitting element is electrically connected to the second electrode of the second light emitting element through the source and the drain of the second transistor, and the second electrode of the first light emitting element is electrically connected to the first electrode of the second light emitting element through the source and the drain of the third transistor.

15. A light emitting device according to claim 14, wherein the first and the second electrodes are an anode and a cathode respectively.

16. A light emitting device according to claim 14, wherein the first, the second, and the third transistors are N-channel type, P-channel type and P-channel type respectively.

17. A light emitting device according to claim 11, wherein the first light emitting element emits light on a condition that an electrical potential of the second power source line is lower than that of the first power source line, and wherein the second light emitting element emits light on a condition that an electrical potential of the second power source line is higher than that of the second power source line.

18. A light emitting device according to claim 17, wherein the first, the second, and the third transistors are N-channel type, P-channel type and P-channel type respectively.

19. A light emitting device comprising:
a first scan line;
a second scan line;
a data line;
a first power source line;
a second power source line;
a first light emitting element electrically connected to the second power source line;
a second light emitting element electrically connected to the first power source line;
a first transistor, wherein a gate of the first transistor is electrically connected to the first scan line;
a second transistor, wherein a gate of the second transistor is electrically connected to the data line through a source and a drain of the first transistor;
a third transistor, wherein a gate of the third transistor is electrically connected to the data line through a source and a drain of the first transistor;
a first capacitor whereby a voltage applied to the gate of the second transistor is held;
a second capacitor whereby a voltage applied to the gate of the third transistor is held; and
an erasing element whereby a voltage held by the first capacitor or the second capacitor is erased, wherein the erasing element is located between the source of the first transistor and the second scan line,
wherein the second transistor and the first light emitting element are electrically connected in series between the first power source line and the second power source line, and
wherein the third transistor and the second light emitting element are electrically connected in series between the first power source line and the second power source line.

20. A light emitting device according to claim 19, wherein each of the first the second and the third transistors is a thin film transistor.

21. A light emitting device according to claim 19, wherein the erasing element is a transistor or a diode.

22. A light emitting device according to claim 19, wherein a forward bias voltage is applied to one of the first and the second light emitting elements while a reverse bias voltage is applied to the other of the first and the second light emitting elements.

23. A light emitting device according to claim 19, wherein each of the first and the second light emitting elements is a diode having a first electrode and a second electrode, polarity of the first electrode is opposite to that of the second electrode, the first electrode of the first light emitting element is electrically connected to the second electrode of the second light emitting element through the source and the drain of the second transistor, and the second electrode of the first light emitting element is electrically connected to the first electrode of the second light emitting element through the source and the drain of the third transistor.

24. A light emitting device according to claim 23, wherein the first and the second electrodes are an anode and a cathode respectively.

25. A light emitting device according to claim 23, wherein the first, the second, and the third transistors are N-channel type, P-channel type and P-channel type respectively.

26. A light emitting device according to claim 23, wherein the erasing element is a transistor or a diode.

27. A light emitting device according to claim 19, wherein the first light emitting element emits light on a condition that an electrical potential of the second power source line is lower than that of the first power source line, and wherein the second light emitting element emits light on a condition that an electrical potential of the second power source line is higher than that of the second power source line.

28. A light emitting device according to claim 27, wherein the first, the second, and the third transistors are N-channel type, P-channel type and P-channel type respectively.

29. A light emitting device according to claim 27, wherein the erasing element is a transistor or a diode.

30. A light source comprising:
   a scan line;
   a data line;
   a first power source line;
   a second power source line;
   a third power source line;
   a first light emitting element electrically connected to the first power source line;
   a second light emitting element electrically connected to the second power source line;
   a first transistor, wherein a gate of the first transistor is electrically connected to the scan line; and
   a second transistor, wherein a gate of the second transistor is electrically connected to the data line through a source and a drain of the first transistor,
   wherein the second transistor and the first light emitting element are electrically connected in series between the first power source line and the third power source line, and
   wherein the second transistor and the second light emitting element are electrically connected in series between the second power source line and the third power source line.

31. A light source according to claim 30, wherein each of the first and the second transistors is a thin film transistor.

32. A light source according to claim 30, wherein a forward bias voltage is applied to one of the first and the second light emitting elements while a reverse bias voltage is applied to the other of the first and the second light emitting elements.

33. A light source according to claim 30, wherein each of the first and the second light emitting elements is a diode having a first electrode and a second electrode, polarity of the first electrode is opposite to that of the second electrode, and the second electrodes of the first and the second light emitting elements are electrically connected to each other.

34. A light source according to claim 33, wherein the first and the second electrodes are an anode and a cathode respectively.

35. A light source according to claim 34, wherein an electrical potential of the third power source line is higher than that of the second power source line.

36. A light source according to claim 33, wherein the first and the second transistors are N-channel type and P-channel type respectively.

37. A light source according to claim 30, wherein the first light emitting element emits light on a condition that an electrical potential of the third power source line is lower than that of the first power source line, and wherein the second light emitting element emits light on a condition that an electrical potential of the third power source line is lower than that of the second power source line.

38. A light source according to claim 37, wherein an electrical potential of the third power source line is higher than that of the second power source line on a condition that the electrical potential of the third power source line is lower than that of the first power source line, and the electrical potential of the third power source line is higher than that of the first power source line on a condition that the electrical potential of the third power source line is lower than that of the second power source line.

39. A light source according to claim 37, wherein the first and the second transistors are N-channel type and P-channel type respectively.

40. A light source comprising:
   a scan line;
   a data line;
   a first power source line;
   a second power source line;
   a first light emitting element electrically connected to the second power source line;
   a second light emitting element electrically connected to the first power source line;
   a first transistor, wherein a gate of the first transistor is electrically connected to the scan line;
   a second transistor, wherein a gate of the second transistor is electrically connected to the data line through a source and a drain of the first transistor; and
   a third transistor, wherein a gate of the third transistor is electrically connected to the data line through the source and the drain of the first transistor,
   wherein the second transistor and the first light emitting element are electrically connected in series between the first power source line and the second power source line, and
   wherein the third transistor and the second light emitting element are electrically connected in series between the first power source line and the second power source line.

41. A light source according to claim 40, wherein each of the first the second and the third transistors is a thin film transistor.

42. A light source according to claim 40, wherein a forward bias voltage is applied to one of the first and the second light emitting elements while a reverse bias voltage is applied to the other of the first and the second light emitting elements.

43. A light source according to claim 40, wherein each of the first and the second light emitting elements is a diode having a first electrode and a second electrode, polarity of the first electrode is opposite to that of the second electrode, the first electrode of the first light emitting element is electrically connected to the second electrode of the second light emitting element through the source and the drain of the second transistor, and the second electrode of the first light emitting element is electrically connected to the first electrode of the second light emitting element through the source and the drain of the third transistor.

44. A light source according to claim 43, wherein the first and the second electrodes are an anode and a cathode respectively.

45. A light source according to claim 43, wherein the first the second, and the third transistors are N-channel type, P-channel type and P-channel type respectively.

46. A light source according to claim 40, wherein the first light emitting element emits light on a condition that an electrical potential of the second power source line is lower than that of the first power source line, and wherein the second light emitting element emits light on a condition that an electrical potential of the second power source line is higher than that of the second power source line.

47. A light source according to claim 46, wherein the first the second, and the third transistors are N-channel type, P-channel type and P-channel type respectively.

48. A light source comprising:
a first scan line;
a second scan line;
a data line;
a first power source line;
a second power source line;
a first light emitting element electrically connected to the second power source line;
a second light emitting element electrically connected to the first power source line;
a first transistor, wherein a gate of the first transistor is electrically connected to the first scan line;
a second transistor, wherein a gate of the second transistor is electrically connected to the data line through a source and a drain of the first transistor;
a third transistor, wherein a gate of the third transistor is electrically connected to the data line though a source and a drain of the first transistor;
a first capacitor whereby a voltage applied to the gate of the second transistor is held;
a second capacitor whereby a voltage applied to the gate of the third transistor is held; and
an erasing element whereby a voltage held by the first capacitor or the second capacitor is erased, wherein the erasing element is located between the source of the first transistor and the second scan line,
wherein the second transistor and the first light emitting element are electrically connected in series between the first power source line and the second power source line, and wherein the third transistor and the second light emitting element are electrically connected in series between the first power source line and the second power source line.

49. A light source according to claim 48, wherein each of the first the second and the third transistors is a thin film transistor.

50. A light source according to claim 48, wherein the erasing element is a transistor or a diode.

51. A light source according to claim 48, wherein a forward bias voltage is applied to one of the first and the second light emitting elements while a reverse bias voltage is applied to the other of the first and the second light emitting elements.

52. A light source according to claim 48, wherein each of the first and the second light emitting elements is a diode having a first electrode and a second electrode, polarity of the first electrode is opposite to that of the second electrode, the first electrode of the first light emitting element is electrically connected to the second electrode of the second light emitting element through the source and the drain of the second transistor, and the second electrode of the first light emitting element is electrically connected to the first electrode of the second light emitting element through the source and the drain of the third transistor.

53. A light source according to claim 52, wherein the first and the second electrodes are an anode and a cathode respectively.

54. A light source according to claim 52, wherein the first, the second, and the third transistors are N-channel type, P-channel type and P-channel type respectively.

55. A light source according to claim 52, wherein the erasing element is a transistor or a diode.

56. A light source according to claim 48, wherein the first light emitting element emits light on a condition that an electrical potential of the second power source line is lower than that of the first power source line, and wherein the second light emitting element emits light on a condition that an electrical potential of the second power source line is higher than that of the second power source line.

57. A light source according to claim 56, wherein the first, the second, and the third transistors are N-channel type, P-channel type and P-channel type respectively.

58. A light source according to claim 56, wherein the erasing element is a transistor or a diode.

* * * * *